(12) United States Patent
Kitamura et al.

(10) Patent No.: US 11,211,710 B2
(45) Date of Patent: Dec. 28, 2021

(54) ARRAY ANTENNA APPARATUS AND METHOD FOR FABRICATING SAME

(71) Applicant: Mitsubishi Electric Corporation, Tokyo (JP)

(72) Inventors: Yoichi Kitamura, Tokyo (JP); Takumi Nagamine, Tokyo (JP); Takayuki Nakao, Tokyo (JP); Kiyoshi Ishida, Tokyo (JP); Tetsu Owada, Tokyo (JP)

(73) Assignee: MITSUBISHI ELECTRIC CORPORATION, Tokyo (JP)

(*) Notice: Subject to any disclaimer, the term of this patent is extended or adjusted under 35 U.S.C. 154(b) by 250 days.

(21) Appl. No.: 16/486,856

(22) PCT Filed: Mar. 8, 2018

(86) PCT No.: PCT/JP2018/009020
§ 371 (c)(1),
(2) Date: Aug. 19, 2019

(87) PCT Pub. No.: WO2018/168648
PCT Pub. Date: Sep. 20, 2018

(65) Prior Publication Data
US 2020/0235478 A1    Jul. 23, 2020

(30) Foreign Application Priority Data

Mar. 17, 2017    (JP) .............................. JP2017-052554

(51) Int. Cl.
*H01Q 1/38*    (2006.01)
*H01Q 9/04*    (2006.01)
(Continued)

(52) U.S. Cl.
CPC ......... *H01Q 9/0457* (2013.01); *H01Q 1/2283* (2013.01); *H01Q 1/38* (2013.01);
(Continued)

(58) Field of Classification Search
CPC .. H01Q 9/0457; H01Q 1/2283; H01Q 21/061; H01Q 23/00; H01Q 1/38;
(Continued)

(56) References Cited

U.S. PATENT DOCUMENTS

| 8,648,454 B2 | 2/2014 | Liu et al. |
| 8,736,031 B2 * | 5/2014 | Lee .......................... H01L 23/66 |
| | | 257/659 |

(Continued)

FOREIGN PATENT DOCUMENTS

| JP | 2003008151 A | 1/2003 |
| JP | 2008130769 A | 6/2008 |

(Continued)

OTHER PUBLICATIONS

International Search Report (PCT/ISA/210) dated Jun. 5, 2018, by the Japan Patent Office as the International Searching Authority for International Application No. PCT/JP2018/009020.
(Continued)

*Primary Examiner* — Alexander H Taningco
*Assistant Examiner* — Amy X Yang
(74) *Attorney, Agent, or Firm* — Buchanan Ingersoll & Rooney PC

(57) ABSTRACT

In an array antenna apparatus, a first height of top faces of plurality of antenna elements is greater than or equal to a second height of a first top of a first electronic component relative to a first primary surface. The first electronic component is the tallest among one or more electronic components mounted on fourth primary surfaces of one or more first external circuit boards. A third height of a second primary surface is greater than a fourth height of fourth primary surfaces. Accordingly, the array antenna apparatus has good antenna characteristics.

19 Claims, 50 Drawing Sheets

(51) Int. Cl.
  *H01Q 1/22* (2006.01)
  *H01Q 21/06* (2006.01)
  *H01Q 23/00* (2006.01)
  *H05K 1/18* (2006.01)
  *H05K 3/34* (2006.01)

(52) U.S. Cl.
  CPC ........... *H01Q 21/061* (2013.01); *H01Q 23/00* (2013.01); *H05K 1/189* (2013.01); *H05K 3/3415* (2013.01)

(58) Field of Classification Search
  CPC ...... H01Q 1/526; H01Q 21/065; H01Q 21/06; H01Q 1/52; H05K 1/189; H05K 3/3415; H05K 1/147; H05K 1/14; H05K 3/36; H01P 5/028
  See application file for complete search history.

(56) References Cited

U.S. PATENT DOCUMENTS 10,404,656 B2 * 9/2019 Mochizuki ........... H05K 1/0204
2017/0222316 A1 * 8/2017 Mizunuma ............... H01Q 1/38

FOREIGN PATENT DOCUMENTS

JP   2015133485 A   7/2015
WO  2016067906 A1   5/2016

OTHER PUBLICATIONS

Office Action dated Aug. 19, 2021, in corresponding British Patent Application No. GB1911358.8. (6 pages).
Office Action dated Oct. 29, 2021, in corresponding British Patent Application No. GB1911358.8. (5 pages).

* cited by examiner

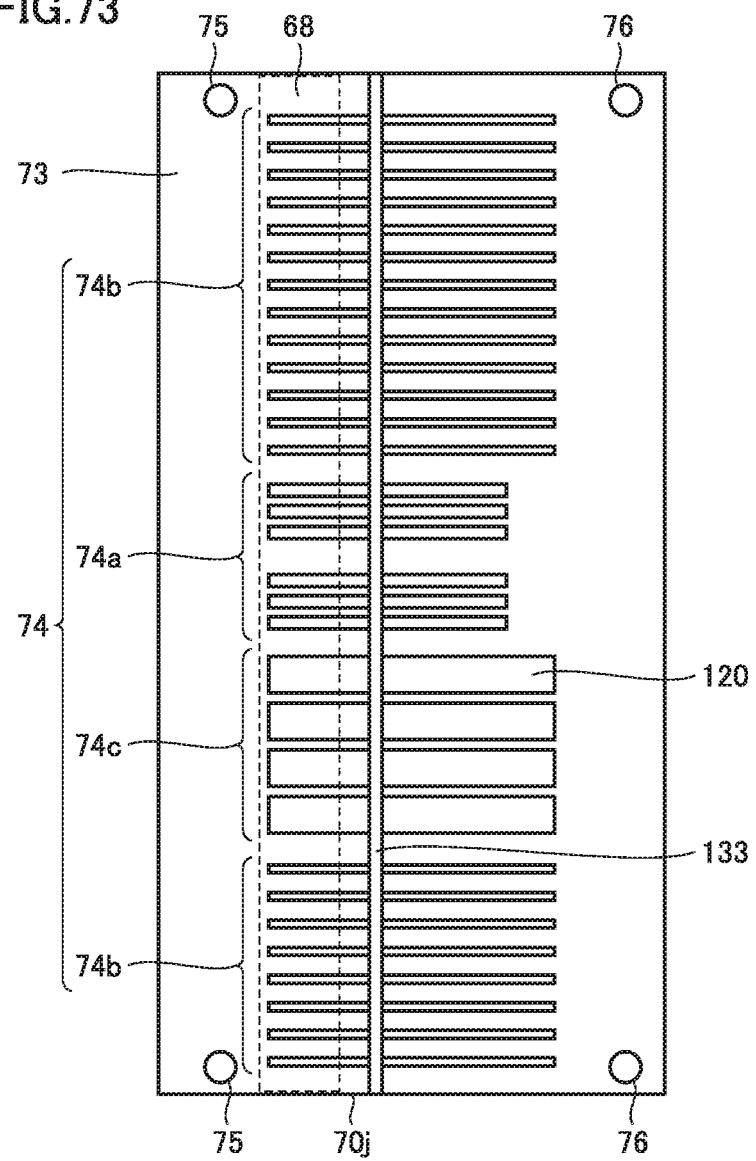

ARRAY ANTENNA APPARATUS AND METHOD FOR FABRICATING SAME

TECHNICAL FIELD

The present invention relates to an array antenna apparatus and method for fabricating the same.

BACKGROUND ART

Japanese Patent Laying-Open No. 2015-133485 (PTL 1) discloses an external circuit and an array antenna apparatus which includes multiple antenna elements. The array antenna apparatus is capable of receiving and transmitting electromagnetic waves, such as microwave, millimeter wave, etc., via the antenna elements.

CITATION LIST

Patent Literature

[PTL 1] Japanese Patent Laying-Open No. 2015-133485

SUMMARY OF INVENTION

Technical Problem

An object of the present invention is to provide an array antenna apparatus having good antenna characteristics and a method for fabricating the same.

Solution to Problem

An array antenna apparatus according to the present invention includes a base plate, a wiring board, a dielectric substrate, a plurality of antenna elements, one or more first external circuit boards, a first electronic component, and one or more flexible printed circuits. The base plate has a first primary surface. The wiring board is mounted on the first primary surface. The wiring board includes a semiconductor substrate and a wiring layer on the semiconductor substrate. The semiconductor substrate is disposed between the wiring layer and the base plate. The wiring board has a second primary surface opposite the base plate. The dielectric substrate is attached to the second primary surface. The dielectric substrate has a third primary surface opposite the wiring board. The plurality of antenna elements are dispose in an array on the third primary surface. The one or more first external circuit boards are mounted on the first primary surface. The one or more first external circuit boards each have a fourth primary surface opposite the base plate. The first electronic component is mounted on the fourth primary surface. The first electronic component is a tallest among one or more electronic components mounted on the fourth primary surface. The one or more flexible printed circuits are attached to the second primary surface and the fourth primary surface. The one or more flexible printed circuits each include one or more traces. A first height of top surfaces of the plurality of antenna element relative to the first primary surface is greater than or equal to a second height of a first top of the first electronic component relative to the first primary surface. A third height of the second primary surface relative to the first primary surface is greater than a fourth height of the fourth primary surface relative to the first primary surface.

Advantageous Effects of Invention

According to the array antenna apparatus of the present invention, electromagnetic waves transmitted and received through the antenna elements can be prevented from causing electromagnetic interference with the electronic components on the first external circuit board. Accordingly, the array antenna apparatus according to the present invention has good antenna characteristics.

BRIEF DESCRIPTION OF DRAWINGS

FIG. 73 is a schematic plan view of a flexible printed circuit included in the array antenna apparatus according to Embodiment 10 of the present invention.

DESCRIPTION OF EMBODIMENTS

Figure 1:
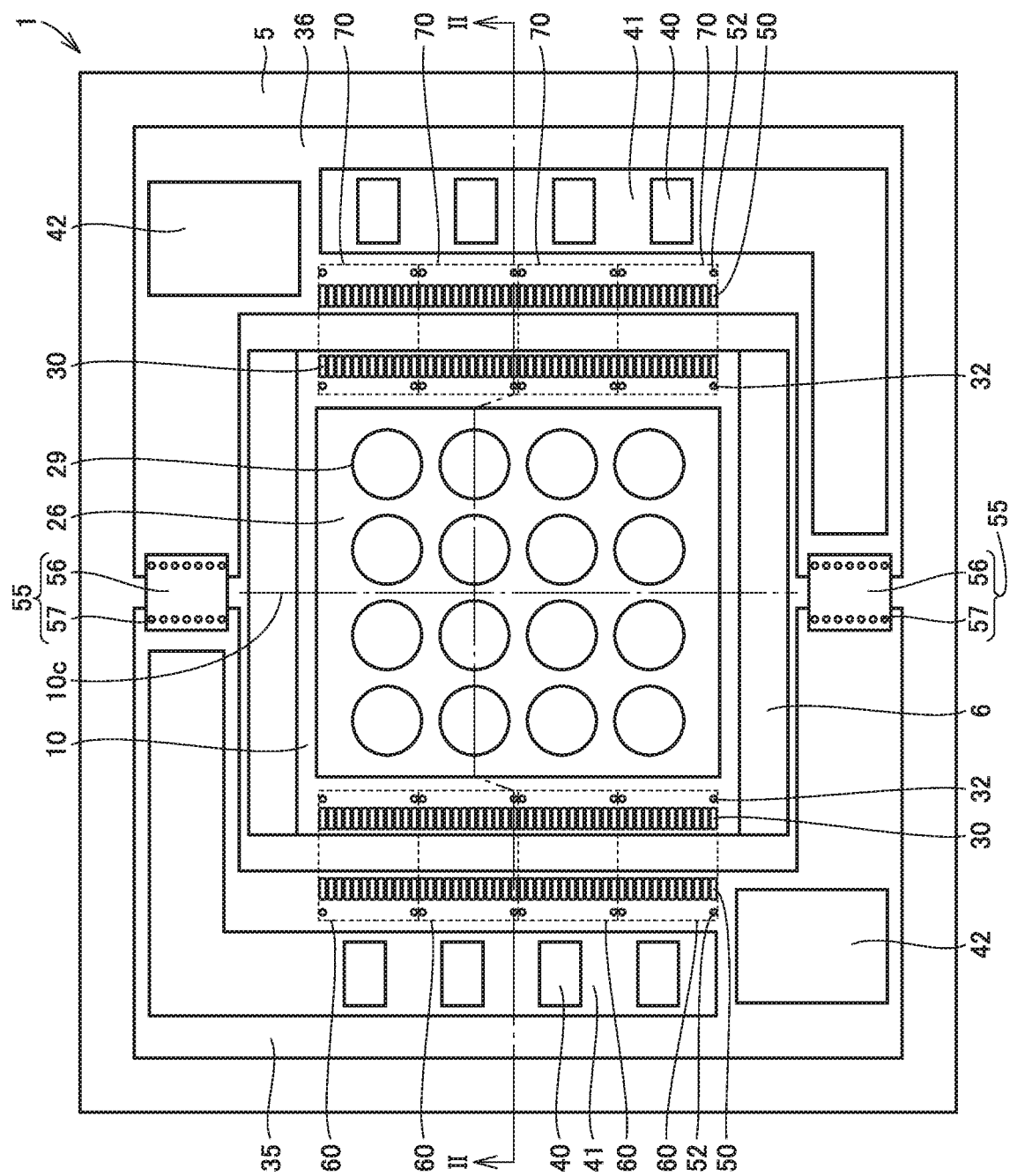
FIG. 1 is a schematic plan view of an array antenna apparatus according to Embodiment 1 of the present invention.

Hereinafter, embodiments of the present invention will be described. Note that like reference signs refer to like parts and the description will not be repeated.

Embodiment 1

Referring to FIGS. 1 through 11, an array antenna apparatus 1 according to Embodiment 1 will be described. Array antenna apparatus 1 according to the present embodiment primarily includes a base plate 5, a wiring board 10, a dielectric substrate 26, a non-feeding patch antenna element 29, one or more first external circuit boards 35, 36, a first electronic component 44, and one or more flexible printed circuits 60, 70. Array antenna apparatus 1 according to the present embodiment may further include multiple feeding patch antenna elements 19 and a ground conductor layer 20.

Base plate 5 has a first primary surface 5s. Base plate 5 may be, but not particularly limited to, a metal plate, such as an aluminum alloy plate. Array antenna apparatus 1 may further include a carrier 6. Carrier 6 is secured to first primary surface 5s of base plate 5, using a securing member such as screws. For carrier 6, a metal plate, such as a copper-tungsten (Cu—W) plate may be used. However, the present invention is not particularly limited thereto. Carrier 6 may have a coefficient of linear expansion that is substantially equal to the coefficient of linear expansion of wiring board 10. Carrier 6 may have a nickel-plated surface.

Wiring board 10 is mounted on first primary surface 5s of base plate 5. Particularly, wiring board 10 may be mounted on first primary surface 5s of base plate 5 via carrier 6 and an adhesive layer 7. Wiring board 10 includes a semiconductor substrate 11 and a wiring layer 15 on semiconductor substrate 11. Wiring board 10 has a second primary surface 10s opposite the base plate 5. Second primary surface 10s of wiring board 10 faces dielectric substrate 26. Wiring board 10 may further include multiple first conductive pads 30 and first alignment marks 32.

Semiconductor substrate 11 is disposed between wiring layer 15 and base plate 5. Particularly, semiconductor substrate 11 may face carrier 6 and wiring layer 15 may face dielectric substrate 26. Semiconductor substrate 11 may be, but not particularly limited to, a Si substrate, SiGe substrate, GaAs substrate, InP substrate, GaSb substrate, SiC substrate, or GaN substrate. Semiconductor substrate 11 may be a semi-insulating semiconductor substrate. Semiconductor substrate 11 may be composed of an insulative substrate and a semiconductor layer on the insulative substrate, or may be composed of an insulative substrate and a semi-insulating semiconductor layer on the insulative substrate. In plan view of second primary surface 10s, semiconductor substrate 11 may have a length of 60 mm and a width of 65 mm, for example. Semiconductor substrate 11 may have a thickness of 700 μm, for example.

Figure 3:
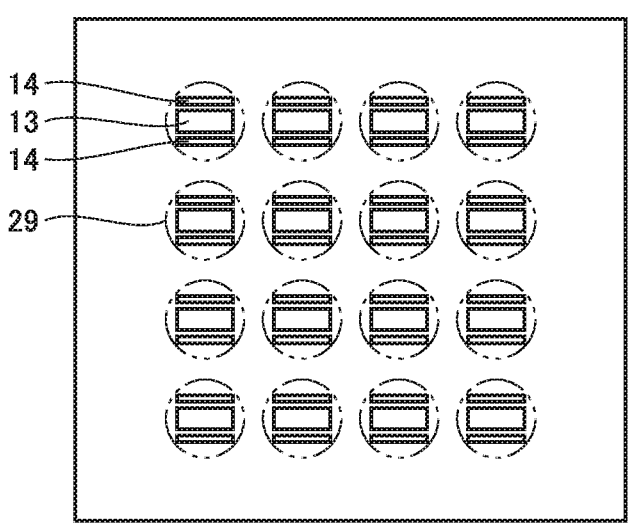
FIG. 3 is a schematic plan view of a semiconductor substrate included in the array antenna apparatus according to Embodiment 1 of the present invention.

Semiconductor substrate 11 may include multiple active device circuits 13 and multiple control circuits 14. Active device circuits 13 and control circuits 14 may be provided on the primary surface of semiconductor substrate 11 opposite the base plate 5. As shown in FIG. 3, in plan view of second primary surface 10s, non-feeding patch antenna elements 29 each may enclose one of active device circuits 13 and one of control circuits 14. Control circuits 14 each include two control circuit portions, which may be disposed on both sides of one of active device circuits 13 in plan view of second primary surface 10s. In plan view of second primary surface 10s, feeding patch antenna elements 19 each may also enclose one of active device circuits 13 and one of control circuits 14.

Figure 2:
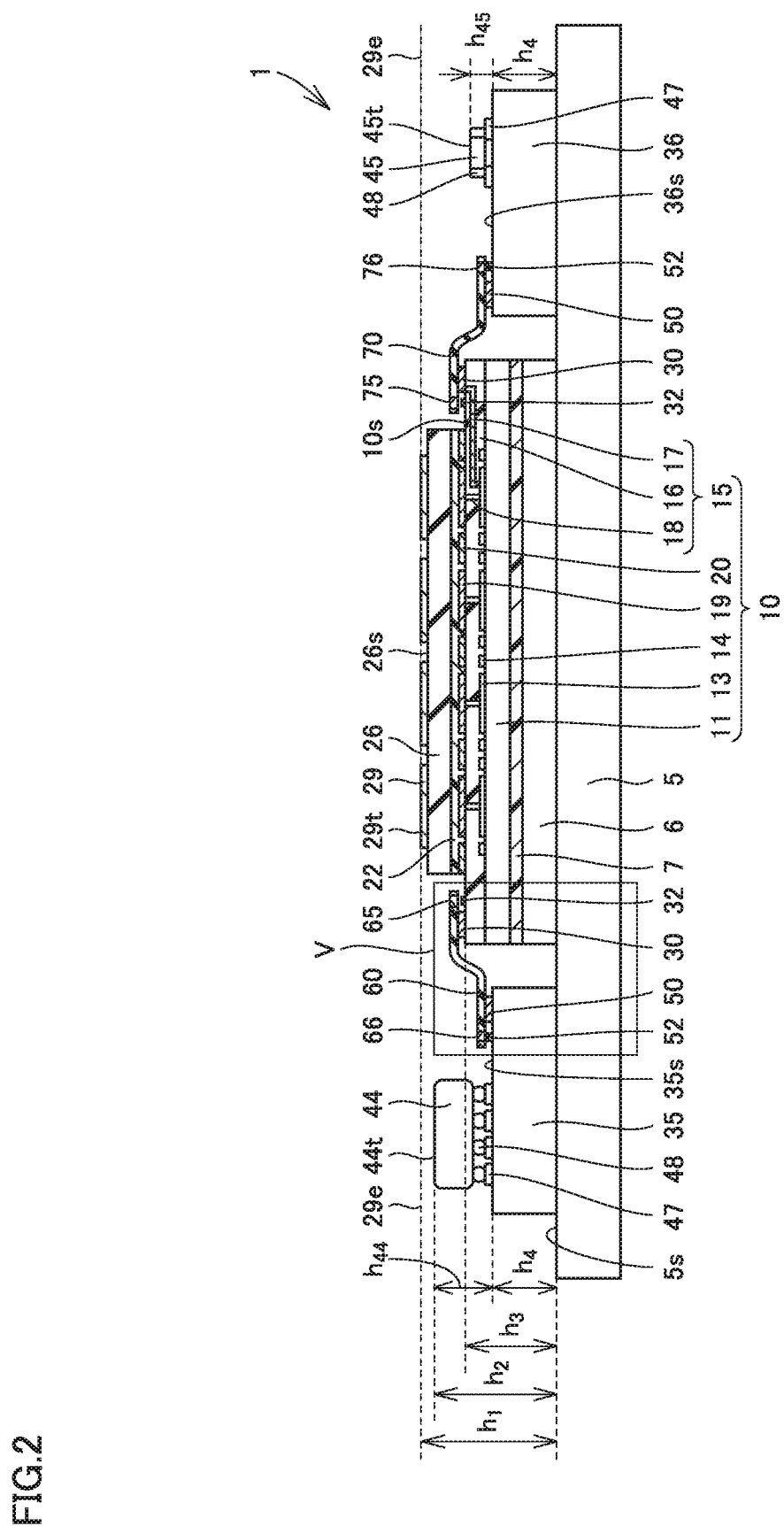
FIG. 2 is a schematic cross sectional view of the array antenna apparatus according to Embodiment 1 of the present invention, taken along a section line II-II shown in FIG. 1.
Figure 4:
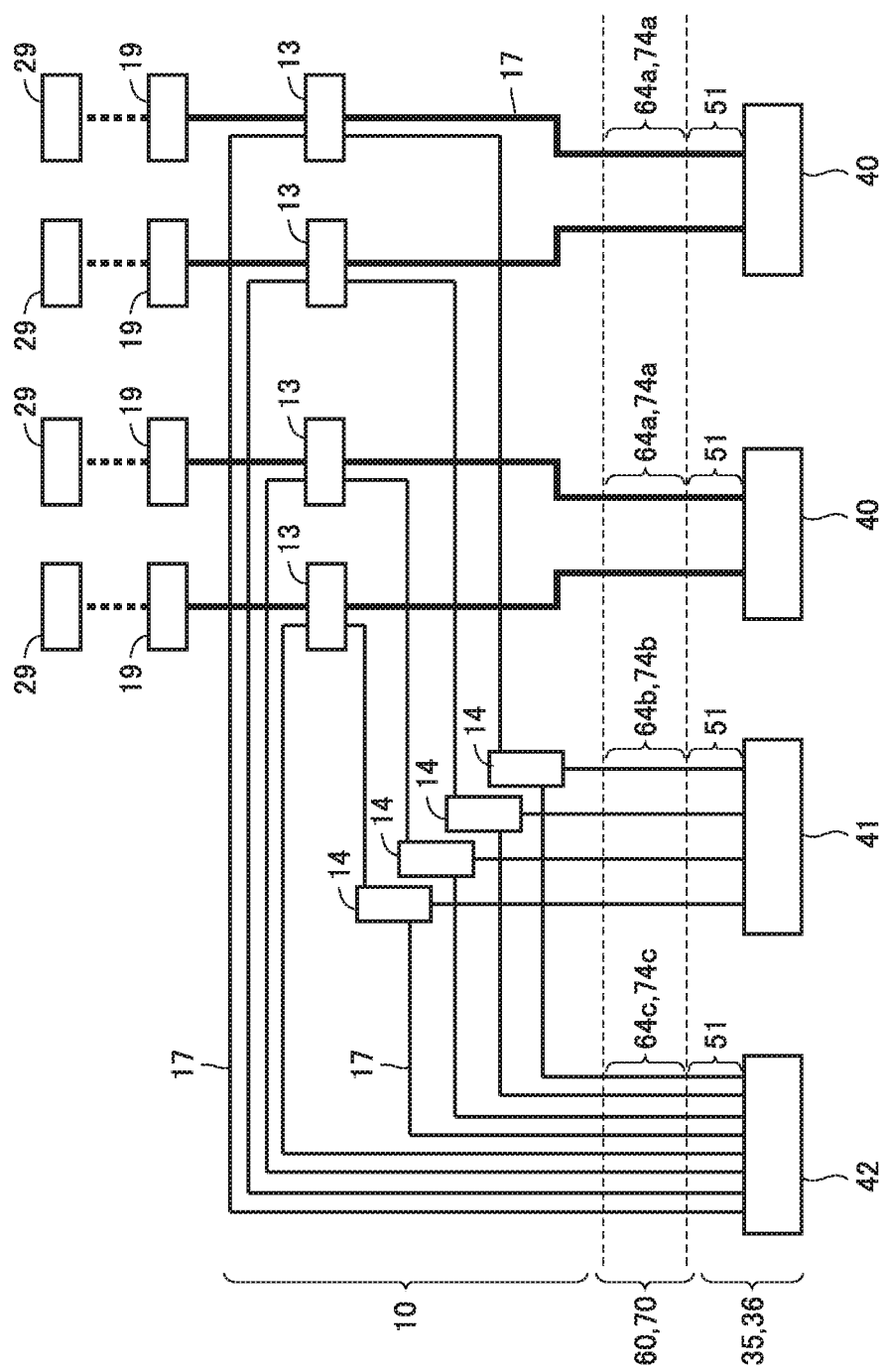
FIG. 4 is a circuit block diagram of the array antenna apparatus according to Embodiment 1 of the present invention.
Figure 5:
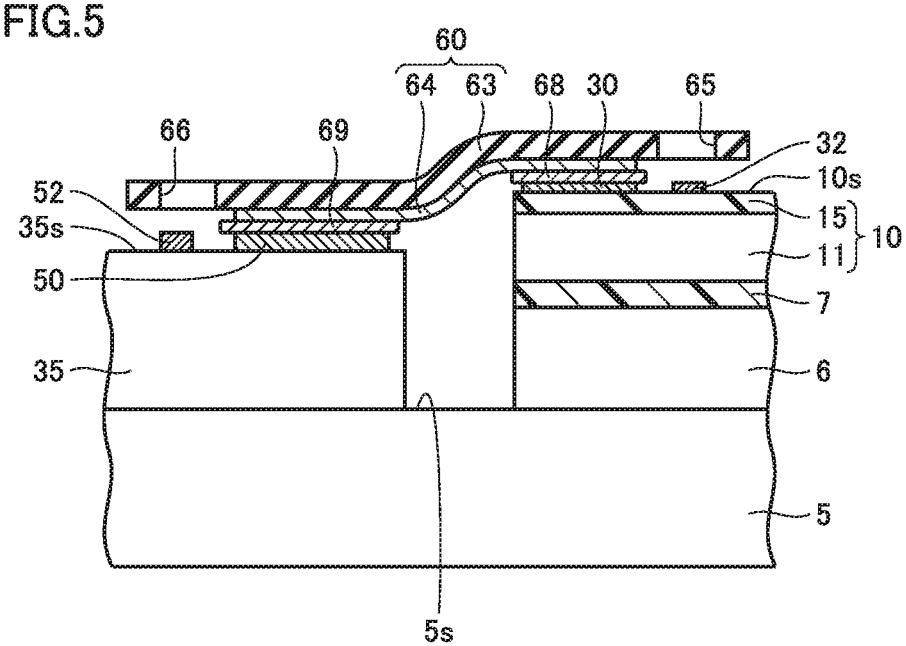
FIG. 5 is an enlarged schematic partial cross-sectional view of a region V, shown in FIG. 2, of the array antenna apparatus according to Embodiment 1 of the present invention.

Active device circuits 13 are capable of transmitting and receiving electromagnetic waves. As shown in FIGS. 2 and 4, active device circuits 13 each may be connected to one of feeding patch antenna elements 19. Active device circuits 13 each may be electrically coupled to one of non-feeding patch antenna elements 29 via one of feeding patch antenna elements 19. Active device circuits 13 are each capable of transmitting and receiving electromagnetic waves via one of feeding patch antenna elements 19 and one of non-feeding patch antenna elements 29. Active device circuits 13 each include a high-frequency electrical element which at least transmits or receives electromagnetic waves, such as microwave or millimeter wave, for example. The high-frequency electrical element may be at least any of a low noise amplifier (LNA), a high power amplifier (HPA), and a phase shifter (PS), for example. Active device circuits 13, formed on semiconductor substrate 11 which is a SiGe substrate, consume low power, operate at high speed, and generate little noise. This allows a large volume of data that are transmitted or received in high-frequency electromagnetic waves, such as microwave or millimeter wave, to be quickly processed, thereby improving the antenna characteristics of array antenna apparatus 1.

Control circuits 14 controls the operation of active device circuits 13. In plan view of second primary surface 10s, active device circuits 13 and control circuits 14 are covered with dielectric substrate 26. Active device circuits 13 and control circuits 14 are integrated on semiconductor substrate 11. This can reduce the size of array antenna apparatus 1. The transmission paths for high-frequency electromagnetic waves, such as microwave or millimeter wave, are shortened, transmission losses of high-frequency signals can thus decrease. A large volume of data that are transmitted or received in high-frequency signals, such as a microwave or millimeter wave, can be quickly processed.

Wiring layer 15 may have a second primary surface 10s. Wiring layer 15 includes an insulating layer 16, and multiple conductors 17 within insulating layer 16. Insulating layer 16 may have excellent mechanical strength, excellent heat resistance, and low dielectric loss (small dielectric loss tangent). Insulating layer 16 may be composed of a material having a dielectric loss tangent (tanδ) of 0.005 or less, or may be composed of a material having a dielectric loss tangent (tanδ) of 0.003 or less. Insulating layer 16 may be an electrically insulating resin layer. Insulating layer 16 may primarily contain, but not particularly limited to, a thermoplastic polyimide resin or a thermosetting polyimide resin. Conductors 17 may be, but not particularly limited to, gold layers (Au layers) or copper layers (Cu layers). Conductors 17 each have one end connected to one of first conductive pads 30. Conductors 17 each have the other end connected to at least one of active device circuits 13 and control circuits 14. Insulating layer 16 may have a thickness of 15 for example. Conductors 17 may have a thickness of 5 for example.

Wiring layer 15 may further include multiple conductive vias 18. Conductive vias 18 are connected to active device circuits 13 and feeding patch antenna elements 19. Conductive vias 18 may be formed by covering or filling through-holes in insulating layer 16 with a conductive material such as gold (Au) or copper (Cu).

First conductive pads 30 and first alignment marks 32 may be provided on second primary surface 10s exposed from dielectric substrate 26. First conductive pads 30 and first alignment marks 32 may be composed of, but not particularly limited to, conductive materials such as gold (Au) or copper (Cu).

In plan view of second primary surface 10s, first conductive pads 30 are disposed along a side of wiring board 10 opposite the first external circuit board 35 and a side of wiring board 10 opposite the first external circuit board 36. In plan view of second primary surface 10s, first alignment marks 32 are disposed along the side of wiring board 10 opposite the first external circuit board 35 and the side of wiring board 10 opposite the first external circuit board 36. In plan view of second primary surface 10s, first conductive pads 30 are disposed: between the side of wiring board 10 opposite the first external circuit board 35 and first alignment marks 32 disposed opposite the first external circuit board 35; and between the side of wiring board 10 opposite the first external circuit board 36 and first alignment marks 32 disposed opposite the first external circuit board 36.

Feeding patch antenna elements 19 are disposed in one-dimensional array or two-dimensional array on second primary surface 10s. Feeding patch antenna elements 19 are disposed on second primary surface 10s covered with dielectric substrate 26. Feeding patch antenna elements 19 are each connected to one of active device circuits 13 via one of conductive vias 18. Feeding patch antenna elements 19 may be composed of a conductive material, such as gold (Au) or copper (Cu).

Ground conductor layer 20 may be provided on second primary surface 10s. Ground conductor layer 20 is away from feeding patch antenna elements 19, being electrically insulated from feeding patch antenna elements 19. In plan view of second primary surface 10s, ground conductor layer 20 may enclose each feeding patch antenna element 19. Ground conductor layer 20 may be composed of a conductive material, such as gold (Au) or copper (Cu). Ground conductor layer 20 blocks the electromagnetic noise generated at active device circuits 13. Ground conductor layer 20 can inhibit the electromagnetic noise from coupling to feeding patch antenna elements 19 and non-feeding patch antenna elements 29.

Dielectric substrate 26 is attached to second primary surface 10s of wiring board 10. Particularly, dielectric substrate 26 may be attached to second primary surface 10s via adhesive layer 22. Dielectric substrate 26 has a third primary surface 26s opposite the wiring board 10. Dielectric substrate 26 may be, for example, a high-frequency printed circuit board, a liquid crystal polymer substrate, or a ceramic substrate such as an LTCC (Low Temperature Co-Fired Ceramic) substrate. Dielectric substrate 26 may be a fluoroplastic high-frequency printed circuit board having a low dielectric constant and a low dielectric loss, such as polytetrafluoroethylene (PTFE). Dielectric substrate 26 having a low dielectric constant and a low dielectric loss can reduce transmission delays and transmission losses of high-frequency signals such as microwave or millimeter wave.

Adhesive layer 22 may be composed of a thermoplastic resin, such as a fluoro thermoplastic resin, or a thermosetting resin. Adhesive layer 22 may be composed of a material having a dielectric loss tangent (tanδ) of 0.005 or less, or may be composed of a material having a dielectric loss tangent (tanδ) of 0.003 or less. Since adhesive layer 22 is composed of a material having a dielectric loss tangent of 0.005 or less, the loss of electromagnetic waves in array antenna apparatus 1 is reduced, thereby improving the radiant efficiency of array antenna apparatus 1.

Non-feeding patch antenna elements 29 are disposed in one-dimensional array or two-dimensional array on third primary surface 26s. Non-feeding patch antenna elements 29 may be composed of a conductive material such as gold (Au) or copper (Cu). Non-feeding patch antenna elements 29 are electromagnetically coupled to feeding patch antenna elements 19 respectively. Particularly, non-feeding patch antenna elements 29 are electromagnetically coupled to feeding patch antenna elements 19 respectively via dielectric substrate 26 and adhesive layer 22. Non-feeding patch antenna elements 29 are electrically coupled to active device circuits 13, respectively. Non-feeding patch antenna elements 29 each have a top face 29t.

One or more first external circuit boards 35, 36 are mounted on first primary surface 5s of base plate 5. One or more first external circuit boards 35, 36 are away from wiring board 10. One or more first external circuit boards 35, 36 have fourth primary surfaces 35s, 36s, respectively, the fourth primary surfaces 35s, 36s being opposite the base plate 5. One or more first external circuit boards 35, 36 may be printed circuit boards. The printed circuit boards may be, for example, a high-frequency printed circuit board, a liquid crystal polymer substrate, or a ceramic substrate such as an LTCC (Low Temperature Co-Fired Ceramic) substrate. The printed circuit boards may be a fluoroplastic high-frequency printed circuit board having a low dielectric constant and a low dielectric loss, such as polytetrafluoroethylene (PTFE). The printed circuit boards may be composed of a material having a dielectric loss tangent (tanδ) of 0.005 or less, or may be composed of a material having a dielectric loss tangent (tanδ) of 0.003 or less. First external circuit board 35, 36 having low dielectric constant and low dielectric loss can reduce transmission delays and transmission losses of high-frequency signals such as microwave or millimeter wave.

One or more first external circuit boards 35, 36 may be multiple first external circuit boards 35, 36, which may be mounted on first primary surface 5s. In plan view of second primary surface 10s, one (first external circuit board 35) of first external circuit boards 35, 36 and another one (first external circuit board 36) of first external circuit boards 35, 36 are disposed on opposing sides of wiring board 10. In plan view of second primary surface 10s, wiring board 10 is disposed between the one (first external circuit board 35) of first external circuit boards 35, 36 and the another one (first external circuit board 36) of first external circuit boards 35, 36.

One or more first external circuit boards 35, 36 each may include a high-frequency circuit 40, a signal processing circuit 41, and a power supply circuit 42. High-frequency circuit 40, signal processing circuit 41, and power supply circuit 42 are provided on fourth primary surface 35s, 36s. High-frequency circuit 40 may include, for example, a local signal source which oscillates a local signal, and an intermediate frequency signal source which oscillates an intermediate frequency signal. Signal processing circuit 41 may include, for example, a baseband signal processing circuit which generates a signal for transmission, and receives and demodulates an electromagnetic wave signal. Power supply circuit 42 supplies a supply voltage to active device circuit 13 and control circuit 14.

One or more electronic components (44, 45) may be mounted on fourth primary surfaces 35s, 36s of one or more first external circuit boards 35, 36, respectively. High-frequency circuit 40, signal processing circuit 41, and power supply circuit 42 each may include one or more electronic components (44, 45). In the present embodiment, one or more electronic components (44, 45) include first electronic component 44, and electronic component 45 different from first electronic component 44. Particularly, one or more electronic components (44, 45) may be secured onto conductive pads 47 on one or more first external circuit boards 35, 36, using bonding members 48 such as solder. One or more electronic components (44, 45) may be, but not particularly limited to, resistors, capacitors, inductors, connectors, or a semi-conductor package. The semi-conductor package refers to an electronic component in which a semiconductor device, such as a diode or a transistor, an integrated circuit (IC), or a large scale integrated circuit (LSI) is sealed with a resin package.

First electronic component 44 is one of one or more electronic components (44, 45). First electronic component 44 may be, but not particularly limited to, a resistor, a capacitor, an inductor, a connector, or a semi-conductor package. First electronic component 44 is the tallest among one or more electronic components (44, 45) mounted on fourth primary surface 35s, 36s. Stated differently, height $h_{44}$ of first top 44t of first electronic component 44 relative to fourth primary surface 35s, 36s is greater than height $h_{45}$ of a top 45t of electronic component 45 relative to fourth primary surface 35s, 36s.

One or more first external circuit boards 35, 36 each may further include multiple second conductive pads 50, multiple external circuit traces 51, and second alignment marks 52 on fourth primary surfaces 35s, 36s. Second conductive pads 50, external circuit traces 51, and second alignment marks 52 may be composed of, but not particularly limited to, conductive materials, such as gold (Au) or copper (Cu). External circuit traces 51 are connected to second conductive pads 50. Second conductive pads 50 may have a thickness greater than first conductive pads 30. External circuit traces 51 are each connected to one of high-frequency circuit 40, signal processing circuit 41, and power supply circuit 42.

In plan view of second primary surface 10s, second conductive pads 50 are disposed along the side of first external circuit board 35 opposite the wiring board 10 and the side of first external circuit board 36 opposite the wiring board 10. In plan view of second primary surface 10s, second alignment marks 52 are disposed along the side of first external circuit board 35 opposite the wiring board 10 and the side of first external circuit board 36 opposite the wiring board 10. In plan view of second primary surface 10s, second conductive pads 50 are disposed: between the side of first external circuit board 35 opposite the wiring board 10 and second alignment marks 52 disposed opposite the side of first external circuit board 35; and between the side of first external circuit board 36 opposite the wiring board 10 and second alignment marks 52 disposed opposite the side of first external circuit board 36.

One or more flexible printed circuits 60, 70 are attached to second primary surface 10s of wiring board 10 and fourth primary surfaces 35s, 36s of one or more first external circuit boards 35, 36. One or more flexible printed circuits 60, 70 electrically connect wiring layer 15 and one or more first external circuit boards 35, 36. One or more flexible printed circuits 60, 70 may be multiple flexible printed circuits 60, 70. Flexible printed circuits 60, 70 may be attached to second primary surface 10s on the side of wiring board 10 opposite the first external circuit board 35. Flexible printed circuits 60, 70 may be attached to fourth primary surface 35s, 36s on the side of first external circuit board 35, 36 opposite the wiring board 10.

In plan view of second primary surface 10s, one (e.g., first external circuit board 35) of first external circuit boards 35, 36 and another one (e.g., first external circuit board 36) of first external circuit boards 35, 36 may be disposed on the opposing sides of wiring board 10. One (e.g., flexible printed circuit 60) of flexible printed circuits 60, 70 is attached to the one (e.g., first external circuit board 35) of first external circuit boards 35, 36. Another one (e.g., a flexible printed circuit 70) of flexible printed circuits 60, 70 is attached to the another one (e.g., first external circuit board 36) of first external circuit boards 35, 36.

In plan view of second primary surface 10s, one or more traces 64, 74 (e.g., one or more traces 64) of the one (e.g., flexible printed circuit 60) of flexible printed circuits 60, 70 and one or more traces 64, 74 (e.g., one or more trace 74) of the another one (e.g., flexible printed circuit 70) of flexible printed circuits 60, 70 are disposed at the opposing positions across a centerline 10c of wiring board 10 between the one (e.g., first external circuit board 35) of first external circuit boards 35, 36 and the another one (e.g., first external circuit board 36) of first external circuit boards 35, 36. Particularly, in plan view of second primary surface 10s, one or more traces 64, 74 (e.g., one or more traces 64) of the one (e.g., flexible printed circuit 60) of flexible printed circuits 60, 70 and one or more traces 64, 74 (e.g., one or more traces 74) of the another one (e.g., flexible printed circuit 70) of flexible printed circuits 60, 70 may be disposed line symmetric about centerline 10c of wiring board 10 between the one (e.g., first external circuit board 35) of first external circuit boards 35, 36 and the another one (e.g., first external circuit board 36) of first external circuit boards 35, 36.

One or more flexible printed circuits 60, 70 each include a flexible base film 63, 73, and one or more traces 64, 74 provided on base film 63, 73. Base film 63, 73 may be composed of a resin material such as polyimide, for example. One or more traces 64, 74 may be, but not particularly limited to, gold layers (Au layer) or copper layers (Cu layer). One or more traces 64, 74 may be multiple traces 64, 74. Traces 64, 74 may include high-frequency circuit traces 64a, 74a, signal processing circuit traces 64b, 74b, and power supply circuit traces 64c, 74c.

High-frequency circuit 40 is connected to active device circuits 13 via high-frequency circuit traces 64a, 74a. High-frequency circuit traces 64a, 74a have a length $L_1$ and a width $W_1$. Length $L_1$ is defined as the length of high-frequency circuit traces 64a, 74a in the longitudinal direction of high-frequency circuit traces 64a, 74a. Width $W_1$ is defined as the length of high-frequency circuit traces 64a, 74a in a direction perpendicular to that longitudinal direction and along the surface of base film 63, 73. High-frequency circuit traces 64a, 74a may include multiple coplanar striplines. The coplanar striplines each may be composed of one signal transmission line and a pair of ground conductor lines disposed across the signal transmission line.

Signal processing circuit 41 is connected to control circuits 14 via signal processing circuit traces 64b, 74b. Signal processing circuit traces 64b, 74b have a length $L_2$ and a width $W_2$. Length $L_2$ is defined as the length of signal processing circuit traces 64b, 74b in the longitudinal direction of signal processing circuit traces 64b, 74b. Width $W_2$ is defined as the length of signal processing circuit traces 64b, 74b in a direction perpendicular to that longitudinal direction and along the surface of base film 63, 73.

Power supply circuit 42 is electrically connected to active device circuits 13 and control circuits 14 via power supply circuit traces 64c, 74c. Power supply circuit traces 64c, 74c have a length $L_3$ and a width $W_3$. Length $L_3$ is defined as the length of power supply circuit traces 64c, 74c in the longitudinal direction of power supply circuit traces 64c, 74c. Width $W_3$ is defined as the length of power supply circuit traces 64c, 74c perpendicular to that longitudinal direction and along the surface of base film 63, 73.

High-frequency circuit traces 64a, 74a may be shorter than power supply circuit traces 64c, 74c and signal processing circuit traces 64b, 74b. In other words, length $L_1$ of high-frequency circuit traces 64a, 74a may be shorter than length $L_2$ of signal processing circuit traces 64b, 74b, and shorter than length $L_3$ of power supply circuit traces 64c, 74c. This can reduce losses of high-frequency signals at high-frequency circuit traces 64a, 74a.

Power supply circuit traces 64c, 74c may have a wider width than high-frequency circuit traces 64a, 74a and signal processing circuit traces 64b, 74b. In other words, width $W_3$ of power supply circuit traces 64c, 74c may be greater than width $W_1$ of high-frequency circuit traces 64a, 74a and greater than width $W_2$ of signal processing circuit traces 64b, 74b. Power supply circuit traces 64c, 74c may be disposed adjacent to high-frequency circuit traces 64a, 74a.

If high-frequency circuit traces 64a, 74a are shorter than power supply circuit traces 64c, 74c and signal processing circuit traces 64b, 74b, the bonding strength between one or more flexible printed circuits 60, 70 and one or more first external circuit boards 35, 36 and the bonding strength between one or more flexible printed circuits 60, 70 and wiring board 10 may decay in high-frequency circuit traces 64a, 74a. Power supply circuit traces 64c, 74c have a wider width than high-frequency circuit traces 64a, 74a and disposed adjacent to high-frequency circuit traces 64a, 74a. This can increase the bonding strength between one or more flexible printed circuits 60, 70 and one or more first external circuit boards 35, 36, and the bonding strength between one or more flexible printed circuits 60, 70 and wiring board 10 in power supply circuit traces 64c, 74c.

An increase in bonding strength between one or more flexible printed circuits 60, 70 and one or more first external circuit boards 35, 36 in power supply circuit traces 64c, 74c can compensate for the decay in bonding strength between one or more flexible printed circuits 60, 70 and one or more first external circuit boards 35, 36 in high-frequency circuit traces 64a, 74a. An increase in bonding strength between one or more flexible printed circuits 60, 70 and wiring board 10 in power supply circuit traces 64c, 74c can compensate for the decay in bonding strength between one or more flexible printed circuits 60, 70 and wiring board 10 in high-frequency circuit traces 64a, 74a.

One or more flexible printed circuits 60, 70 each may have first through-holes 65, 75 and second through-holes 66, 76. First through-holes 65, 75 are positioned at edge portions of one or more flexible printed circuits 60, 70, the edge portions facing wiring board 10. Particularly, two first through-holes 65, 75 may be positioned at corners at the edge portions, facing wiring board 10, of one or more flexible printed circuits 60, 70. Second through-holes 66, 76 are positioned at edge portions of one or more flexible printed circuits 60, 70, the edge portions facing one or more first external circuit boards 35, 36. Particularly, two second through-holes 66, 76 may be positioned at corners at the edge portions, facing one or more first external circuit boards 35, 36, of one or more flexible printed circuits 60, 70. First through-holes 65, 75 and second through-holes 66, 76 may be positioned at the four corners of one or more flexible printed circuits 60, 70. This can prevent rotational misalignment of one or more flexible printed circuits 60, 70 with respect to wiring board 10 and one or more first external circuit boards 35, 36 in plan view of second primary surface 10s.

In plan view of first primary surface 5s, first through-holes 65, 75 and second through-holes 66, 76 may overlap with at least some of first alignment marks 32 and at least some of second alignment marks 52, respectively. Using first through-holes 65, 75 and first alignment marks 32, one or more flexible printed circuits 60, 70 are aligned with wiring board 10. Using second through-holes 66, 76 and second alignment marks 52, one or more flexible printed circuits 60, 70 are aligned with one or more first external circuit boards 35, 36.

Figure 6:
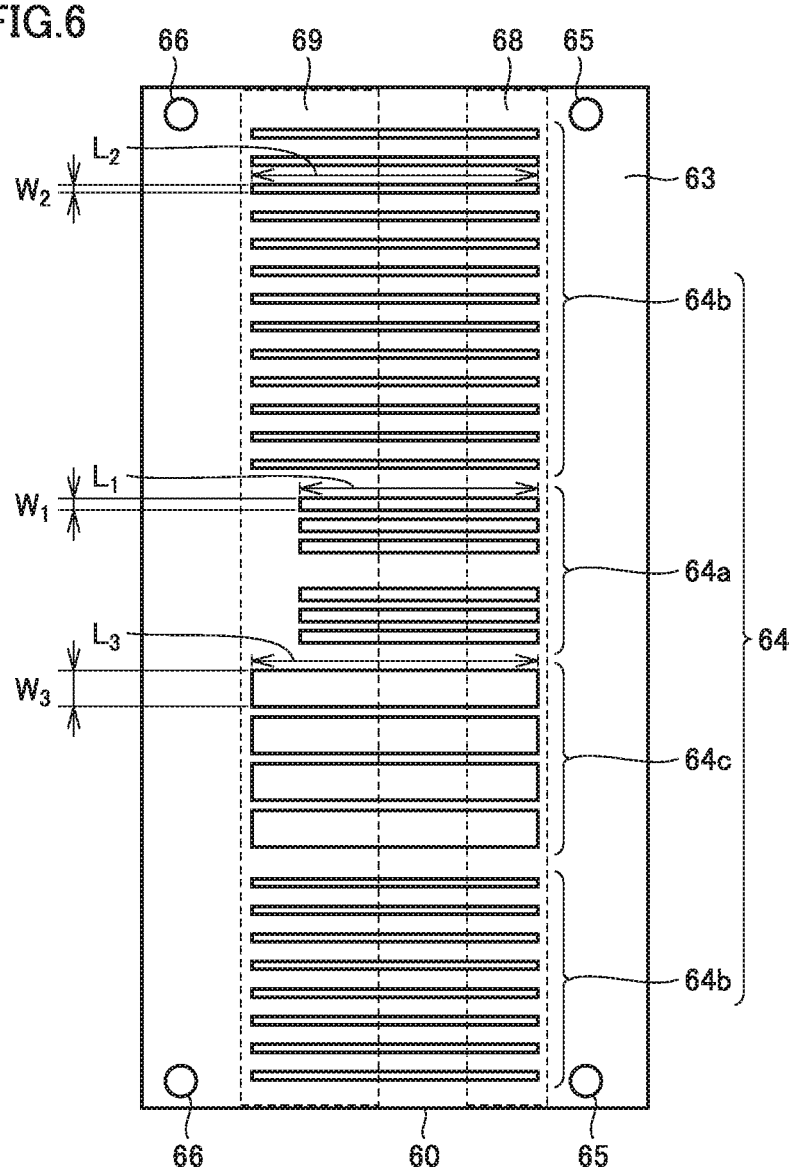
FIG. 6 is a schematic plan view of a flexible printed circuit included in the array antenna apparatus according to Embodiment 1 of the present invention.
Figure 7:
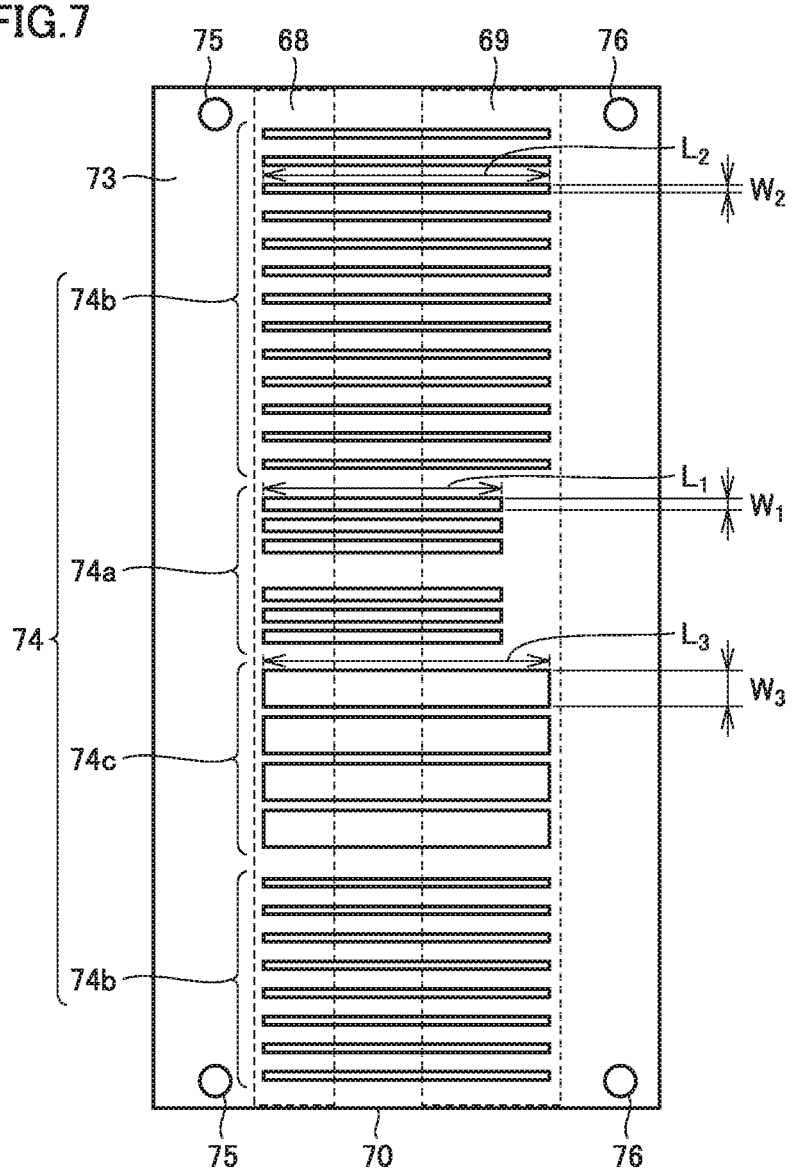
FIG. 7 is a schematic plan view of a flexible printed circuit included in the array antenna apparatus according to Embodiment 1 of the present invention.
Figure 8:
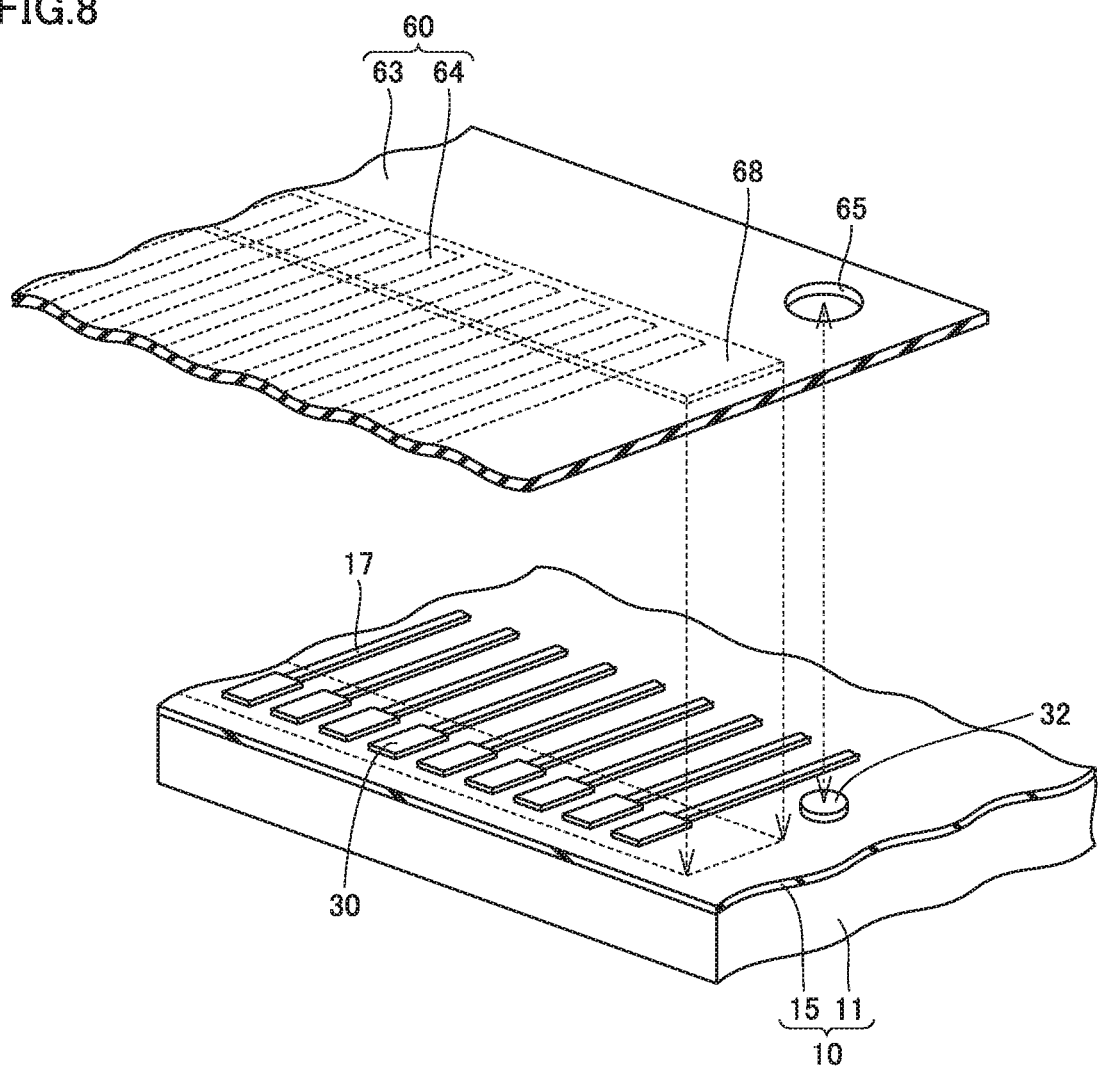
FIG. 8 is an enlarged schematic partial perspective view of a joint between one or more flexible printed circuits and a wiring board in the array antenna apparatus according to Embodiment 1 of the present invention.
Figure 9:
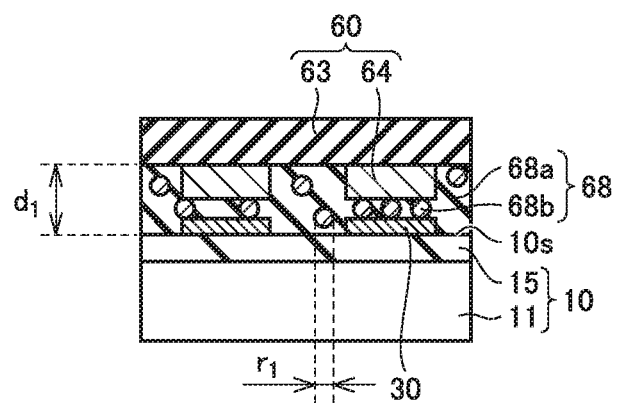
FIG. 9 is an enlarged schematic partial cross-sectional view of the joint between the one or more flexible printed circuits and the wiring board in the array antenna apparatus according to Embodiment 1 of the present invention.

As shown in FIGS. 8 and 9, one or more flexible printed circuits 60, 70 each may be adhered to second primary surface 10s of wiring board 10 via a first anisotropic conductive member 68. First anisotropic conductive member 68 may be a first anisotropic conductive film or a first anisotropic conductive paste. First anisotropic conductive member 68 includes first resin adhesive layer 68a and multiple first electrically conductive particles 68b dispersed in first resin adhesive layer 68a. One or more flexible printed circuits 60, 70 are secured to second primary surface 10s of wiring board 10, using first resin adhesive layer 68a. One or more traces 64, 74 are electrically connected to first conductive pads 30, using first electrically conductive particles 68b. Referring to FIGS. 6 and 7, first anisotropic conductive members 68 cover the edge portions of one or more traces 64, 74 on the wiring board 10 side, and are not formed on portions of base film 63, 73 around first through-holes 65, 75.

Figure 10:
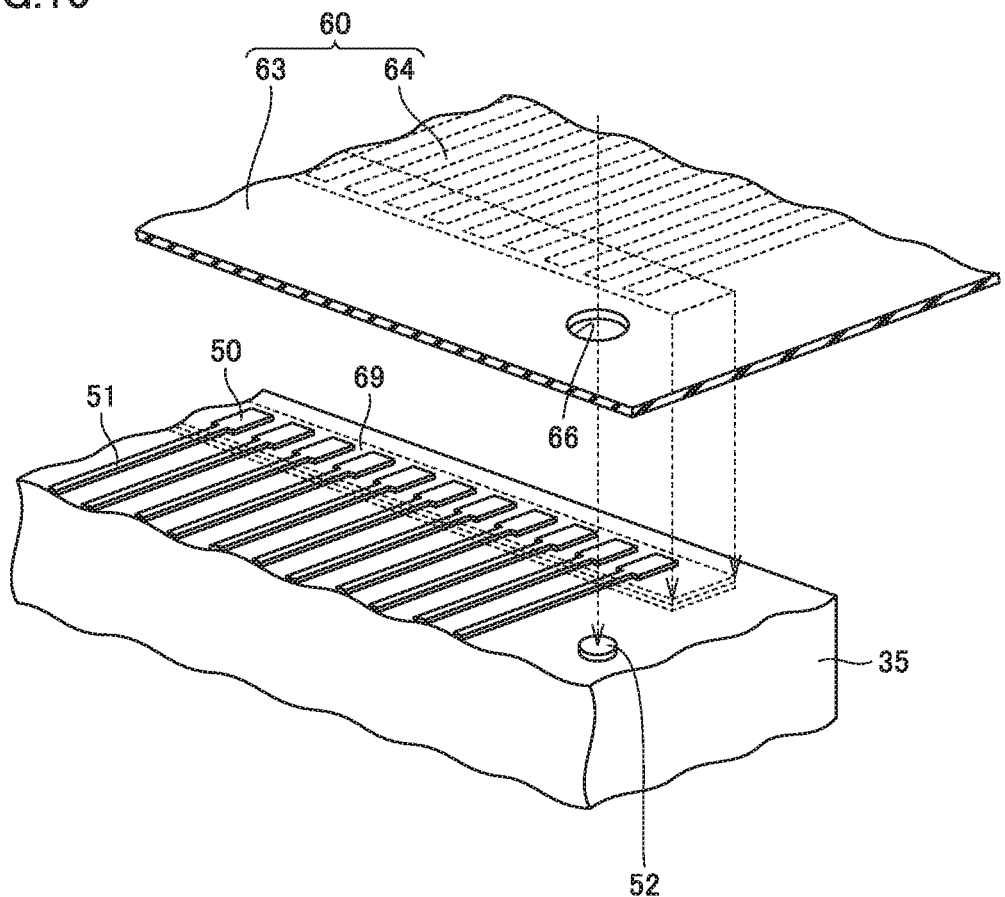
FIG. 10 is an enlarged schematic partial perspective view of the joint between the one or more flexible printed circuits and one or more external circuit boards in the array antenna apparatus according to Embodiment 1 of the present invention.
Figure 11:
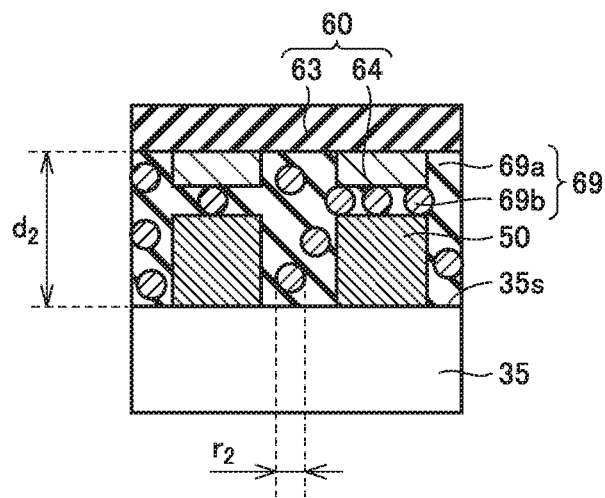
FIG. 11 is an enlarged schematic partial cross-sectional view of the joint between one or more flexible printed circuits and one or more external circuit boards in the array antenna apparatus according to Embodiment 1 of the present invention.

As shown in FIGS. 10 and 11, one or more flexible printed circuits 60, 70 may be adhered to fourth primary surfaces 35s, 36s of one or more first external circuit boards 35, 36 via second anisotropic conductive member 69. Second anisotropic conductive member 69 may be a second anisotropic conductive film or a second anisotropic conductive paste. Second anisotropic conductive member 69 includes a second resin adhesive layer 69a, and multiple second electrically conductive particles 69b dispersed in second resin adhesive layer 69a. One or more flexible printed circuits 60, 70 are secured to fourth primary surfaces 35s, 36s of one or more first external circuit boards 35, 36, using second resin adhesive layer 69a. One or more traces 64, 74 are electrically connected to second conductive pads 50, using second electrically conductive particles 69b. Referring to FIGS. 6 and 7, second anisotropic conductive member 69 covers the edge portions of one or more traces 64, 74 on the external circuit board side, and is not formed on portions of base film 63, 73 around second through-holes 66, 76.

First electrically conductive particles 68b have a first diameter $r_1$. Second electrically conductive particles 69b have a second diameter $r_2$. Second electrically conductive particles 69b are greater in diameter than first electrically conductive particles 68b. Second diameter $r_2$ of second electrically conductive particles 69b is greater than first diameter $r_1$ of first electrically conductive particles 68b. Second anisotropic conductive member 69 may be greater in thickness than first anisotropic conductive member 68. Thickness $d_2$ of second anisotropic conductive member 69 may be greater than thickness $d_1$ of first anisotropic conductive member 68.

In the present embodiment, wiring board 10 is fabricated using a semi-conductor fabrication process, whereas one or more first external circuit boards 35, 36 are printed circuit boards. Due to this, one or more first external circuit boards 35, 36 have greater surface roughness than wiring board 10. Second electrically conductive particles 69b are greater in diameter than first electrically conductive particles 68b, and one or more flexible printed circuits 60, 70 can thus surely be electrically connected to one or more first external circuit boards 35, 36 that have greater surface roughness, via second electrically conductive particles 69b. Second anisotropic conductive member 69 is greater in thickness than first anisotropic conductive member 68, one or more flexible printed circuits 60, 70 can thus surely be secured to one or more first external circuit boards 35, 36 that have greater surface roughness.

Referring to FIG. 1, first external circuit boards 35, 36 are connected to each other, using an electrical connection member 55. Electrical connection member 55 may include, for example, a printed circuit board 56 and conductive pins 57. Electrical connection member 55 may be a flexible printed circuit, a wiring harness, or a busbar. Electrical connection member 55 may be a ribbon or a fine line, and the ribbon or fine line may be composed of a conductive metallic material such as gold (Au), copper (Cu), or aluminum (Al).

Referring to FIG. 2, first height $h_1$ of multiple antenna elements (non-feeding patch antenna elements 29) relative to first primary surface 5s is greater than or equal to a second height $h_2$ of a first top 44t of first electronic component 44 relative to first primary surface 5s. The height of a surface 29e, extended from top faces 29t of the antenna elements (non-feeding patch antenna elements 29), relative to first primary surface 5s is greater than or equal to second height $h_2$ of first top 44t of first electronic component 44 relative to first primary surface 5s. Top faces 29t of the antenna elements (non-feeding patch antenna elements 29) are farther away from first primary surface 5s of base plate 5 than all the electronic components (44, 45) mounted on all the external circuit boards (first external circuit board 35, 36) disposed around wiring board 10 are. The height of the surface 29e, extended from top faces 29t of the antenna elements (non-feeding patch antenna elements 29), relative to first primary surface 5s may be equal to first height $h_1$ of top faces 29t of the antenna elements (non-feeding patch antenna elements 29) relative to first primary surface 5s.

A third height $h_3$ of second primary surface 10s relative to first primary surface 5s is greater than a fourth height $h_4$ of fourth primary surfaces 35s, 36s relative to first primary surface 5s. The difference between third height $h_3$ and fourth height $h_4$ may be 0.3 mm or greater and 2.0 mm or less.

Referring primarily to FIGS. 12 through 21, a method for fabricating array antenna apparatus 1 according to the present embodiment will be described.

Figure 12:
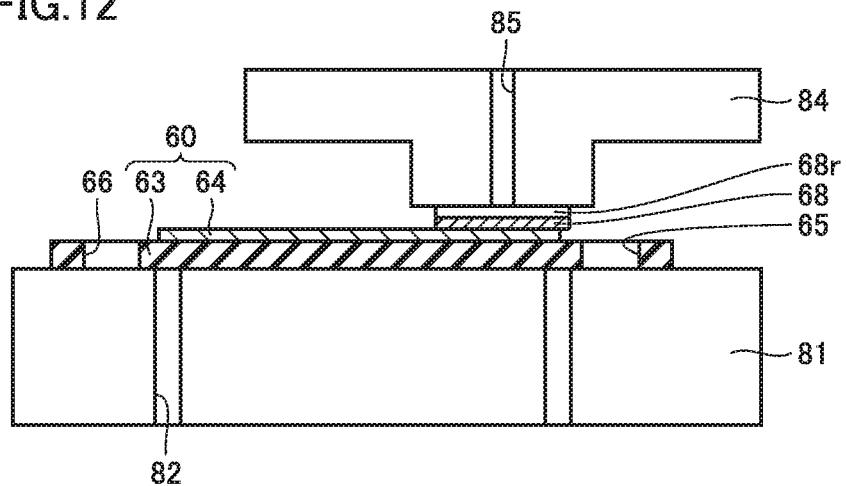
FIG. 12 is a schematic cross sectional view showing one step included in a method for fabricating the array antenna apparatus according to Embodiment 1 of the present invention.

As shown in FIGS. 6, 7, and 12, the method for fabricating array antenna apparatus 1 according to the present embodiment may include temporarily adhering first anisotropic conductive member 68 to each of one or more flexible printed circuits 60, 70. One or more flexible printed circuits 60, 70 are each adsorbed on a stage 81 which includes an adsorbing portion 82. A first bonder 84, which includes an adsorbing portion 85, adsorbs and holds a release film 68r for supporting first anisotropic conductive member 68. Using first bonder 84, first anisotropic conductive member 68 is moved onto one edge portion of each of one or more flexible printed circuits 60, 70, the one edge portion having first through-holes 65, 75 formed therein. Using first bonder 84, first anisotropic conductive member 68 is pressed against each of one or more flexible printed circuits 60, 70. Release film 68r is then peeled off from first anisotropic conductive member 68. In this manner, first anisotropic conductive member 68 is temporarily adhered to each of one or more flexible printed circuits 60, 70.

Figure 13:
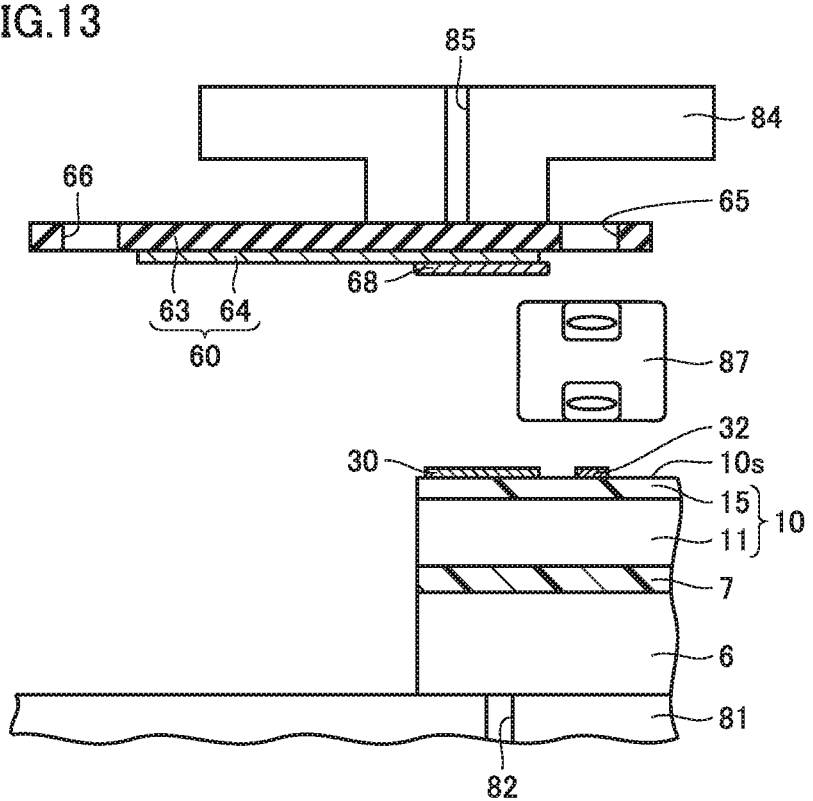
FIG. 13 is an enlarged schematic partial cross-sectional view showing a step following the step shown in FIG. 12 in the method for fabricating the array antenna apparatus according to Embodiment 1 of the present invention.

As shown in FIG. 13, the method for fabricating array antenna apparatus 1 according to the present embodiment includes aligning one or more flexible printed circuits 60, 70 with wiring board 10. Specifically, carrier 6, having wiring board 10 secured thereto, is adsorbed on stage 81 including adsorbing portion 82. Using a first observer 87, first through-holes 65, 75 of one or more flexible printed circuits 60, 70 are aligned with first alignment marks 32 on second primary surface 10s of wiring board 10. Specifically, first observer 87 is used to ascertain whether first through-holes 65, 75 overlap with at least some of first alignment marks 32 in plan view of second primary surface 10s or in plan view of first primary surface 5s. First observer 87 may be disposed between second primary surface 10s and each of one or more flexible printed circuits 60, 70. First observer 87 may be a dual-lens camera. First anisotropic conductive member 68 faces first conductive pads 30. After one or more flexible printed circuits 60, 70 are finished to be aligned with wiring board 10, first observer 87 is detached from between second primary surface 10s and each of one or more flexible printed circuits 60, 70.

Etching a metal layer in forming one or more traces 64, 74 on one or more flexible printed circuits 60, 70 results in roughened surfaces of one or more flexible printed circuits 60, 70. Due to this, one or more flexible printed circuits 60, 70 are not transparent. However, one or more flexible printed circuits 60, 70 have first through-holes 65, 75, respectively. While one or more flexible printed circuits 60, 70 are not transparent, they can be accurately aligned with wiring board 10, using first through-holes 65, 75 and first alignment marks 32.

Figure 14:
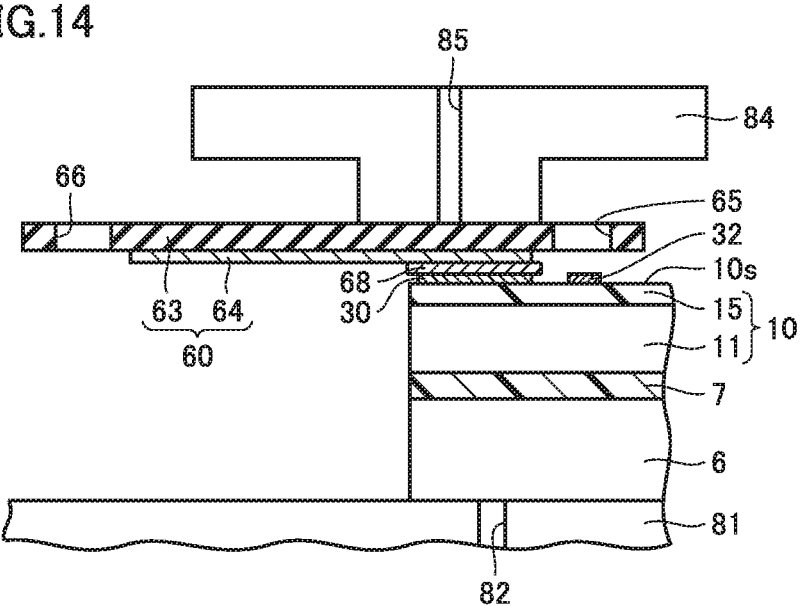
FIG. 14 is an enlarged schematic partial cross-sectional view showing a step following the step shown in FIG. 13 in the method for fabricating the array antenna apparatus according to Embodiment 1 of the present invention.

As shown in FIG. 14, the method for fabricating array antenna apparatus 1 according to the present embodiment includes temporarily adhering one or more flexible printed circuits 60, 70 to second primary surface 10s of wiring board 10 via first anisotropic conductive members 68. Specifically, one or more flexible printed circuits 60, 70, each provided with first anisotropic conductive member 68, are pressed against second primary surface 10s of wiring board 10, using first bonder 84. One or more flexible printed circuits 60, 70 are each temporarily adhered to second primary surface 10s of wiring board 10 via first anisotropic conductive member 68. First anisotropic conductive member 68 is temporarily adhered on first conductive pads 30.

Figure 15:
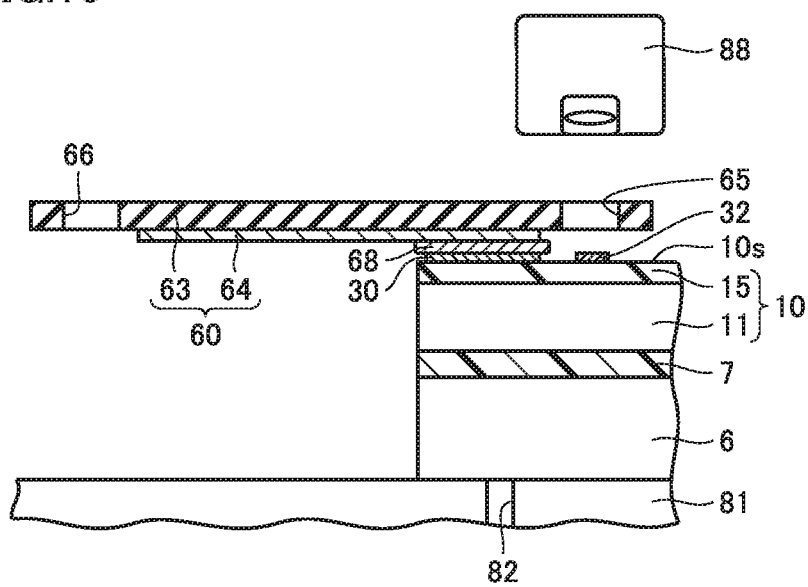
FIG. 15 is an enlarged schematic partial cross-sectional view showing a step following the step shown in FIG. 14 in the method for fabricating the array antenna apparatus according to Embodiment 1 of the present invention.

As shown in FIG. 15, after temporarily adhering one or more flexible printed circuits 60, 70 to wiring board 10, the method for fabricating array antenna apparatus 1 according to the present embodiment may include ascertaining whether one or more flexible printed circuits 60, 70 are properly aligned with wiring board 10. Specifically, after one or more flexible printed circuits 60, 70 are temporarily adhered to wiring board 10, a second observer 88 is used to ascertain whether first through-holes 65, 75 overlap with at least some of first alignment marks 32 in plan view of second primary surface 10s or in plan view of first primary surface 5s. Second observer 88 may be a single-lens camera. After one or more flexible printed circuits 60, 70 are temporarily adhered to wiring board 10, if first through-holes 65, 75 do not overlap with first alignment marks 32, one or more flexible printed circuits 60, 70 are detached from wiring board 10. First through-holes 65, 75 are then accurately aligned with first alignment marks 32. One or more flexible printed circuits 60, 70 are temporarily adhered again to wiring board 10.

Figure 16:
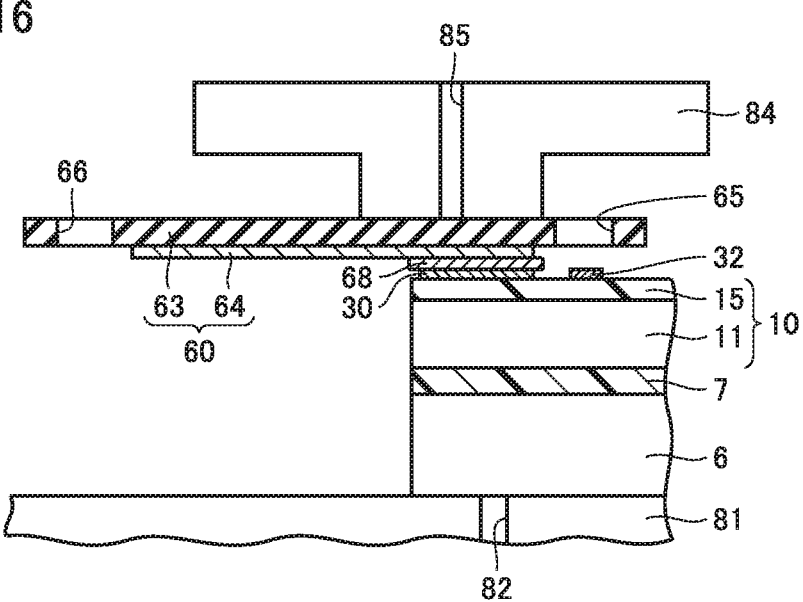
FIG. 16 is an enlarged schematic partial cross-sectional view showing a step following the step shown in FIG. 15 in the method for fabricating the array antenna apparatus according to Embodiment 1 of the present invention.

As shown in FIG. 16, the method for fabricating array antenna apparatus 1 according to the present embodiment includes adhering one or more flexible printed circuits 60, 70 to second primary surface 10s of wiring board 10 via first anisotropic conductive members 68. Specifically, one or more flexible printed circuits 60, 70, each provided with first anisotropic conductive member 68, is pressed against second primary surface 10s, using first bonder 84. A second pressure of first bonder 84 when adhering one or more flexible printed circuits 60, 70 to wiring board 10 is greater than a first pressure of first bonder 84 when temporarily adhering one or more flexible printed circuits 60, 70 to wiring board 10. First anisotropic conductive member 68 is heated by at least one of first bonder 84 and stage 81. The at least one of first bonder 84 and stage 81 includes a heater. A second temperature of the at least one of first bonder 84 and stage 81 when adhering one or more flexible printed circuits 60, 70 to wiring board 10 is higher than a first temperature of the at least one of first bonder 84 and stage 81 when adhering one or more flexible printed circuits 60, 70 to wiring board 10. In this manner, one or more flexible printed circuits 60, 70 are adhered to second primary surface 10s of wiring board 10.

Figure 17:
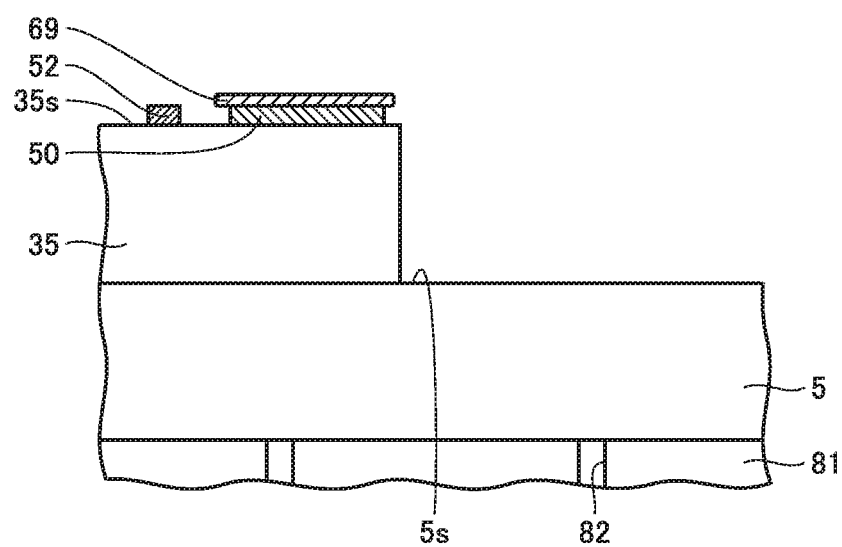
FIG. 17 is an enlarged schematic partial cross-sectional view showing a step following the step shown in FIG. 16 in the method for fabricating the array antenna apparatus according to Embodiment 1 of the present invention.

As shown in FIG. 17, the method for fabricating array antenna apparatus 1 according to the present embodiment includes providing second anisotropic conductive member 69 on one or more first external circuit boards 35, 36. Particularly, second anisotropic conductive member 69 is provided on second conductive pads 50 on one or more first external circuit boards 35, 36. As with temporarily adhering first anisotropic conductive member 68 to one or more flexible printed circuits 60, 70, first bonder 84 may be used to provide second anisotropic conductive member 69 on second conductive pads 50. The method for fabricating array antenna apparatus 1 according to the present embodiment may include mounting one or more first external circuit boards 35, 36 on first primary surface 5s of base plate 5. Base plate 5 may be adsorbed on stage 81 including adsorbing portion 82.

Figure 18:
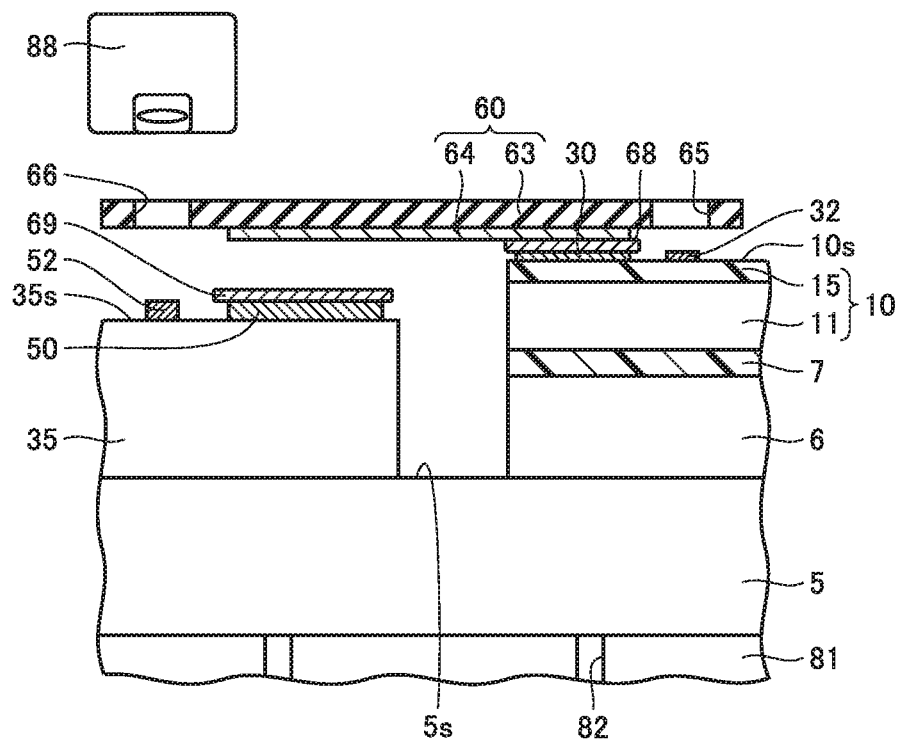
FIG. 18 is an enlarged schematic partial cross-sectional view showing a step following the step shown in FIG. 17 in the method for fabricating the array antenna apparatus according to Embodiment 1 of the present invention.

As shown in FIG. 18, the method for fabricating array antenna apparatus 1 according to the present embodiment includes aligning one or more flexible printed circuits 60, 70 with one or more first external circuit boards 35, 36. Specifically, one or more first external circuit boards 35, 36 are mounted on first primary surface 5s of base plate 5. Carrier 6, secured onto wiring board 10, is mounted on first primary surface 5s of base plate 5. Second observer 88 is used to align second through-holes 66, 76 of one or more flexible printed circuits 60, 70 with second alignment marks 52 on fourth primary surfaces 35s, 36s of one or more first external circuit boards 35, 36.

Etching a metal layer in forming one or more traces 64, 74 on one or more flexible printed circuits 60, 70 results in roughened surfaces of one or more flexible printed circuits 60, 70. Due to this, one or more flexible printed circuits 60, 70 are not transparent. However, one or more flexible printed circuits 60, 70 have second through-holes 66, 76, respectively. While one or more flexible printed circuits 60, 70 are not transparent, they can be accurately aligned with one or more first external circuit boards 35, 36, using second through-holes 66, 76 and second alignment marks 52.

Figure 19:
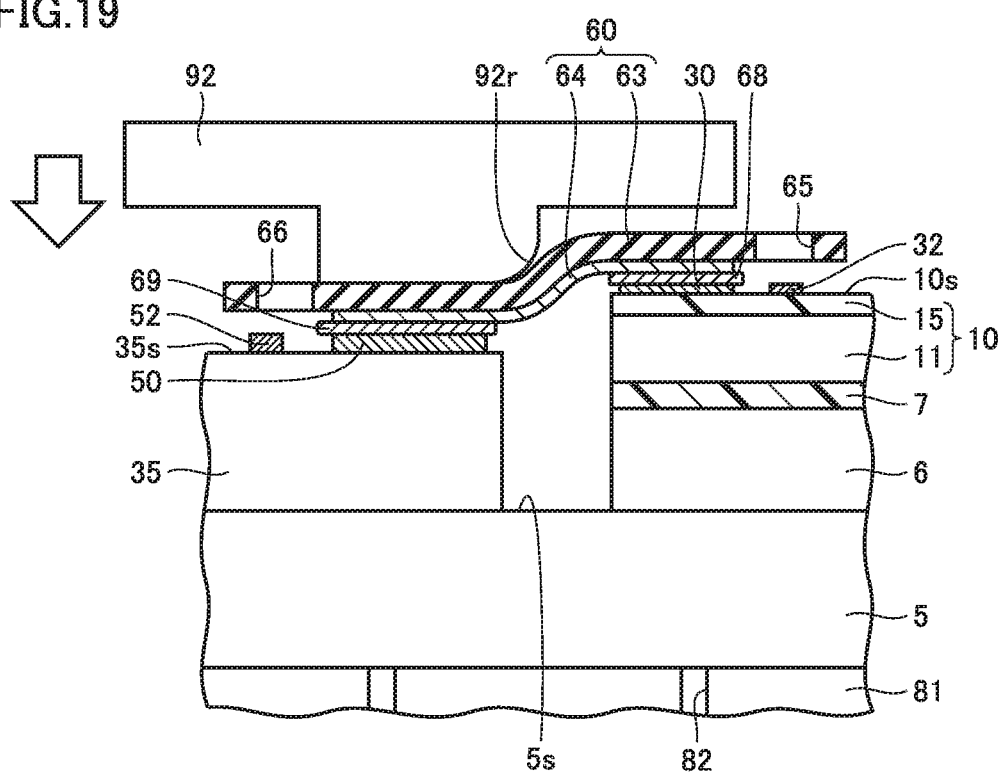
FIG. 19 is an enlarged schematic partial cross-sectional view showing a step following the step shown in FIG. 18 in the method for fabricating the array antenna apparatus according to Embodiment 1 of the present invention.

As shown in FIG. 19, the method for fabricating array antenna apparatus 1 according to the present embodiment includes temporarily adhering one or more flexible printed circuits 60, 70 to fourth primary surfaces 35s, 36s of one or more first external circuit boards 35, 36 via second anisotropic conductive member 69. Specifically, one or more flexible printed circuits 60, 70 are pressed against fourth primary surfaces 35s, 36s of one or more first external circuit boards 35, 36, respectively, using a second bonder 92. Unlike first bonder 84, second bonder 92 may not include adsorbing portion 85. Second bonder 92 may have a curved chamfer 92r. Curved chamfer 92r faces one or more flexible printed circuits 60, 70 and is formed at a corner of second bonder 92 positioned on the wiring board 10 side. Curved chamfer 92r can prevent damage to one or more flexible printed circuits 60, 70 when they are pressed against fourth primary surfaces 35s, 36s using second bonder 92. One or more flexible printed circuits 60, 70 are temporarily adhered to fourth primary surfaces 35s, 36s of one or more first external circuit boards 35, 36 via second anisotropic conductive member 69.

Figure 20:
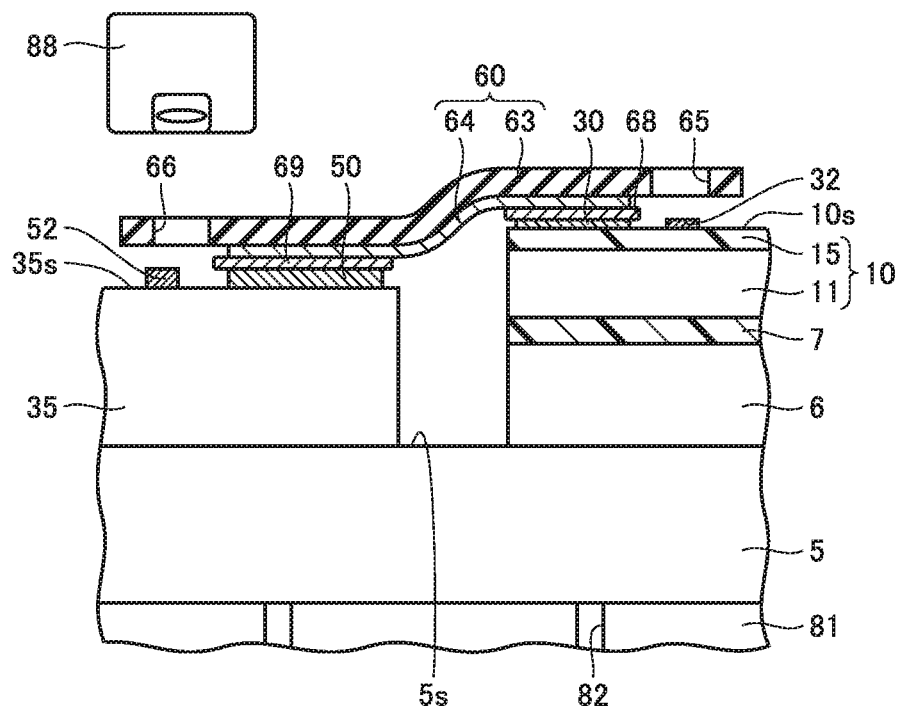
FIG. 20 is an enlarged schematic partial cross-sectional view showing a step following the step shown in FIG. 19 in the method for fabricating the array antenna apparatus according to Embodiment 1 of the present invention.

As shown in FIG. 20, the method for fabricating array antenna apparatus 1 according to the present embodiment may include, after temporarily adhering one or more flexible printed circuits 60, 70 to one or more first external circuit boards 35, 36, ascertaining whether one or more flexible printed circuits 60, 70 are accurately aligned with one or more first external circuit boards 35, 36. Specifically, after one or more flexible printed circuits 60, 70 are temporarily adhered to one or more first external circuit boards 35, 36, respectively, second observer 88 is used to ascertain whether second through-holes 66, 76 overlap with at least some of second alignment marks 52 in plan view of fourth primary surfaces 35s, 36s or in plan view of first primary surface 5s. If second through-holes 66, 76 do not overlap with first alignment marks 32 after one or more flexible printed circuits 60, 70 are temporarily adhered to one or more first external circuit boards 35, 36, respectively, one or more flexible printed circuits 60, 70 are detached from one or more first external circuit boards 35, 36, respectively. Second through-holes 66, 76 are then accurately aligned with second alignment marks 52. One or more flexible printed circuits 60, 70 are temporarily adhered again to one or more first external circuit boards 35, 36, respectively.

Figure 21:
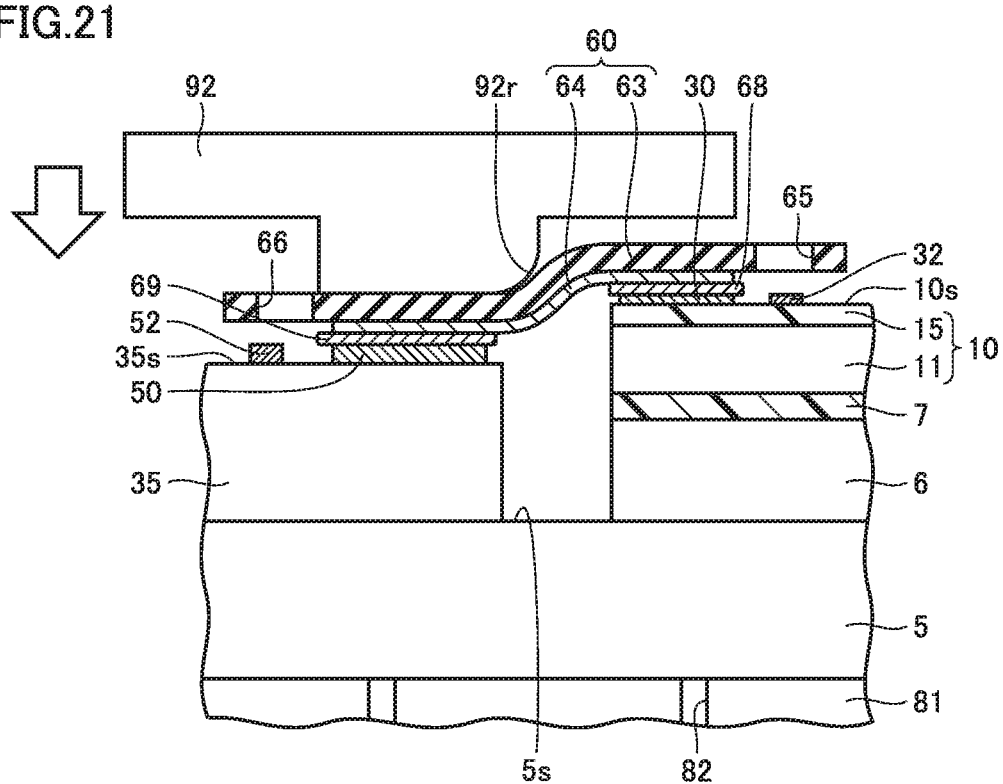
FIG. 21 is an enlarged schematic partial cross-sectional view showing a step following the step shown in FIG. 20 in the method for fabricating the array antenna apparatus according to Embodiment 1 of the present invention.

As shown in FIG. 21, the method for fabricating array antenna apparatus 1 according to the present embodiment includes adhering one or more flexible printed circuits 60, 70, via second anisotropic conductive member 69, to fourth primary surfaces 35s, 36s of one or more first external circuit boards 35, 36, respectively. Specifically, one or more flexible printed circuits 60, 70 are pressed against fourth primary surfaces 35s, 36s of one or more first external circuit boards 35, 36, respectively, using second bonder 92. A fourth pressure of second bonder 92 when adhering one or more flexible printed circuits 60, 70 to one or more first external circuit boards 35, 36 is greater than a third pressure of second bonder 92 when temporarily adhering one or more flexible printed circuits 60, 70 to one or more first external circuit boards 35, 36, respectively. Second anisotropic conductive member 69 is heated by at least one of second bonder 92 and stage 81. The at least one of second bonder 92 and stage 81 includes a heater. A fourth temperature of the at least one of second bonder 92 and stage 81 when adhering one or more flexible printed circuits 60, 70 to one or more first external circuit boards 35, 36, respectively, is higher than a third temperature of the at least one of second bonder 92 and stage 81 when adhering one or more flexible printed circuits 60, 70 to one or more first external circuit boards 35, 36, respectively. In this manner, one or more flexible printed circuits 60, 70 are adhered to fourth primary surfaces 35s, 36s of one or more first external circuit boards 35, 36, respectively, via second anisotropic conductive member 69.

Figure 22:
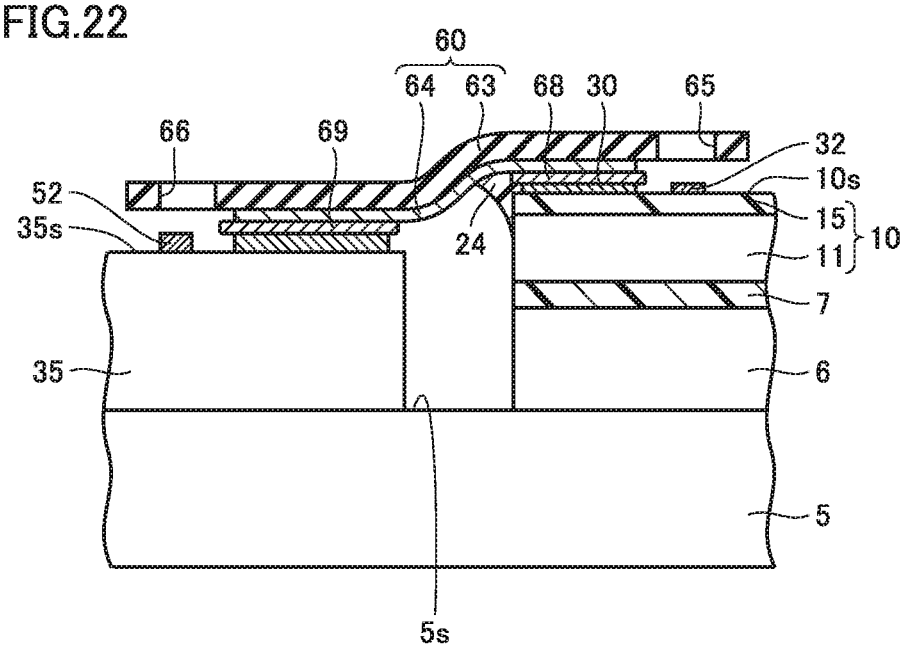
FIG. 22 is an enlarged schematic partial cross-sectional view of an array antenna apparatus according to a variation of Embodiment 1 of the present invention.

Referring to FIG. 22, an array antenna apparatus 1 according to a variation of the present embodiment will be described. Array antenna apparatus 1 according to the variation of the present embodiment may further include an elastic resin member 24. Elastic resin member 24 is more elastic than first anisotropic conductive member 68. Elastic resin member 24 is in contact with one or more flexible printed circuits 60, 70, first anisotropic conductive members 68, and wiring board 10. Elastic resin member 24 is adhered to first anisotropic conductive members 68, one or more flexible printed circuits 60, 70, and wiring board 10.

Elastic resin member 24 can reinforce the joint, by first anisotropic conductive member 68, between one or more flexible printed circuits 60, 70 and wiring board 10. As array antenna apparatus 1 is exposed to temperature changes, thermal stress is applied to the joint, by first anisotropic conductive member 68, between one or more flexible printed circuits 60, 70 and wiring board 10. The thermal stress is due to the difference between, for example, the coefficient of thermal expansion of wiring board 10 and the coefficient of thermal expansion of one or more first external circuit boards 35, 36. Elastic resin member 24 can alleviate the thermal stress, thereby preventing the joint, by first anisotropic conductive member 68 between one or more flexible printed circuits 60, 70 and wiring board 10, from being destroyed. Elastic resin member 24 may be, for example, an ultraviolet curing resin, such as an epoxy-based resin, an acrylic-based resin, or a silicone-based resin, or a thermosetting resin, such as a polyurethane-based resin.

Advantages effects of array antenna apparatus 1 according to the present embodiment and the variation thereof will be described.

Array antenna apparatus 1 according to the present embodiment and the variation thereof includes base plate 5, wiring board 10, dielectric substrate 26, multiple antenna elements (non-feeding patch antenna elements 29), one or more first external circuit boards 35, 36, first electronic component 44, and one or more flexible printed circuits 60, 70. Base plate 5 has first primary surface 5s. Wiring board 10 is mounted on first primary surface 5s. Wiring board 10 includes semiconductor substrate 11 and wiring layer 15 on semiconductor substrate 11. Semiconductor substrate 11 is disposed between wiring layer 15 and base plate 5. Wiring board 10 has second primary surface 10s opposite the base plate 5. Dielectric substrate 26 is attached to second primary surface 10s. Dielectric substrate 26 has third primary surface 26s opposite the wiring board 10. The antenna elements (non-feeding patch antenna elements 29) are disposed in an array on third primary surface 26s. One or more first external circuit boards 35, 36 are mounted on first primary surface 5s. One or more first external circuit boards 35, 36 have fourth primary surfaces 35s, 36s opposite the base plate 5. First electronic component 44 is mounted on fourth primary surfaces 35s, 36s. First electronic component 44 is the tallest among one or more electronic components (44, 45) mounted on fourth primary surfaces 35s, 36s. One or more flexible printed circuits 60, 70 are attached to second primary surface 10s and fourth primary surfaces 35s, 36s. One or more flexible printed circuits 60, 70 includes one or more traces 64, 74, respectively. First height $h_1$ of top face 29t of the antenna elements (non-feeding patch antenna elements 29) relative to first primary surface 5s is greater than or equal to second height $h_2$ of first top 44t of first electronic component 44 relative to first primary surface 5s. Third height $h_3$ of second primary surface 10s relative to first primary surface 5s is greater than a fourth height $h_4$ of fourth primary surfaces 35s, 36s relative to first primary surface 5s.

In array antenna apparatus 1 according to the present embodiment and the variation thereof, a first height $h_1$ of top face 29t of the antenna elements (non-feeding patch antenna elements 29) relative to first primary surface 5s is greater than or equal to second height $h_2$ of first top 44t of first electronic component 44 relative to first primary surface 5s. Due to this, electromagnetic waves transmitted and received through the antenna elements (non-feeding patch antenna elements 29) can be prevented from causing electromagnetic interference with one or more electronic components (44, 45) on one or more first external circuit boards 35, 36. Moreover, third height $h_3$ of second primary surface 10s relative to first primary surface 5s is greater than fourth height $h_4$ of fourth primary surfaces 35s, 36s relative to first primary surface 5s. Due to this, first height $h_1$ of top face 29t of the antenna elements (non-feeding patch antenna elements 29) relative to first primary surface 5s can readily be set greater than or equal to second height $h_2$ of first top 44t of first electronic component 44 relative to first primary surface 5s. In this manner, array antenna apparatus 1 according to the present embodiment and the variation thereof has good antenna characteristics.

In array antenna apparatus 1 according to the present embodiment and the variation thereof, the difference between third height $h_3$ and fourth height $h_4$ may be 0.3 mm or greater and 2.0 mm or less. Since third height $h_3$ is greater than fourth height $h_4$ by 0.3 mm or greater, electromagnetic waves transmitted and received through the antenna elements (non-feeding patch antenna elements 29) can further be prevented from causing electromagnetic interference with one or more electronic components (44, 45) on one or more first external circuit boards 35, 36. Array antenna apparatus 1 according to the present embodiment and the variation thereof has good antenna characteristics. Since the difference between third height $h_3$ and fourth height $h_4$ is 2.0 mm or less, extension of one or more traces 64, 74 can be inhibited. A high-frequency signal can be prevented form being degraded in one or more flexible printed circuits 60, 70. Array antenna apparatus 1 according to the present embodiment and the variation thereof has good antenna characteristics.

In array antenna apparatus 1 according to the present embodiment and the variation thereof, wiring board 10 may include multiple first conductive pads 30 on second primary surface 10s. One or more first external circuit boards 35, 36 may include multiple second conductive pads 50 on fourth primary surfaces 35s, 36s. One or more flexible printed circuits 60, 70 may be multiple flexible printed circuits 60, 70. One or more traces 64, 74 may be multiple traces 64, 74. Traces 64, 74 each may be connected to one of first conductive pads 30 and one of second conductive pads 50.

As such, flexible printed circuits 60, 70 connect wiring board 10 and one or more first external circuit boards 35, 36. Due to this, even if a third pitch for Traces 64, 74 is different, more or less, from the first pitch for first conductive pads 30 and the second pitch for second conductive pads 50, traces 64, 74 of flexible printed circuits 60, 70 can more accurately be aligned with first conductive pads 30 of wiring board 10 and second conductive pads 50 of one or more first external circuit boards 35, 36. Array antenna apparatus 1 according to the present embodiment and the variation thereof has good antenna characteristics.

In array antenna apparatus 1 according to the present embodiment and the variation thereof, one or more flexible printed circuits 60, 70 may be multiple flexible printed circuits 60, 70. One or more first external circuit boards 35, 36 may be multiple first external circuit boards 35, 36. In plan view of second primary surface 10s, one (e.g., first external circuit board 35) of first external circuit boards 35, 36 and another one (e.g., first external circuit board 36) of first external circuit boards 35, 36 are disposed on opposing sides of wiring board 10. One (e.g., flexible printed circuit 60) of flexible printed circuits 60, 70 is attached to the one (e.g., first external circuit board 35) of first external circuit boards 35, 36. Another one (e.g., flexible printed circuit 70) of flexible printed circuits 60, 70 is attached to the another one (e.g., first external circuit board 36) of first external circuit boards 35, 36. In plan view of second primary surface 10s, one or more traces 64, 74 (e.g., one or more traces 64) of the one (e.g., flexible printed circuit 60) of flexible printed circuits 60, 70 and one or more traces 64, 74 (e.g., one or more traces 74) of the another one (e.g., flexible printed circuit 70) of flexible printed circuits 60, 70 are disposed at the opposing positions across centerline 10c of wiring board 10 that is between the one of first external circuit boards 35, 36 and the another one of first external circuit boards 35, 36.

Due to this, the types of flexible printed circuits 60, 70 can be decreased. The arrangement of flexible printed circuits 60, 70 for wiring board 10 can be simplified. Array antenna apparatus 1 according to the present embodiment and the variation thereof can readily be assembled. The manufacturing cost for array antenna apparatus 1 according to the present embodiment and the variation thereof can be reduced.

In array antenna apparatus 1 according to the present embodiment and the variation thereof, wiring board 10 may include multiple active device circuits 13, and control circuits 14 connected to active device circuits 13. Active device circuits 13 are electrically coupled to multiple antenna elements (non-feeding patch antenna elements 29), respectively. One or more first external circuit boards 35, 36 each may include high-frequency circuit 40, signal processing circuit 41, and power supply circuit 42. One or more traces 64, 74 may be multiple traces 64, 74. Traces 64, 74 may include power supply circuit traces 64c, 74c, high-frequency circuit traces 64a, 74a, and signal processing circuit traces 64b, 74b. High-frequency circuit 40 is connected to active device circuits 13 via high-frequency circuit traces 64a, 74a. Signal processing circuit 41 is connected to control circuit 14 via signal processing circuit traces 64b, 74b. Power supply circuit 42 is electrically connected to active device circuits 13 and control circuits 14 via power supply circuit traces 64c, 74c. High-frequency circuit traces 64a, 74a may be shorter than power supply circuit traces 64c, 74c and signal processing circuit traces 64b, 74b. Power supply circuit traces 64c, 74c may have a wider width than high-frequency circuit traces 64a, 74a and signal processing circuit traces 64b, 74b. Power supply circuit traces 64c, 74c may be disposed adjacent to high-frequency circuit traces 64a, 74a, respectively.

Since high-frequency circuit traces 64a, 74a are shorter than power supply circuit traces 64c, 74c and signal processing circuit traces 64b, 74b, losses of high-frequency signals in high-frequency circuit traces 64a, 74a can be reduced. Power supply circuit traces 64c, 74c have a wider width than high-frequency circuit traces 64a, 74a and signal processing circuit traces 64b, 74b. Power supply circuit traces 64c, 74c have greater current capacity than high-frequency circuit traces 64a, 74a and signal processing circuit traces 64b, 74b. A sufficient amount of power can be supplied, via power supply circuit traces 64c, 74c, to active device circuits 13 and control circuits 14 included in wiring board 10.

Power supply circuit traces 64c, 74c are disposed adjacent to high-frequency circuit traces 64a, 74a. Due to this, the bonding strength between one or more flexible printed circuits 60, 70 and one or more first external circuit boards 35, 36 can increase in power supply circuit traces 64c, 74c. The bonding strength between one or more flexible printed circuits 60, 70 and wiring board 10 can increase in power supply circuit traces 64c, 74c. If high-frequency circuit traces 64a, 74a are shorter than power supply circuit traces 64c, 74c and signal processing circuit traces 64b, 74b, the bonding strength between one or more flexible printed circuits 60, 70 and one or more first external circuit boards 35, 36 and the bonding strength between one or more flexible printed circuits 60, 70 and wiring board 10 may decay in high-frequency circuit traces 64a, 74a.

An increase in bonding strength between one or more flexible printed circuits 60, 70 and one or more first external circuit boards 35, 36 in power supply circuit traces 64c, 74c can compensate for the decay in bonding strength between one or more flexible printed circuits 60, 70 and one or more first external circuit boards 35, 36 in high-frequency circuit traces 64a, 74a. An increase in bonding strength between one or more flexible printed circuits 60, 70 and wiring board 10 in power supply circuit traces 64c, 74c can compensate for the decay in bonding strength between one or more flexible printed circuits 60, 70 and wiring board 10 in high-frequency circuit traces 64a, 74a.

In array antenna apparatus 1 according to the present embodiment and the variation thereof, wiring board 10 may include first alignment marks 32 on second primary surface 10s. One or more first external circuit boards 35, 36 may include second alignment marks 52 on fourth primary surfaces 35s, 36s. One or more flexible printed circuits 60, 70 may have first through-holes 65, 75 and second through-holes 66, 76, respectively. In plan view of first primary surface 5s, first through-holes 65, 75 and second through-holes 66, 76 may overlap with at least some of first alignment marks 32 and at least some of second alignment marks 52, respectively.

Due to this, while one or more flexible printed circuits 60, 70 are not transparent, they can be accurately aligned with wiring board 10, using first through-holes 65, 75 and first alignment marks 32. While one or more flexible printed circuits 60, 70 are not transparent, they can be accurately aligned with one or more first external circuit boards 35, 36, using second through-holes 66, 76 and second alignment marks 52. Array antenna apparatus 1 according to the present embodiment and the variation thereof has good antenna characteristics.

In array antenna apparatus 1 according to the present embodiment and the variation thereof, one or more first external circuit boards 35, 36 may be printed circuit boards. One or more flexible printed circuits 60, 70 may be adhered to second primary surface 10s via first anisotropic conductive member 68 including first electrically conductive particles 68b. One or more flexible printed circuits 60, 70 may be adhered to fourth primary surfaces 35s, 36s via second anisotropic conductive member 69 including second electrically conductive particles 69b. Second electrically conductive particles 69b are greater in diameter than first electrically conductive particles 68b.

Since one or more first external circuit boards 35, 36 are printed circuit boards, one or more first external circuit boards 35, 36 have greater surface roughness than wiring board 10. Second electrically conductive particles 69b are greater in diameter than first electrically conductive particles 68b, and one or more flexible printed circuits 60, 70 can thus surely be electrically connected to one or more first external circuit boards 35, 36 that have greater surface roughness, via second electrically conductive particles 69b.

Embodiment 2

Figure 23:
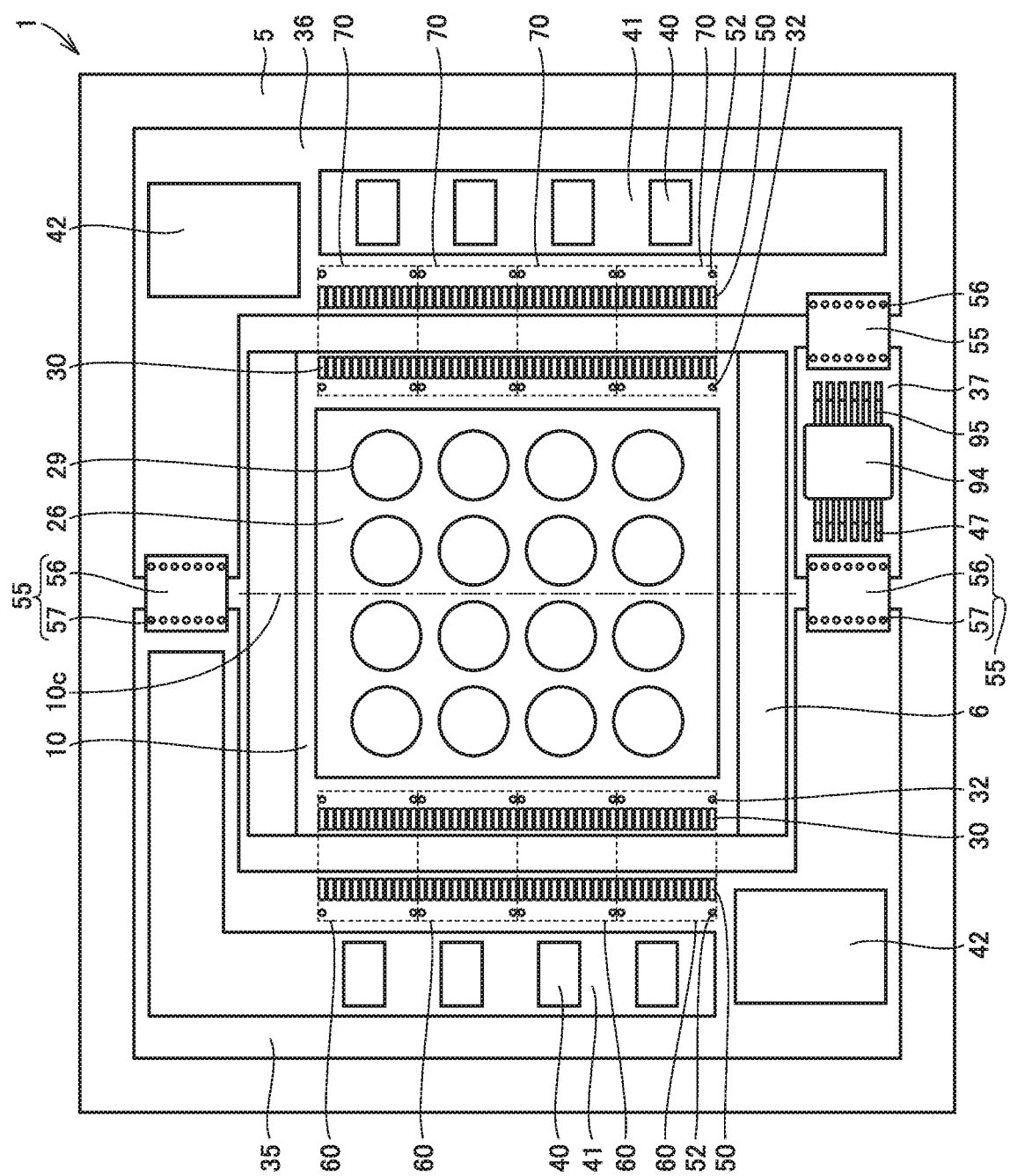
FIG. 23 is a schematic plan view of an array antenna apparatus according to Embodiment 2 of the present invention.
Figure 24:
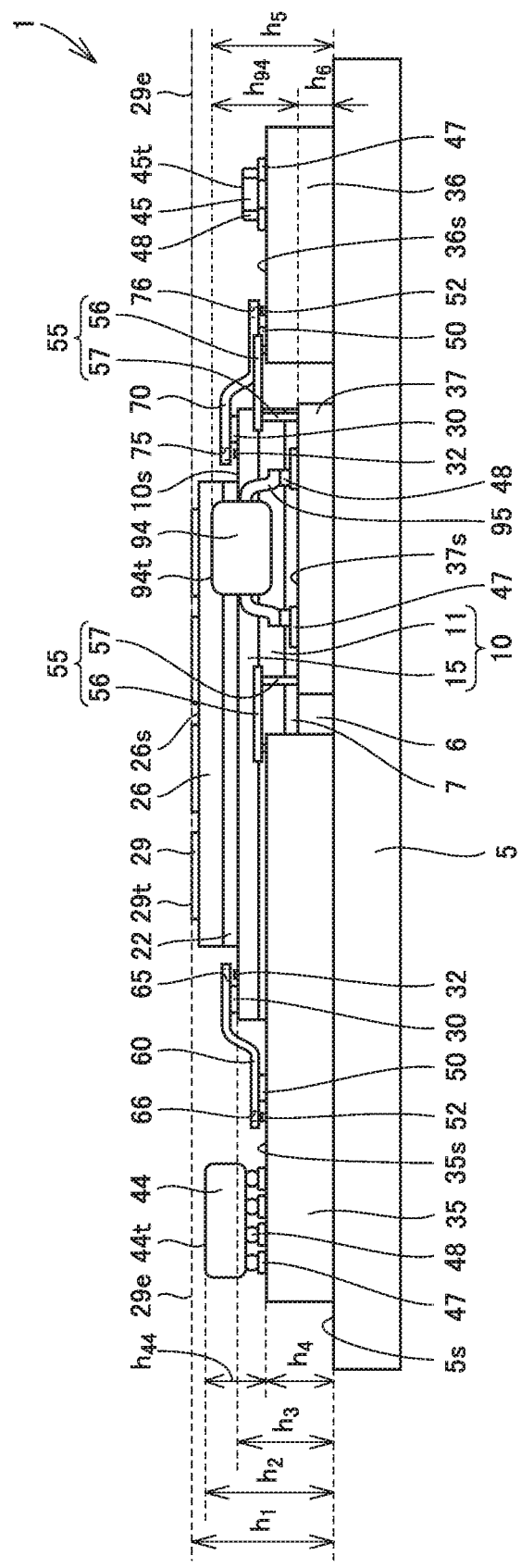
FIG. 24 is a schematic side view of the array antenna apparatus according to Embodiment 2 of the present invention.

Referring to FIGS. 23 and 24, an array antenna apparatus 1 according to Embodiment 2 will be described. Array antenna apparatus 1 according to the present embodiment has the same configuration as array antenna apparatus 1 according to Embodiment 1, and mainly differs in that array antenna apparatus 1 according to the present embodiment further includes a second external circuit board 37 and a second electronic component 94.

Second external circuit board 37 is mounted on a first primary surface 5s of a base plate 5. Second external circuit board 37 may be a printed circuit board. Second external circuit board 37 has a fifth primary surface 37s opposite the base plate 5. Second external circuit board 37 is connected to one or more first external circuit boards 35, 36, using an electrical connection member 55. Electrical connection member 55 may include, for example, a printed circuit board 56 and conductive pins 57. Electrical connection member 55 may be a flexible printed circuit, a wiring harness, or a busbar. Electrical connection member 55 may be a ribbon or a fine line, which may be composed of a conductive metallic material, such as gold (Au), copper (Cu), or aluminum (Al).

One or more electronic components (94) may be mounted on fifth primary surface 37s of second external circuit board 37. In the present embodiment, one or more electronic components (94) include second electronic component 94. Particularly, one or more electronic components (94) may be secured to conductive pads 47 on second external circuit board 37, using bonding members 48, such as solder. One or more electronic components (94) may be, but not particularly limited to, resistors, capacitors, inductors, connectors, or a semi-conductor package. Second electronic component 94 is the tallest among one or more electronic components (94) mounted on fifth primary surface 37s. Second electronic component 94 is taller than a first electronic component 44. Stated differently, a height $h_{94}$ of a second top 94t of second electronic component 94 relative to fifth primary surface 37s is greater than a height $h_{45}$ of a first top 44t of first electronic component 44 relative to second primary surface 10s.

A first height $h_1$ of top faces 29t of multiple antenna elements (non-feeding patch antenna elements 29) relative to first primary surface 5s is greater than or equal to a fifth height $h_5$ of second top 94t of second electronic component 94 relative to first primary surface 5s. Top faces 29t of the antenna elements (non-feeding patch antenna elements 29) are farther away from first primary surface 5s of base plate 5 than all the electronic components (44, 45, 94) mounted on all the external circuit boards (first external circuit board 35, 36, and second external circuit board 37) disposed around wiring board 10 are. The height of a surface 29e, extended from top faces 29t of the antenna elements (non-feeding patch antenna elements 29), relative to first primary surface 5s is greater than or equal to fifth height $h_5$ of second top 94t of second electronic component 94 relative to first primary surface 5s. A sixth height $h_6$ of fifth primary surface 37s relative to first primary surface 5s is less than a fourth height $h_4$ of fourth primary surfaces 35s, 36s relative to first primary surface 5s.

Array antenna apparatus 1 according to the present embodiment yields the following advantages effects, in addition to the advantages effects of array antenna apparatus 1 according to Embodiment 1.

Array antenna apparatus 1 according to the present embodiment further includes second external circuit board 37 and second electronic component 94. Second external circuit board 37 is mounted on first primary surface 5s. Second external circuit board 37 has fifth primary surface 37s opposite the base plate 5. Second electronic component 94 is mounted on fifth primary surface 37s. Second electronic component 94 is the tallest among one or more electronic components (94) mounted on fifth primary surface 37s. Second electronic component 94 is taller than first electronic component 44. First height $h_1$ of top face 29t of the multiple antenna elements (non-feeding patch antenna elements 29) relative to first primary surface 5s is greater than or equal to fifth height $h_5$ of second top 94t of second electronic component 94 relative to first primary surface 5s. Sixth height $h_6$ of fifth primary surface 37s relative to first primary surface 5s is less than fourth height $h_4$ of fourth primary surfaces 35s, 36s relative to first primary surface 5s.

In array antenna apparatus 1 according to the present embodiment, first height $h_1$ of top face 29t of the multiple antenna elements (non-feeding patch antenna elements 29) relative to first primary surface 5s is greater than or equal to fifth height $h_5$ of second top 94t of second electronic component 94 relative to first primary surface 5s. Due to this, electromagnetic waves transmitted and received through the antenna elements (non-feeding patch antenna elements 29) can be prevented from causing electromagnetic interference with one or more electronic components (94) on second external circuit board 37. Sixth height $h_6$ of fifth primary surface 37s relative to first primary surface 5s is less than fourth height $h_4$ of fourth primary surfaces 35s, 36s relative to first primary surface 5s. Due to this, first height $h_1$ of top face 29t of the antenna elements (non-feeding patch antenna elements 29) relative to first primary surface 5s can readily be set greater than or equal to fifth height $h_5$ of second top 94t of second electronic component 94 relative to first primary surface 5s. Array antenna apparatus 1 according to the present embodiment has good antenna characteristics.

Embodiment 3

Figure 25:
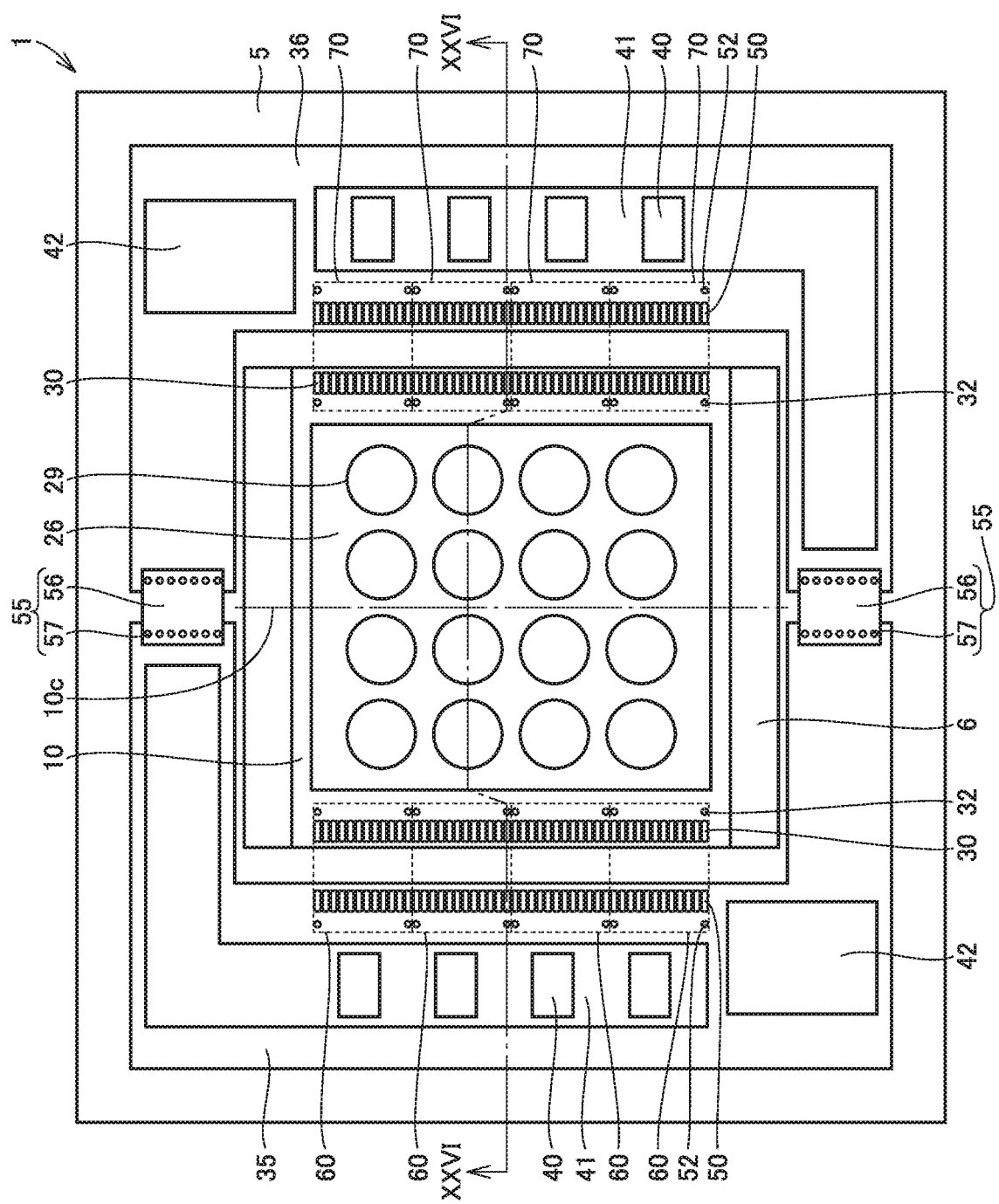
FIG. 25 is a schematic plan view of an array antenna apparatus according to Embodiment 3 of the present invention.
Figure 26:
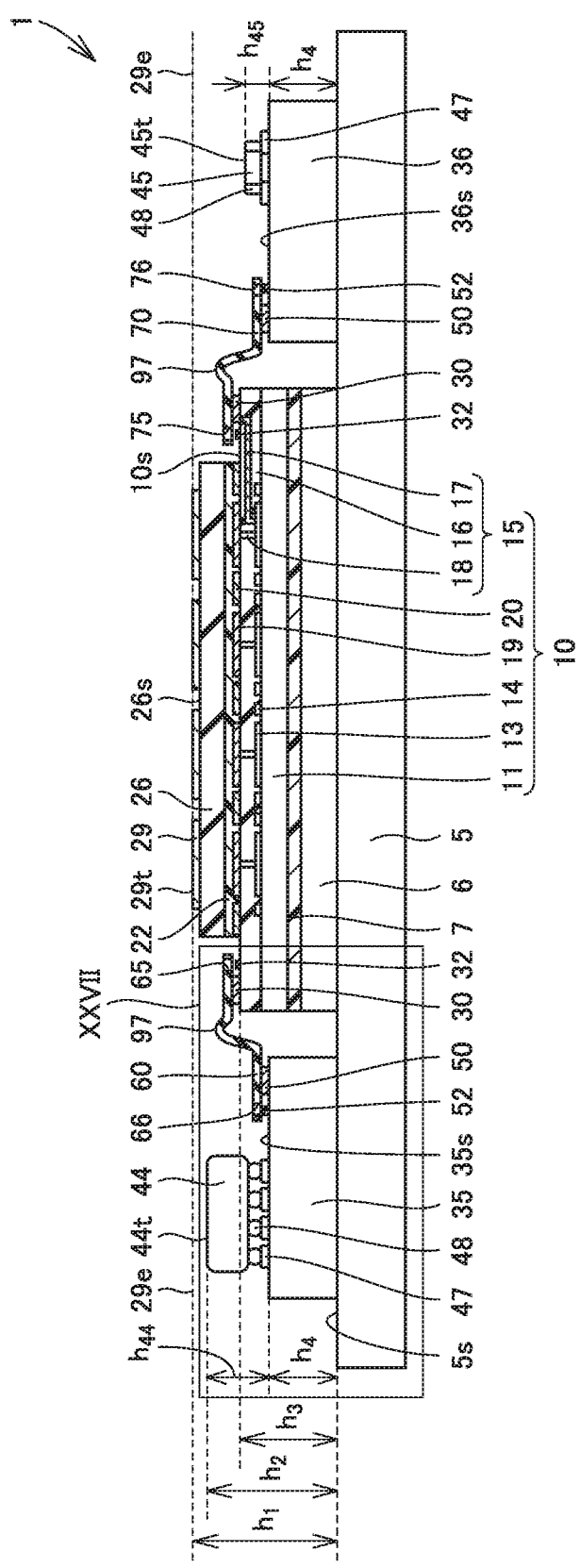
FIG. 26 is a schematic cross sectional view of the array antenna apparatus according to Embodiment 3 of the present invention, taken along a section line XXVI-XXVI shown in FIG. 25.
Figure 27:
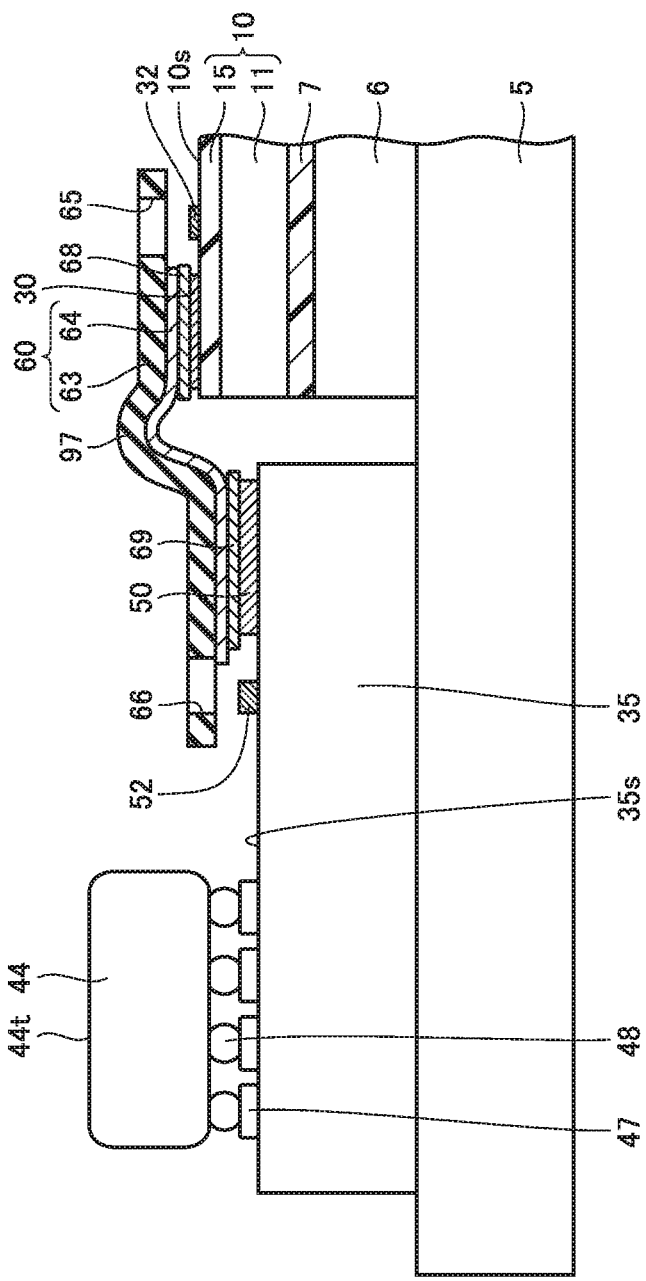
FIG. 27 is an enlarged schematic partial cross-sectional view of a region XXVII, shown in FIG. 26, of the array antenna apparatus according to Embodiment 3 of the present invention.

Referring to FIGS. 25 through 27, an array antenna apparatus 1 according to Embodiment 3 will be described. Array antenna apparatus 1 according to the present embodiment has the same configuration as array antenna apparatus 1 according to Embodiment 1, but is different mainly in the following points.

One or more flexible printed circuits 60, 70 each include a flexure 97. Flexure 97 may bulge opposite the wiring board 10. Flexure 97 has a flexure length of 0.2 mm or greater and 1.0 mm or less. The flexure length is defined as a difference between: a first distance between wiring board 10 and one or more flexible printed circuits 60, 70; and a second distance between wiring board 10 and one or more flexible printed circuits 60, 70. The first distance is defined as a distance between wiring board 10 and one or more flexible printed circuits 60, 70 when one or more flexible printed circuits 60, 70, secured to first conductive pads 30 and second conductive pads 50, has a natural length. The second distance is defined as a distance between wiring board 10 and one or more flexible printed circuits 60, 70 when one or more flexible printed circuits 60, 70 each have flexure 97.

Figure 28:
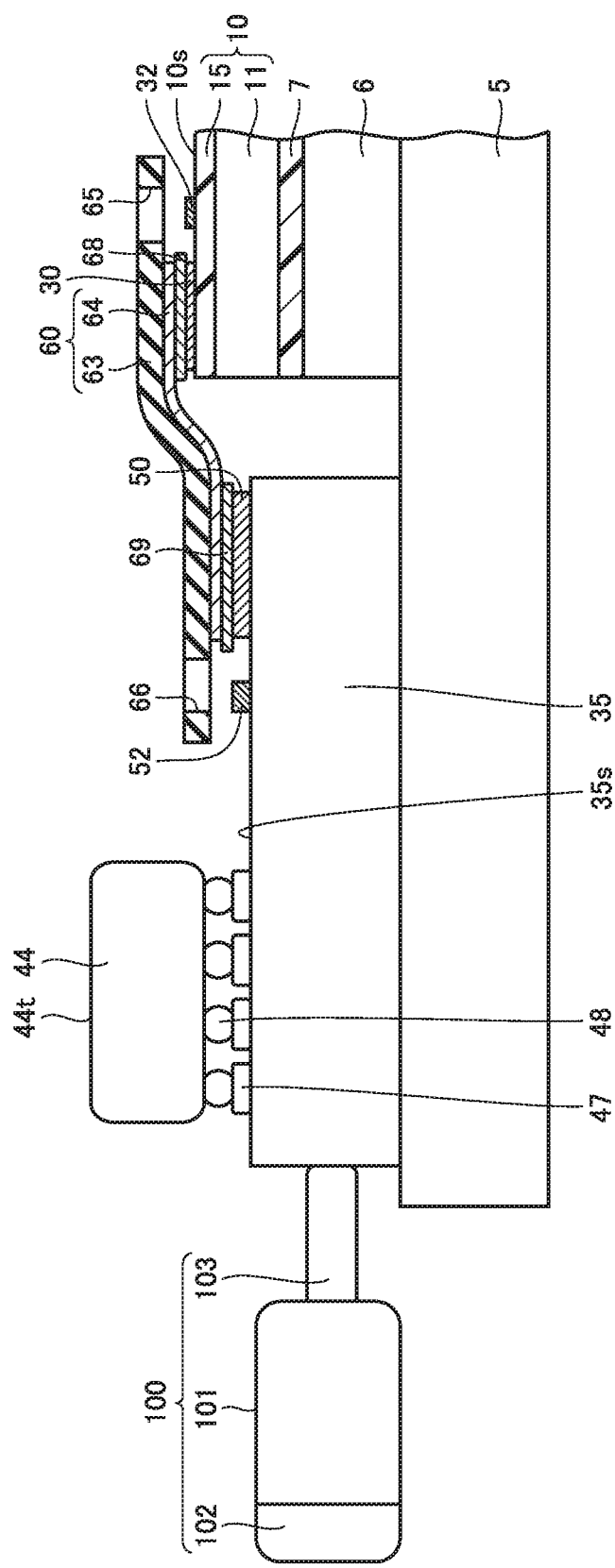
FIG. 28 is an enlarged schematic partial cross-sectional view showing one step included in a method for fabricating the array antenna apparatus according to Embodiment 3 of the present invention.
Figure 29:
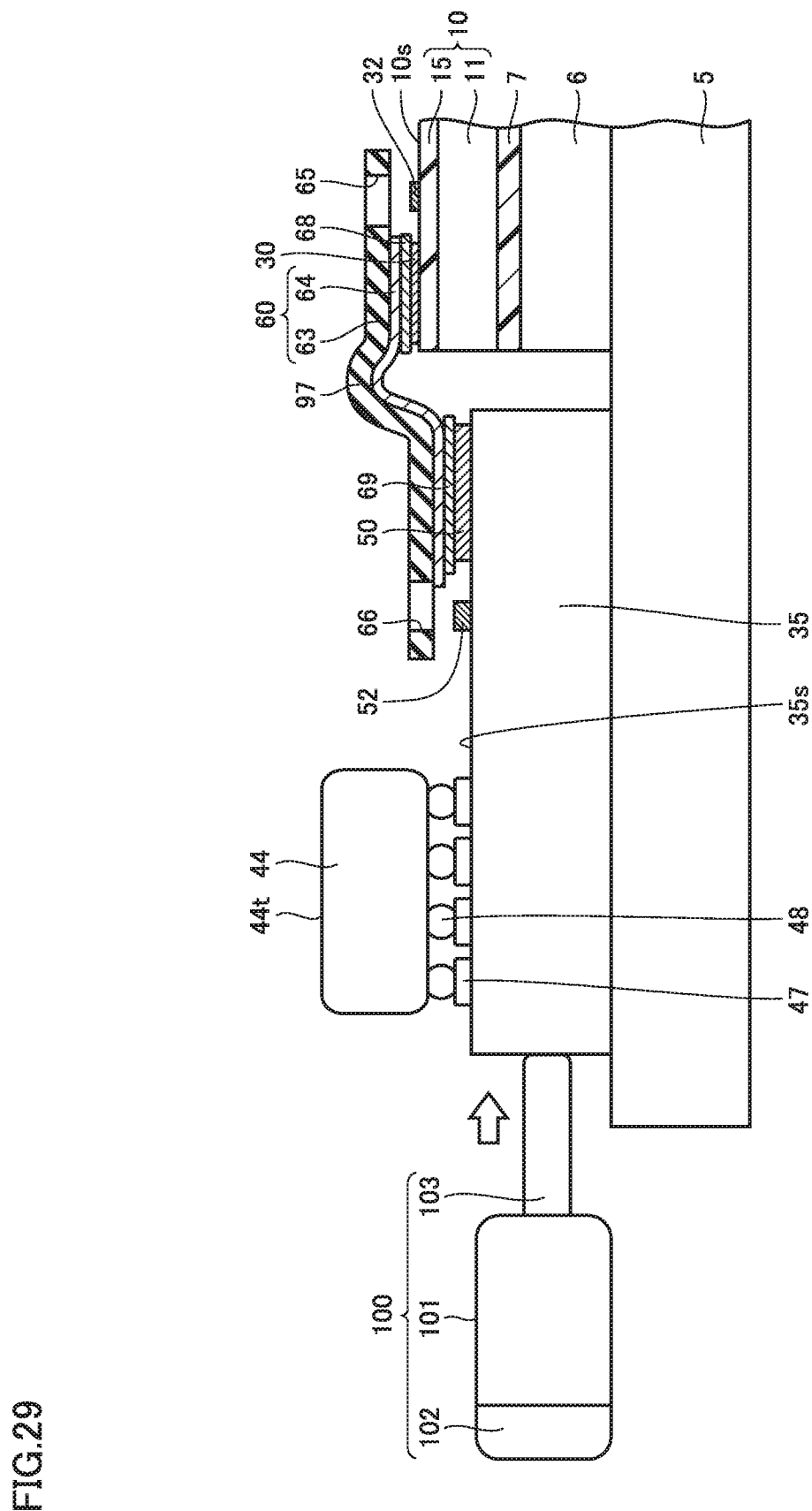
FIG. 29 is an enlarged schematic partial cross-sectional view showing a step following the step shown in FIG. 28 in the method for fabricating the array antenna apparatus according to Embodiment 3 of the present invention.

Referring to FIGS. 28 and 29, a method for fabricating array antenna apparatus 1 according to the present embodiment will be described. The method for fabricating array antenna apparatus 1 according to the present embodiment includes the same steps as those of the method for fabricating array antenna apparatus 1 according to Embodiment 1, but is different mainly in the following points.

The method for fabricating array antenna apparatus 1 according to the present embodiment further includes sliding one or more first external circuit boards 35, 36 toward wiring board 10 to form flexures 97 in one or more flexible printed circuits 60, 70. In the method for fabricating array antenna apparatus 1 according to Embodiment 1, one or more first external circuit boards 35, 36 may be slid toward wiring board 10 after adhering one or more flexible printed circuits 60, 70 to fourth primary surfaces 35s, 36s of one or more first external circuit boards 35, 36, respectively, as shown in FIG. 21. A slide jig 100 may be used to slide one or more first external circuit boards 35, 36 toward wiring board 10. Slide jig 100 may include a jig body 101, a rotatable knob 102 provide on one end of jig body 101, and a bar member 103 provided on the other side of jig body 101, bar member 103 being extendable from jig body 101. An amount of extension of bar member 103 from jig body 101 can be adjusted according to an amount of rotation of knob 102.

In FIG. 28, one or more flexible printed circuits 60, 70 have a natural length. The distance between wiring board 10 and one or more flexible printed circuits 60, 70 in FIG. 28 is the first distance. Bar member 103 of slide jig 100 is brought into contact with side faces of one or more first external circuit boards 35, 36. Knob 102 is rotated as shown in FIG. 29, and bar member 103 moves one or more first external circuit boards 35, 36 toward wiring board 10. In this manner, flexures 97 are formed in one or more flexible printed circuits 60, 70 connecting one or more first external circuit boards 35, 36 and wiring board 10. The distance between wiring board 10 and one or more flexible printed circuits 60, 70 in FIG. 29 is the second distance. The flexure length of one or more flexible printed circuits 60, 70 can be given as the sliding distance of one or more first external circuit boards 35, 36.

Array antenna apparatus 1 according to the present embodiment yields the following advantages effects, in addition to the advantages effects of array antenna apparatus 1 according to Embodiment 1.

In array antenna apparatus 1 according to the present embodiment, one or more flexible printed circuits 60, 70 each include a flexure 97. As array antenna apparatus 1 is exposed to temperature changes, thermal stress may be applied to the joint, by first anisotropic conductive member 68, between one or more flexible printed circuits 60, 70 and wiring board 10, and the joint, by second anisotropic conductive member 69, between one or more flexible printed circuits 60, 70 and one or more first external circuit boards 35, 36. Flexures 97 can alleviate the thermal stress, thereby preventing the joint, by first anisotropic conductive member 68, between one or more flexible printed circuits 60, 70 and wiring board 10, and the joint, by second anisotropic conductive member 69, between one or more flexible printed circuits 60, 70 and one or more first external circuit boards 35, 36 from being destroyed. Array antenna apparatus 1 according to the present embodiment has good antenna characteristics.

In array antenna apparatus 1 according to the present embodiment, flexure 97 has a flexure length of 0.2 mm or greater and 1.0 mm or less. Since flexure 97 has a flexure length of 0.2 mm or greater, flexure 97 can further prevent the joint, by first anisotropic conductive member 68, between one or more flexible printed circuits 60, 70 and wiring board 10 from being destroyed. Since flexure 97 has a flexure length of 1.0 mm or less, flexure 97 can be prevented from having an excessively small radius of curvature. Due to this, one or more traces 64, 74 can be prevented from breaking at flexures 97. Array antenna apparatus 1 according to the present embodiment has good antenna characteristics.

Embodiment 4

Referring to FIGS. 30 through 36, a method for fabricating array antenna apparatus 1 according to Embodiment 4 will be described. The method for fabricating array antenna apparatus 1 according to the present embodiment is another method for fabricating array antenna apparatus 1 according to Embodiment 3. In the method for fabricating array antenna apparatus 1 according to the present embodiment, initially, flexures 97 are formed in one or more flexible printed circuits 60, 70. One or more flexible printed circuits 60, 70 having flexures 97 are then secured to a wiring board 10 and one or more first external circuit boards 35, 36.

Figure 30:
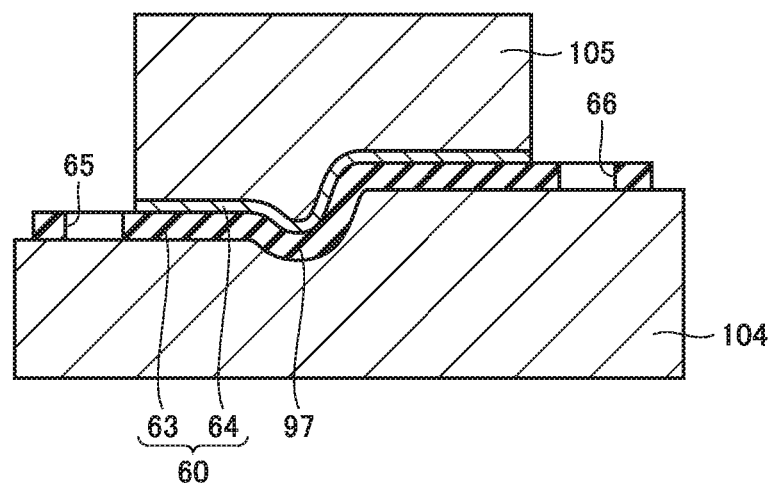
FIG. 30 is a schematic cross sectional view showing one step included in a method for fabricating the array antenna apparatus according to Embodiment 4 of the present invention.

Referring to FIG. 30, the method for fabricating array antenna apparatus 1 according to the present embodiment includes forming flexures 97 in one or more flexible printed circuits 60, 70. For example, flexures 97 may be formed in one or more flexible printed circuits 60, 70 by applying pressure and heat to one or more flexible printed circuits 60, 70, using a pair of molds 104 and 105. At least one of molds 104 and 105 includes a heater. Mold 104 may have a recess, and mold 105 may have a protrusion. Flexures 97 are formed in portions, of one or more flexible printed circuits 60, 70, which are put between the recess of mold 104 and the protrusion of mold 105.

Figure 31:
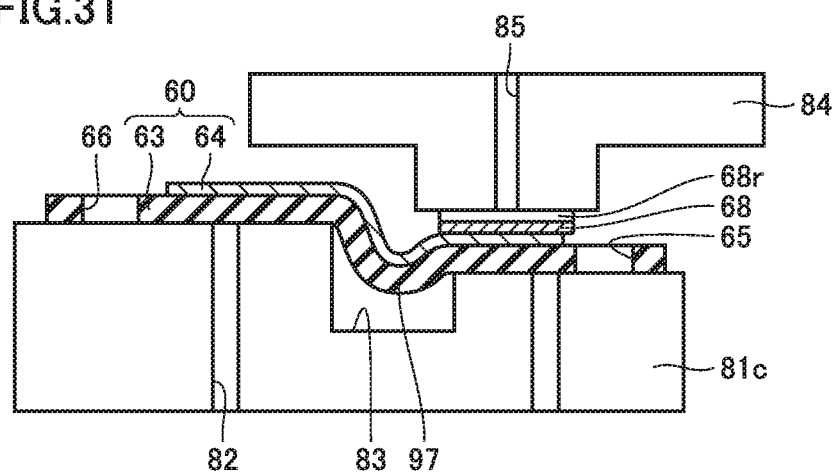
FIG. 31 is a schematic cross sectional view showing a step following the step shown in FIG. 30 in the method for fabricating the array antenna apparatus according to Embodiment 4 of the present invention.

Referring to FIG. 31, the method for fabricating array antenna apparatus 1 according to the present embodiment may include temporarily adhering first anisotropic conductive member 68 to one or more flexible printed circuits 60, 70 each having flexure 97 formed therein. Temporarily adhering first anisotropic conductive member 68 to one or more flexible printed circuits 60, 70 in the present embodiment is the same as temporarily adhering first anisotropic conductive member 68 to one or more flexible printed circuits 60, 70 in Embodiment 1. Stage 81 according to the present embodiment has a recess 83 for receiving flexure 97.

Figure 32:
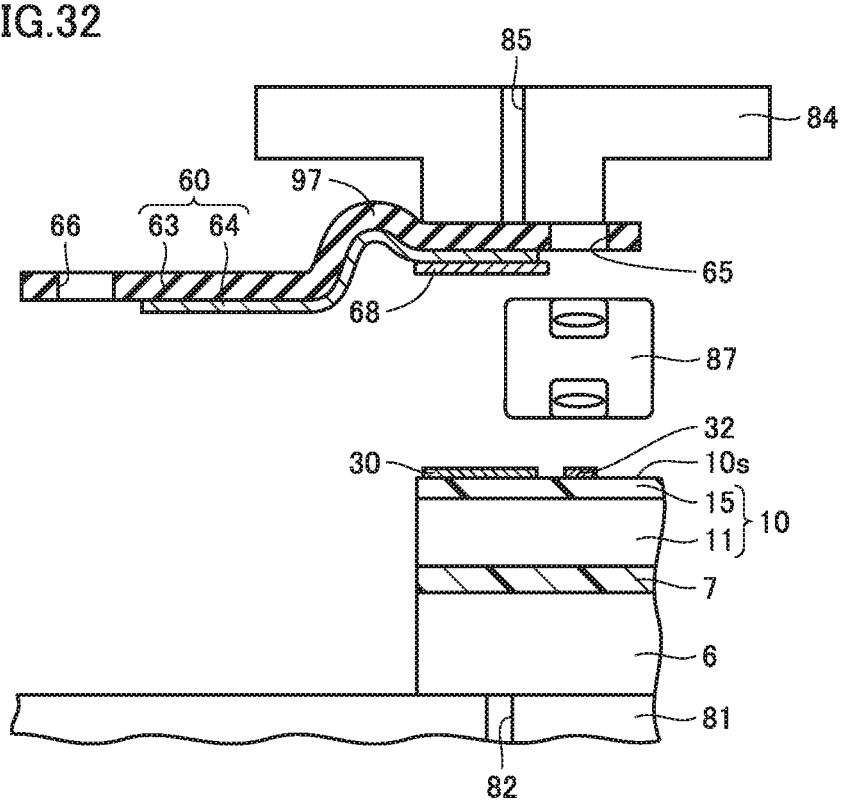
FIG. 32 is an enlarged schematic partial cross-sectional view showing a step following the step shown in FIG. 31 in the method for fabricating the array antenna apparatus according to Embodiment 4 of the present invention.

Referring to FIG. 32, the method for fabricating array antenna apparatus 1 according to the present embodiment includes aligning one or more flexible printed circuits 60, 70 with wiring board 10. Aligning one or more flexible printed circuits 60, 70 with wiring board 10 in the present embodiment is the same as aligning one or more flexible printed circuits 60, 70 with wiring board 10 in Embodiment 1.

Figure 33:
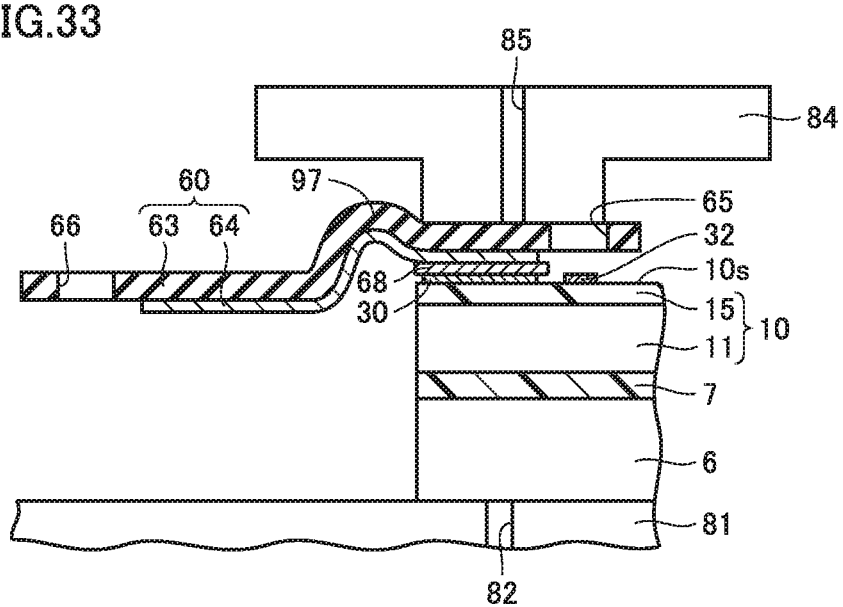
FIG. 33 is an enlarged schematic partial cross-sectional view showing a step following the step shown in FIG. 32 in the method for fabricating the array antenna apparatus according to Embodiment 4 of the present invention.

Referring to FIG. 33, the method for fabricating array antenna apparatus 1 according to the present embodiment includes adhering one or more flexible printed circuits 60, 70 to second primary surface 10s of wiring board 10 via first anisotropic conductive member 68. Adhering one or more flexible printed circuits 60, 70 to second primary surface 10s of wiring board 10 in the present embodiment is the same as adhering one or more flexible printed circuits 60, 70 to second primary surface 10s of wiring board 10 in Embodiment 1.

The method for fabricating array antenna apparatus 1 according to the present embodiment may further include the following steps between aligning (see FIG. 32) one or more flexible printed circuits 60, 70 with wiring board 10 and adhering (see FIG. 33) one or more flexible printed circuits 60, 70 to second primary surface 10s of wiring board 10, as with the method for fabricating array antenna apparatus 1 according to Embodiment 1. After temporarily adhering one or more flexible printed circuits 60, 70 to second primary surface 10s of wiring board 10 and temporarily adhering one or more flexible printed circuits 60, 70 to wiring board 10, the method for fabricating array antenna apparatus 1 according to the present embodiment may further include ascertaining whether one or more flexible printed circuits 60, 70 are properly aligned with wiring board 10.

Figure 34:
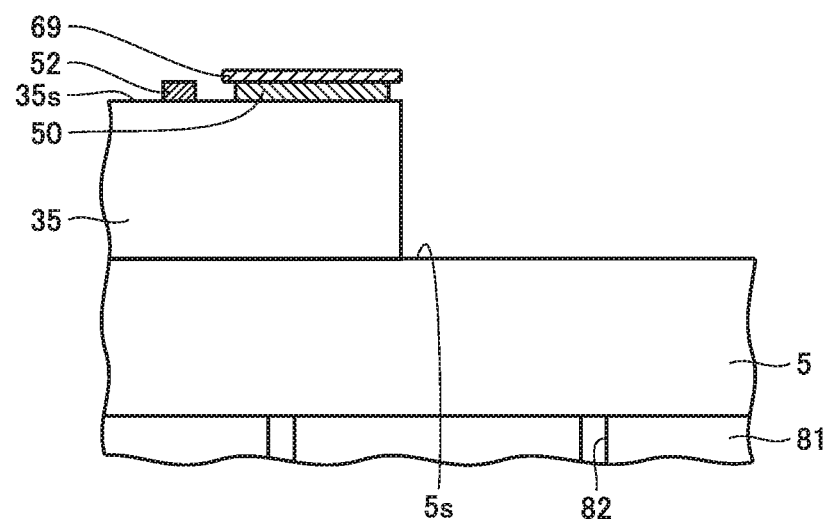
FIG. 34 is an enlarged schematic partial cross-sectional view showing a step following the step shown in FIG. 33 in the method for fabricating the array antenna apparatus according to Embodiment 4 of the present invention.

As shown in FIG. 34, the method for fabricating array antenna apparatus 1 according to the present embodiment includes providing second anisotropic conductive member 69 on one or more first external circuit boards 35, 36. Providing second anisotropic conductive member 69 on one or more first external circuit boards 35, 36 in the present embodiment is the same as providing second anisotropic conductive member 69 on one or more first external circuit boards 35, 36 in Embodiment 1.

Figure 35:
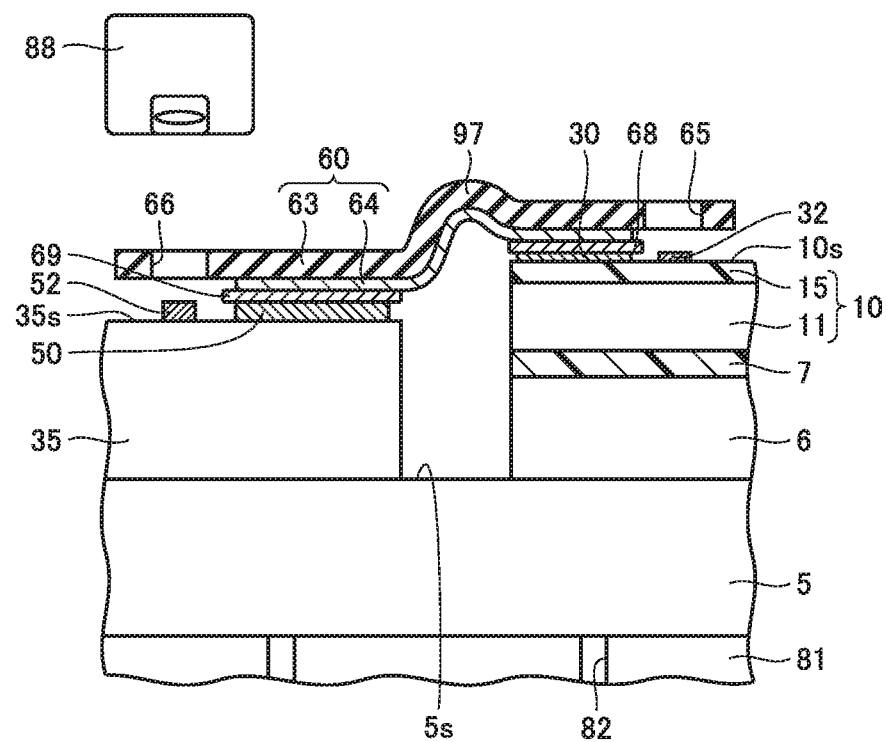
FIG. 35 is an enlarged schematic partial cross-sectional view showing a step following the step shown in FIG. 34 in the method for fabricating the array antenna apparatus according to Embodiment 4 of the present invention.

Referring to FIG. 35, the method for fabricating array antenna apparatus 1 according to the present embodiment includes aligning one or more flexible printed circuits 60, 70 with one or more first external circuit boards 35, 36. Aligning one or more flexible printed circuits 60, 70 with one or more first external circuit boards 35, 36 in the present embodiment is the same as aligning one or more flexible printed circuits 60, 70 with one or more first external circuit boards 35, 36 in Embodiment 1.

Figure 36:
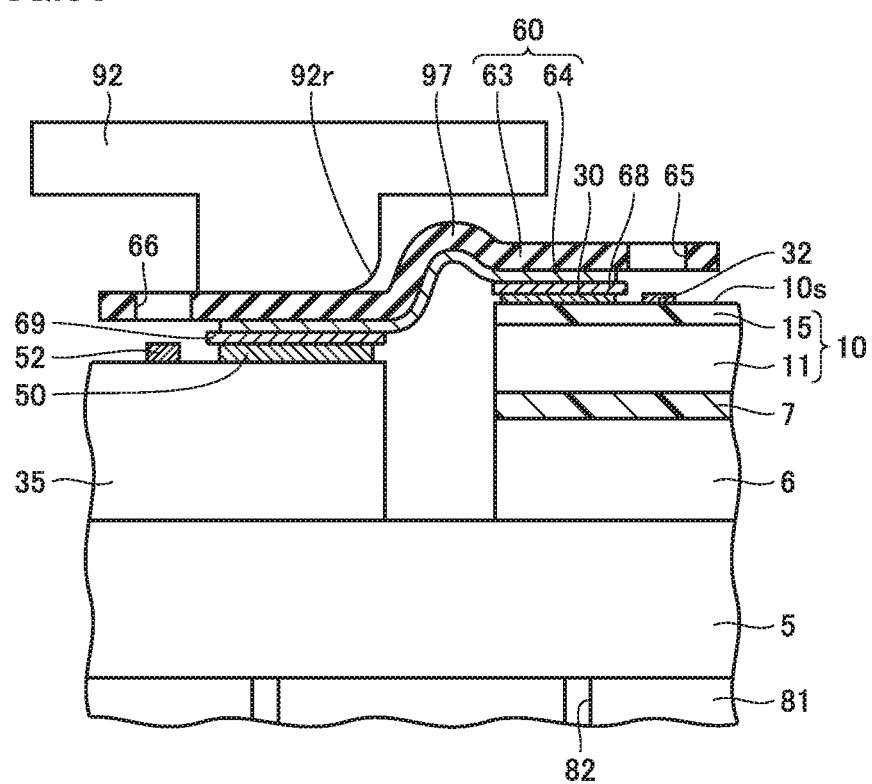
FIG. 36 is an enlarged schematic partial cross-sectional view showing a step following the step shown in FIG. 35 in the method for fabricating the array antenna apparatus according to Embodiment 4 of the present invention.

Referring to FIG. 36, the method for fabricating array antenna apparatus 1 according to the present embodiment includes adhering one or more flexible printed circuits 60, 70 to fourth primary surfaces 35s, 36s of one or more first external circuit boards 35, 36, respectively, via second anisotropic conductive member 69. Adhering one or more flexible printed circuits 60, 70 to fourth primary surfaces 35s, 36s of one or more first external circuit boards 35, 36, respectively, in the present embodiment is the same as adhering one or more flexible printed circuits 60, 70 to fourth primary surfaces 35s, 36s of one or more first external circuit boards 35, 36, respectively, in Embodiment 1.

After aligning (see FIG. 35) one or more flexible printed circuits 60, 70 with wiring board 10 and adhering (see FIG. 36) one or more flexible printed circuits 60, 70 to fourth primary surfaces 35s, 36s of one or more first external circuit boards 35, 36, respectively, the method for fabricating array antenna apparatus 1 according to the present embodiment may further include the following steps. After temporarily adhering one or more flexible printed circuits 60, 70 to fourth primary surfaces 35s, 36s of one or more first external circuit boards 35, 36, respectively, and temporarily adhering one or more flexible printed circuits 60, 70 to one or more first external circuit boards 35, 36, respectively, the method for fabricating array antenna apparatus 1 according to the present embodiment may further include ascertaining whether one or more flexible printed circuits 60, 70 are properly aligned with one or more first external circuit boards 35, 36, respectively.

The method for fabricating array antenna apparatus 1 according to the present embodiment yields the following advantages effects, in addition to the advantages effects of the method for fabricating array antenna apparatus 1 according to Embodiment 3.

Before adhering one or more flexible printed circuits 60, 70 to second primary surface 10s of wiring board 10 and adhering one or more flexible printed circuits 60, 70 to fourth primary surfaces 35s, 36s of one or more first external circuit boards 35, 36, respectively, the method for fabricating array antenna apparatus 1 according to the present embodiment includes forming flexure 97 on one or more flexible printed circuits 60, 70. The method for fabricating array antenna apparatus 1 according to the present embodiment does not include sliding one or more first external circuit boards 35, 36 toward wiring board 10, which is included in the method for fabricating array antenna apparatus 1 according to Embodiment 3. According to the method for fabricating array antenna apparatus 1 of the present embodiment, a stress can be prevented from being applied to: the joint, by first anisotropic conductive member 68, between one or more flexible printed circuits 60, 70 and wiring board 10; and the joint, by second anisotropic conductive member 69, between one or more flexible printed circuits 60, 70 and one or more first external circuit boards 35, 36. Array antenna apparatus 1 according to the present embodiment has good antenna characteristics.

In contrast, in the method for fabricating array antenna apparatus 1 according to Embodiment 3, when sliding one or more first external circuit boards 35, 36 toward wiring board 10, a stress may be applied to the joint, by first anisotropic conductive member 68, between one or more flexible printed circuits 60, 70 and wiring board 10 and the joint, by second anisotropic conductive member 69, between one or more flexible printed circuits 60, 70 and one or more first external circuit boards 35, 36.

Embodiment 5

Figure 37:
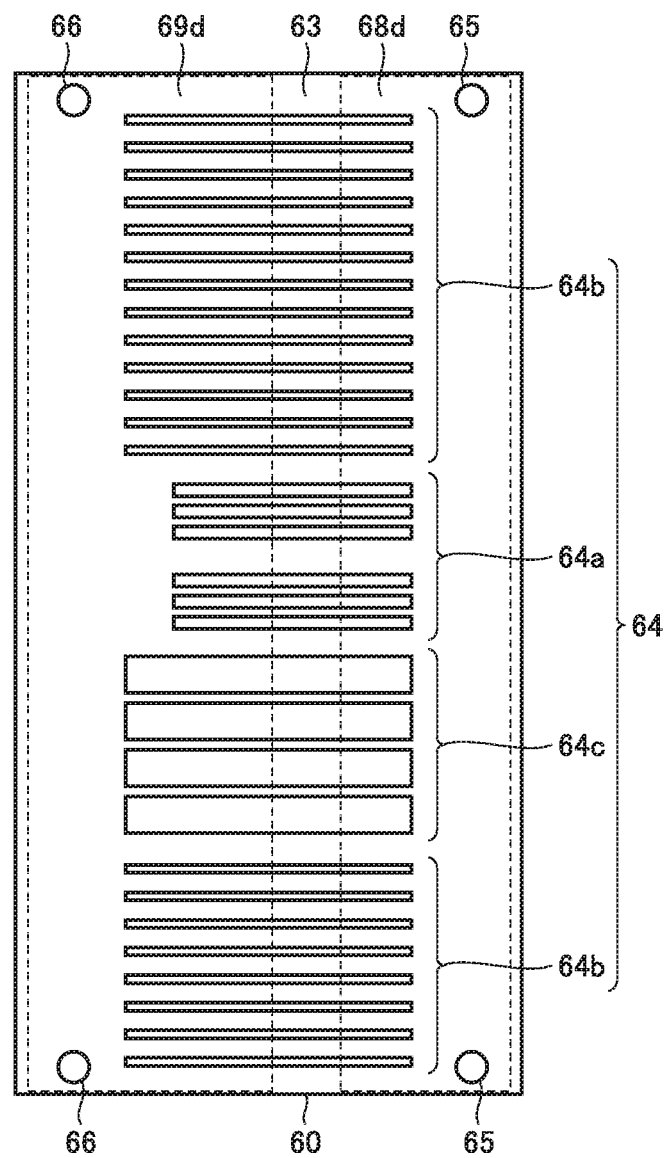
FIG. 37 is a schematic plan view of a flexible printed circuit included in an array antenna apparatus according to Embodiment 5 of the present invention.
Figure 38:
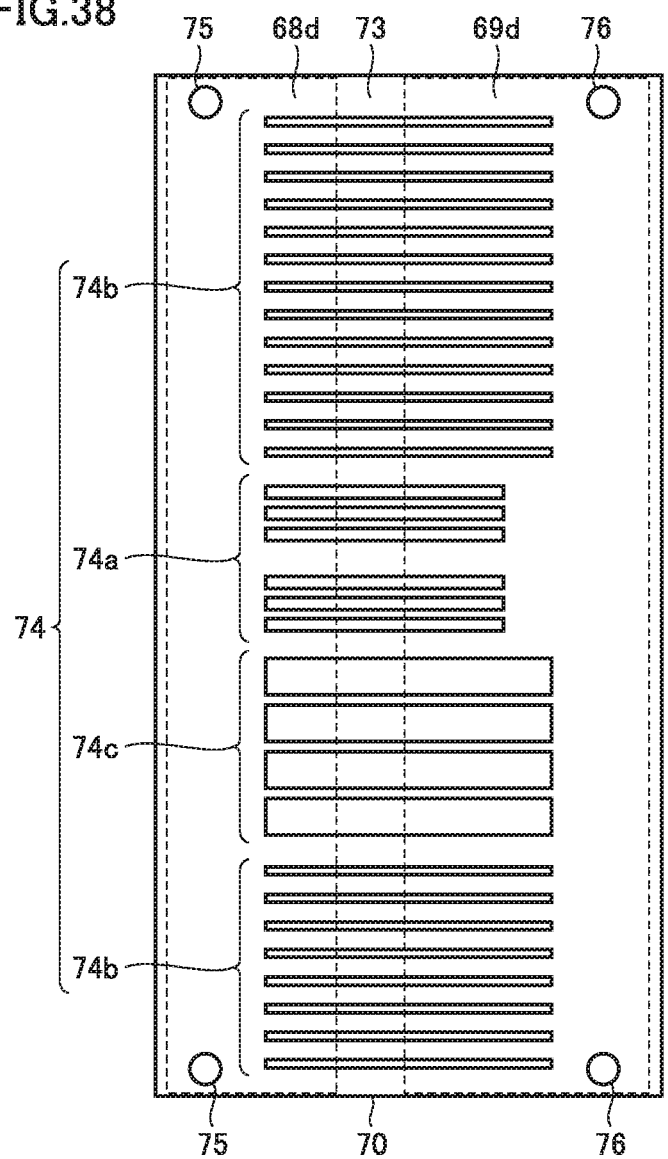
FIG. 38 is a schematic plan view of a flexible printed circuit included in the array antenna apparatus according to Embodiment 5 of the present invention.

Referring to FIGS. 37 and 38, an array antenna apparatus 1 according to Embodiment 5 will be described. Array antenna apparatus 1 according to the present embodiment has the same configuration and yields the same advantages effects as those of array antenna apparatus 1 according to Embodiment 1, but is different mainly in the following points.

As shown in FIG. 37, a first anisotropic conductive member 68d is formed also on portions of a base film 63, 73 around first through-holes 65, 75. Due to this, the strength of the joint, by a first anisotropic conductive member 68d, between one or more flexible printed circuits 60, 70 and a wiring board 10 can be enhanced. The reliability of the joint, by first anisotropic conductive member 68d, between one or more flexible printed circuits 60, 70 and wiring board 10 can be enhanced.

As shown in FIG. 37, second anisotropic conductive member 69d is formed also on portions of a base film 63, 73 around second through-holes 66, 76. Due to this, the strength of the joint, by second anisotropic conductive member 69d, between one or more flexible printed circuits 60, 70 and one or more first external circuit boards 35, 36 can be enhanced. The reliability of the joint, by second anisotropic conductive member 69d, between one or more flexible printed circuits 60, 70 and one or more first external circuit boards 35, 36 can be enhanced.

Embodiment 6

Figure 39:
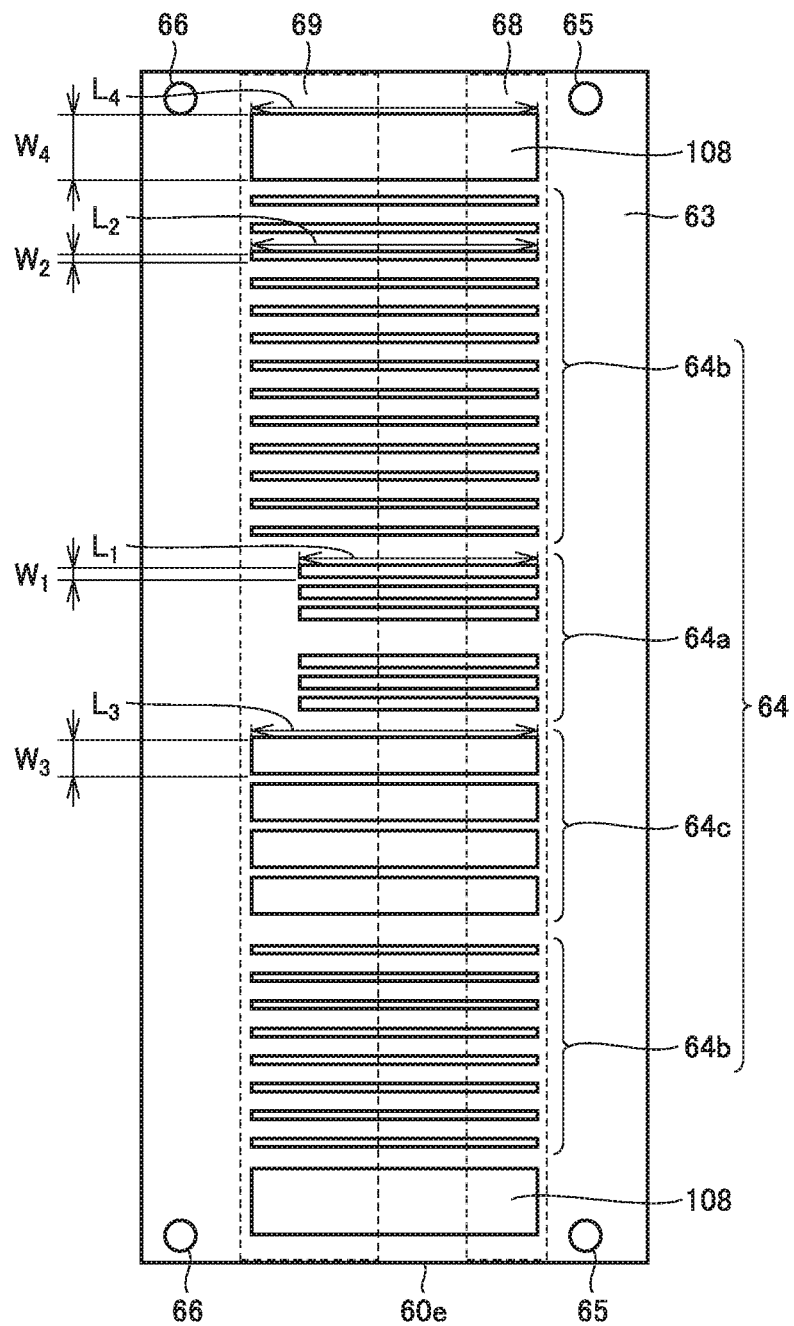
FIG. 39 is a schematic plan view of a flexible printed circuit included in the array antenna apparatus according to Embodiment 6 of the present invention.
Figure 40:
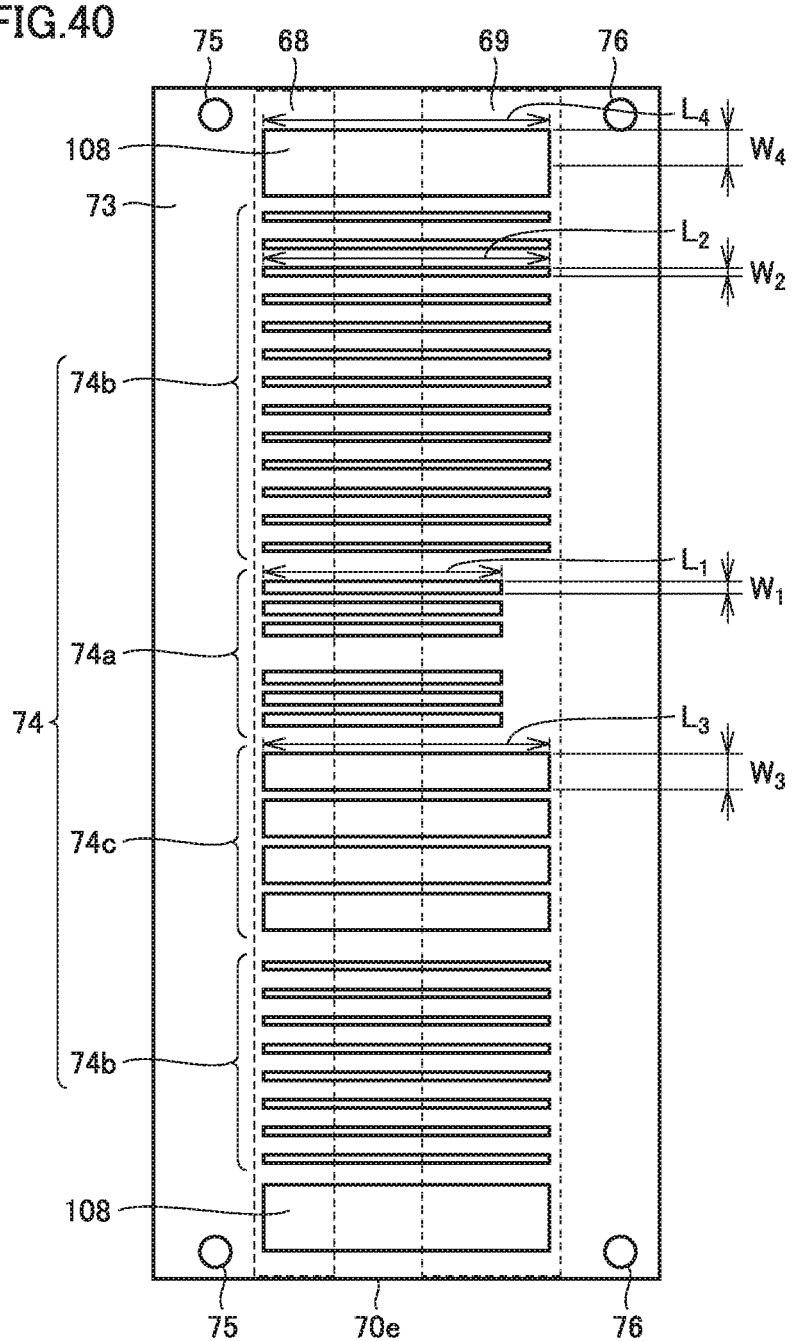
FIG. 40 is a schematic plan view of a flexible printed circuit included in the array antenna apparatus according to Embodiment 6 of the present invention.
Figure 41:
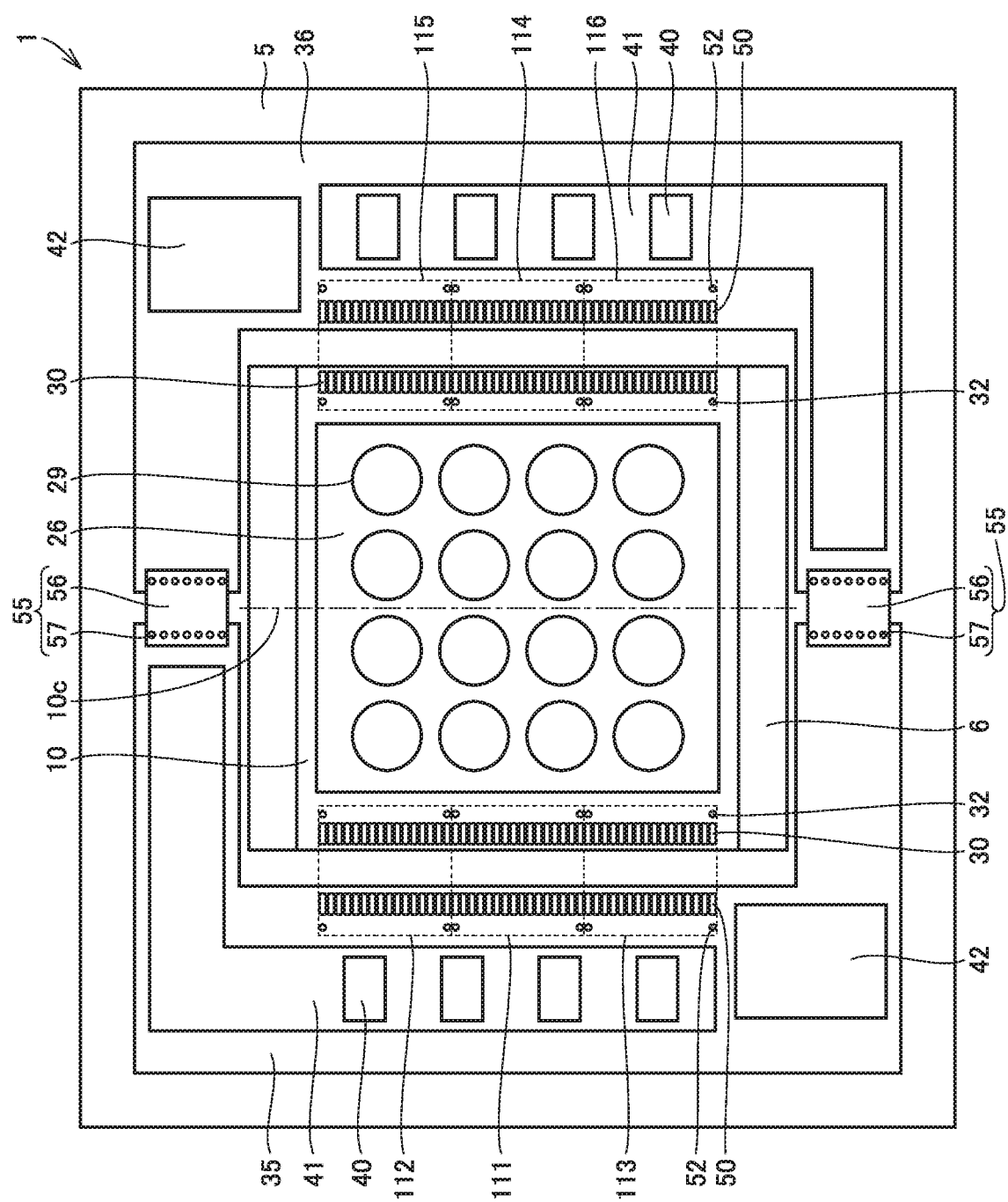
FIG. 41 is a schematic plan view of an array antenna apparatus according to Embodiment 7 of the present invention.
Figure 42:
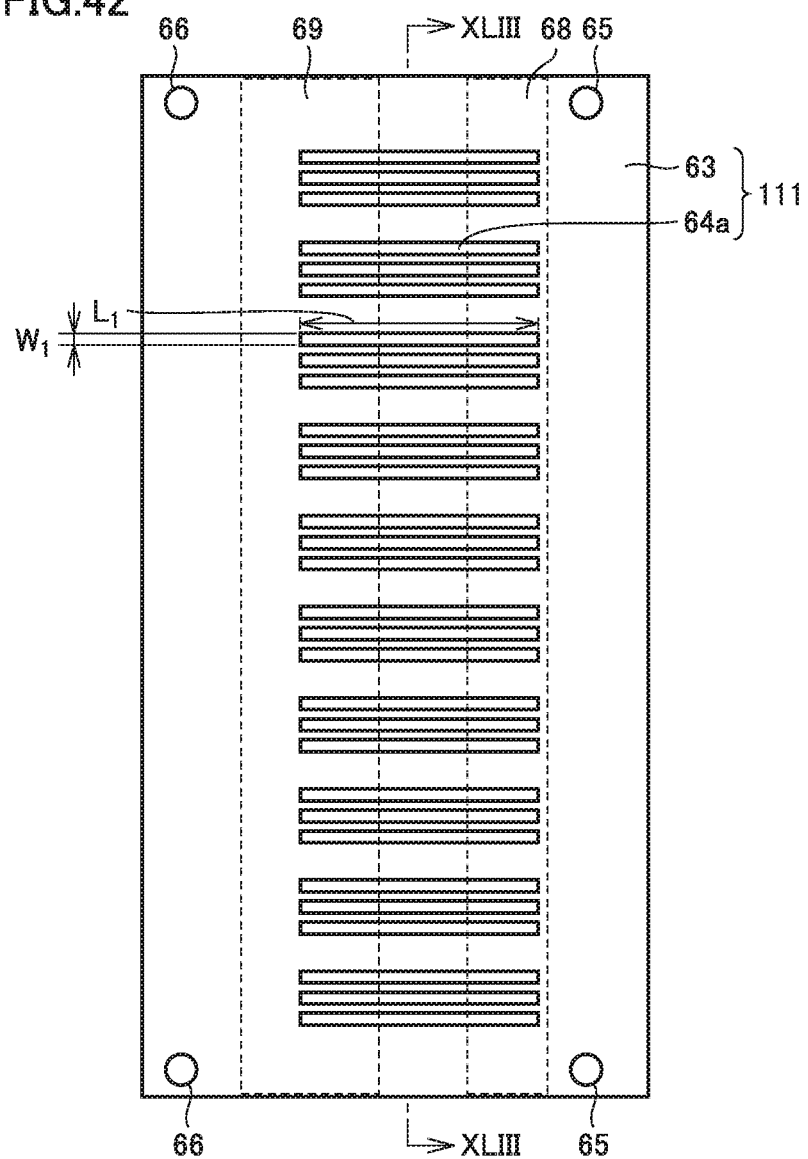
FIG. 42 is a schematic plan view of a first flexible printed circuit included in the array antenna apparatus according to Embodiment 7 of the present invention.
Figure 43:
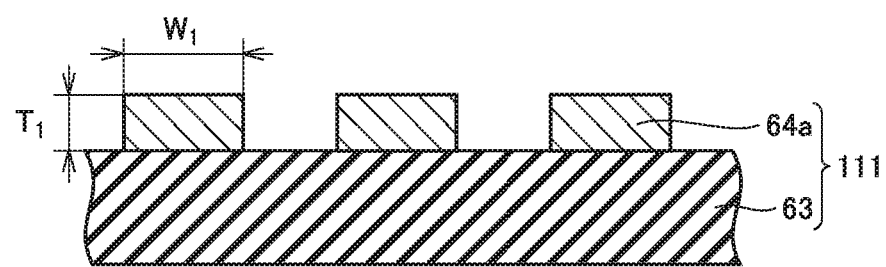
FIG. 43 is an enlarged schematic partial cross-sectional view of the first flexible printed circuit included in the array antenna apparatus according to Embodiment 7 of the present invention, taken along a section line XLIII-XLIII shown in FIG. 42.
Figure 44:
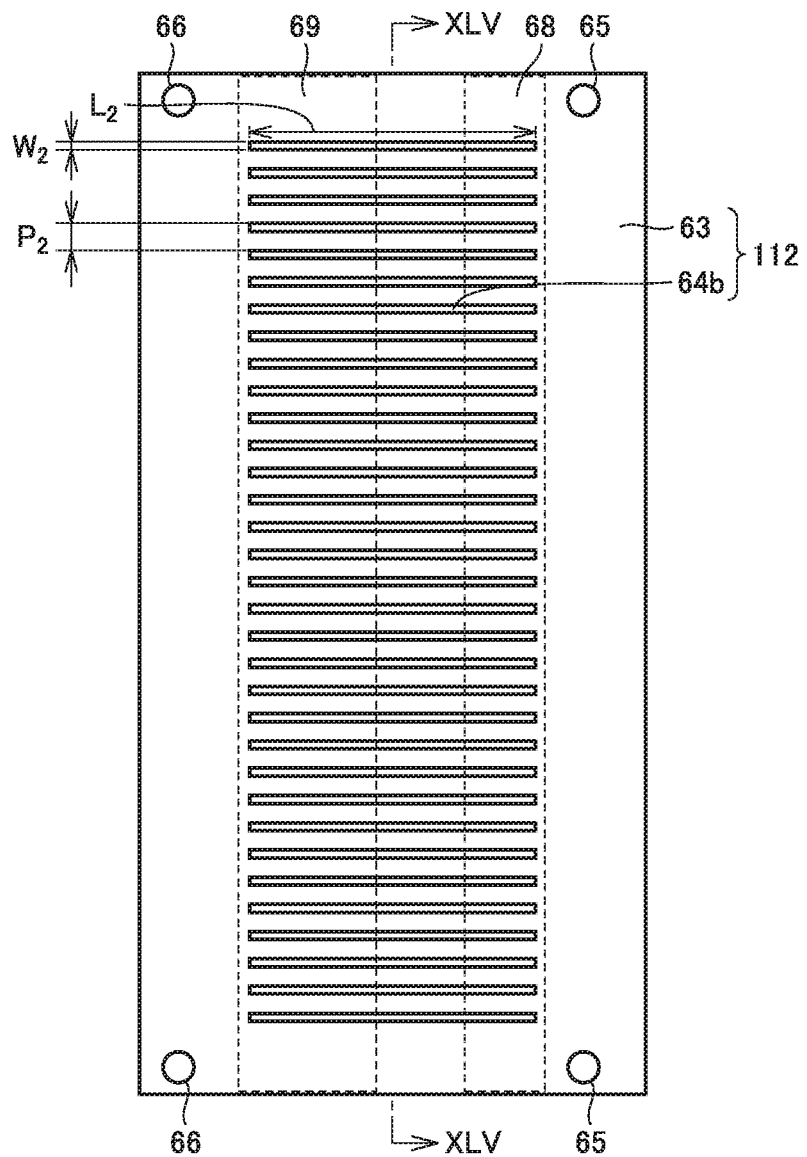
FIG. 44 is a schematic plan view of a second flexible printed circuit included in the array antenna apparatus according to Embodiment 7 of the present invention.
Figure 45:
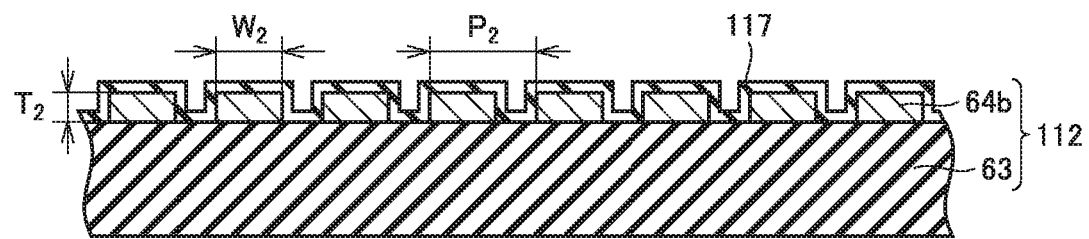
FIG. 45 is an enlarged schematic partial cross-sectional view of the second flexible printed circuit included in the array antenna apparatus according to Embodiment 7 of the present invention, taken along a section line XLV-XLV shown in FIG. 44.
Figure 46:
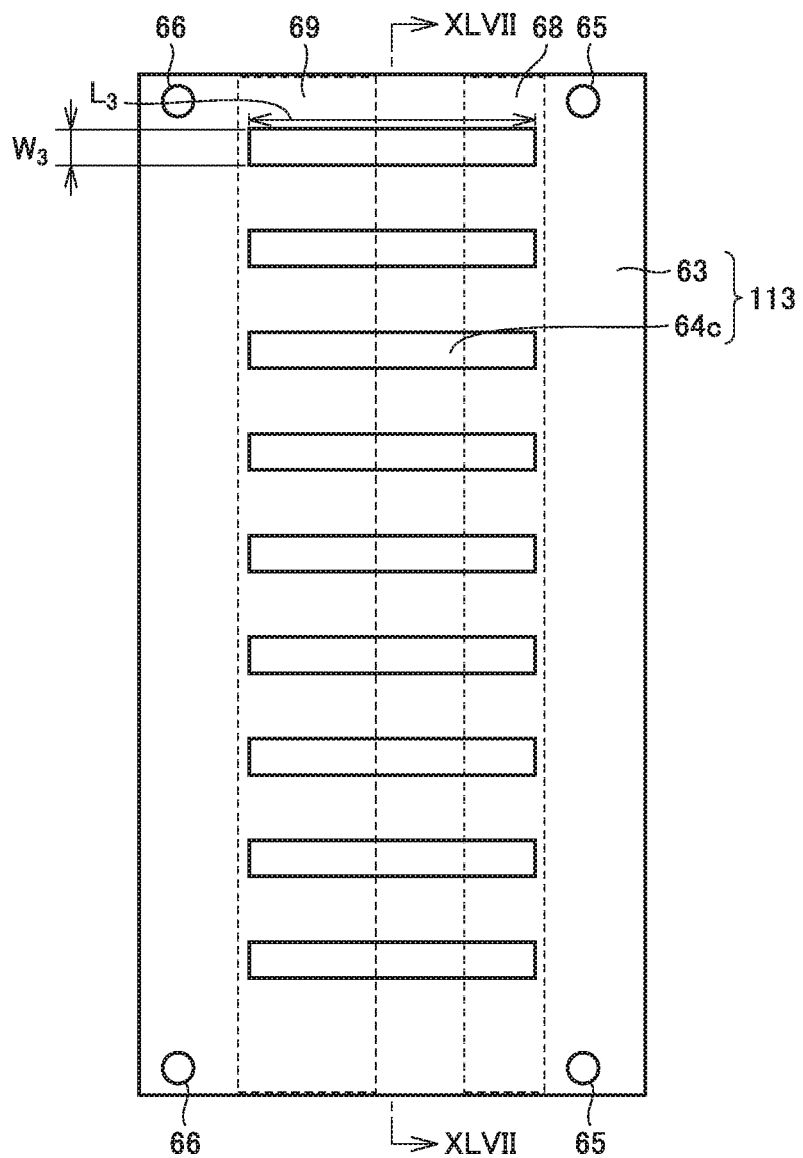
FIG. 46 is a schematic plan view of a third flexible printed circuit included in the array antenna apparatus according to Embodiment 7 of the present invention.
Figure 47:
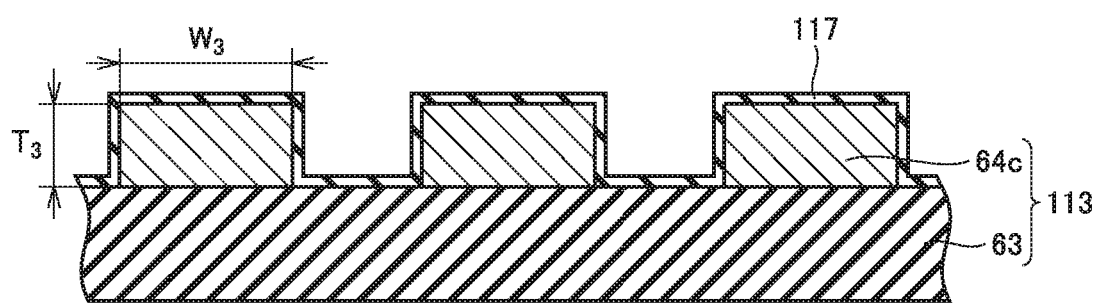
FIG. 47 is an enlarged schematic partial cross-sectional view of the third flexible printed circuit included in the array antenna apparatus according to Embodiment 7 of the present invention, taken along a section line XLVII-XLVII shown in FIG. 46.
Figure 48:
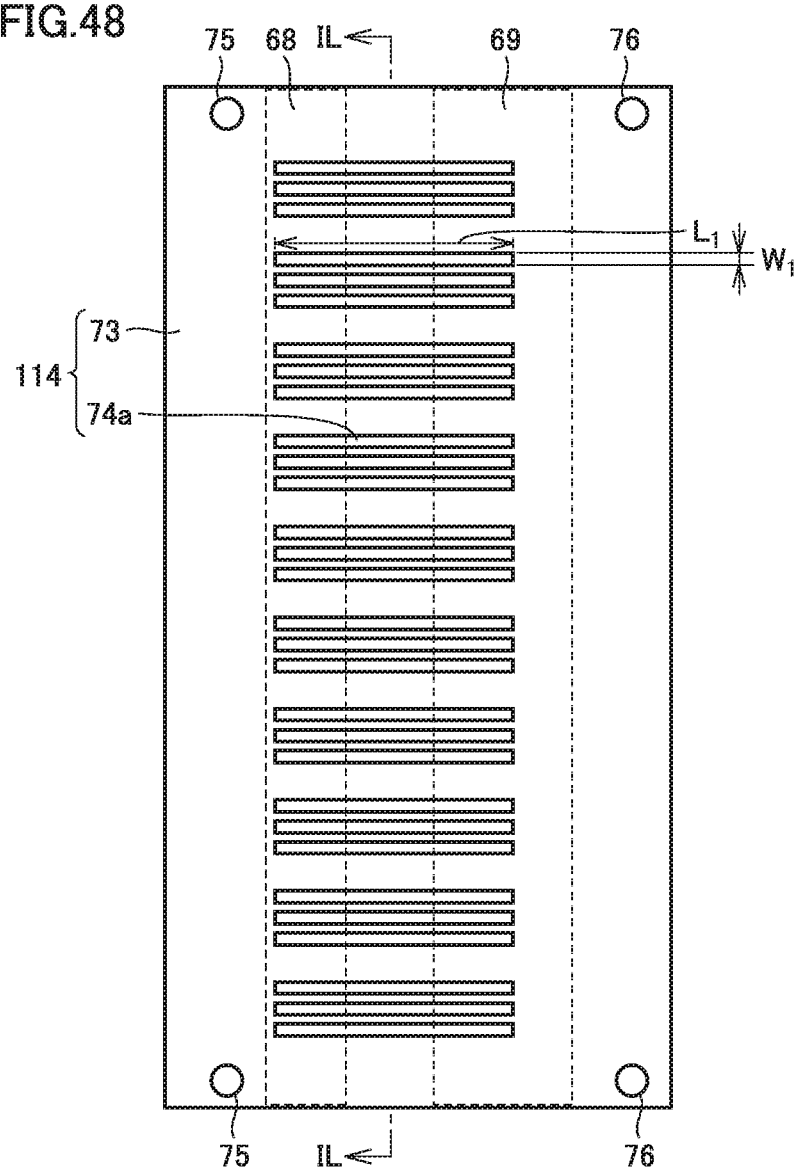
FIG. 48 is a schematic plan view of a first flexible printed circuit included in the array antenna apparatus according to Embodiment 7 of the present invention.
Figure 49:
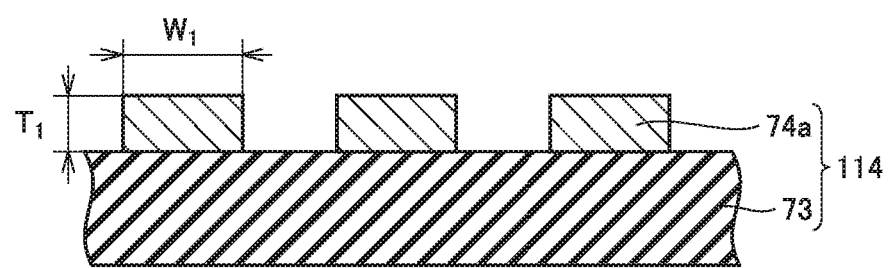
FIG. 49 is an enlarged schematic partial cross-sectional view of the first flexible printed circuit included in the array antenna apparatus according to Embodiment 7 of the present invention, taken along a section line IL-IL shown in FIG. 48.
Figure 50:
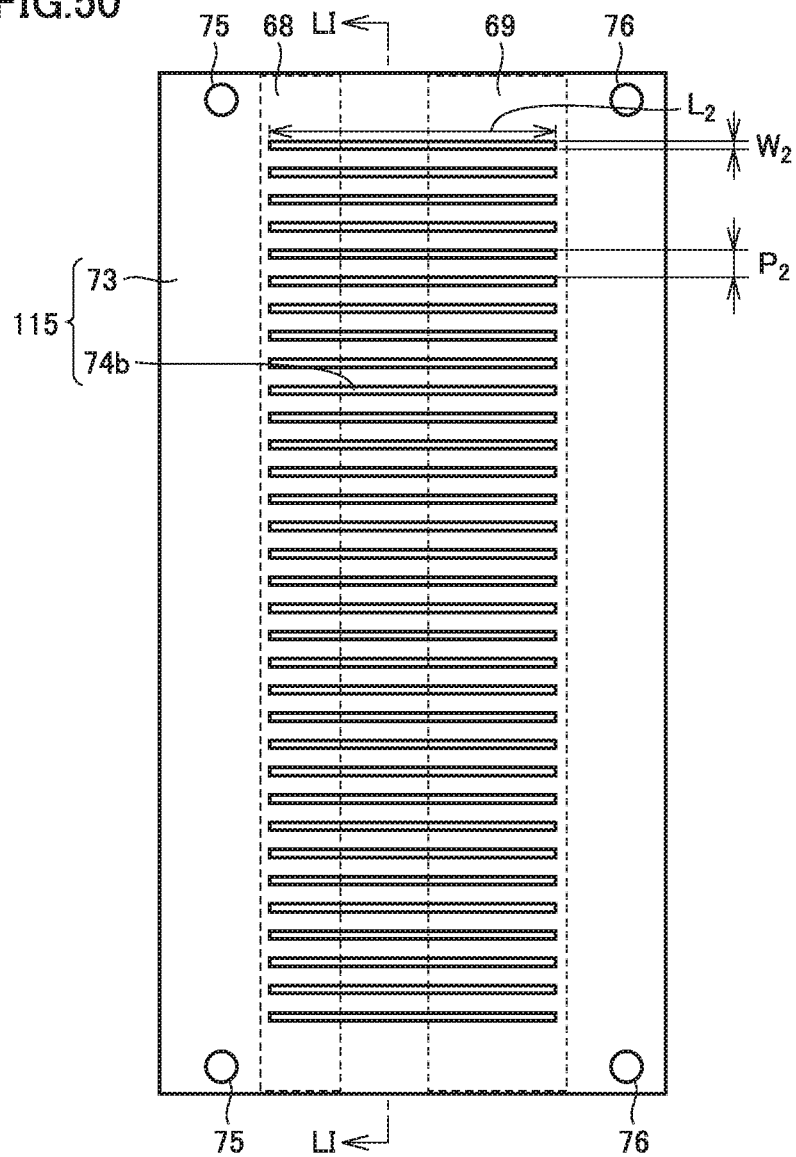
FIG. 50 is a schematic plan view of a second flexible printed circuit included in the array antenna apparatus according to Embodiment 7 of the present invention.
Figure 51:
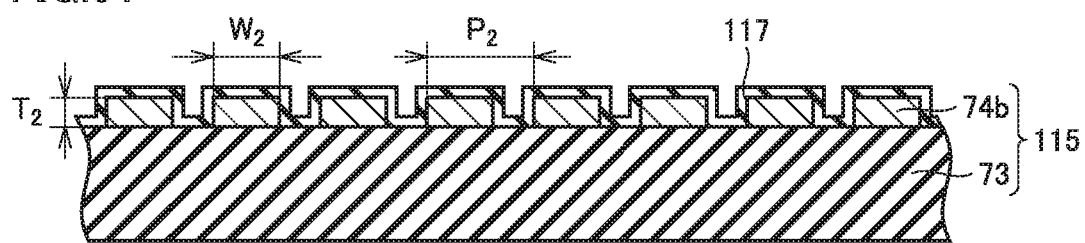
FIG. 51 is an enlarged schematic partial cross-sectional view of the second flexible printed circuit included in the array antenna apparatus according to Embodiment 7 of the present invention, taken along a section line LI-LI shown in FIG. 50.
Figure 52:
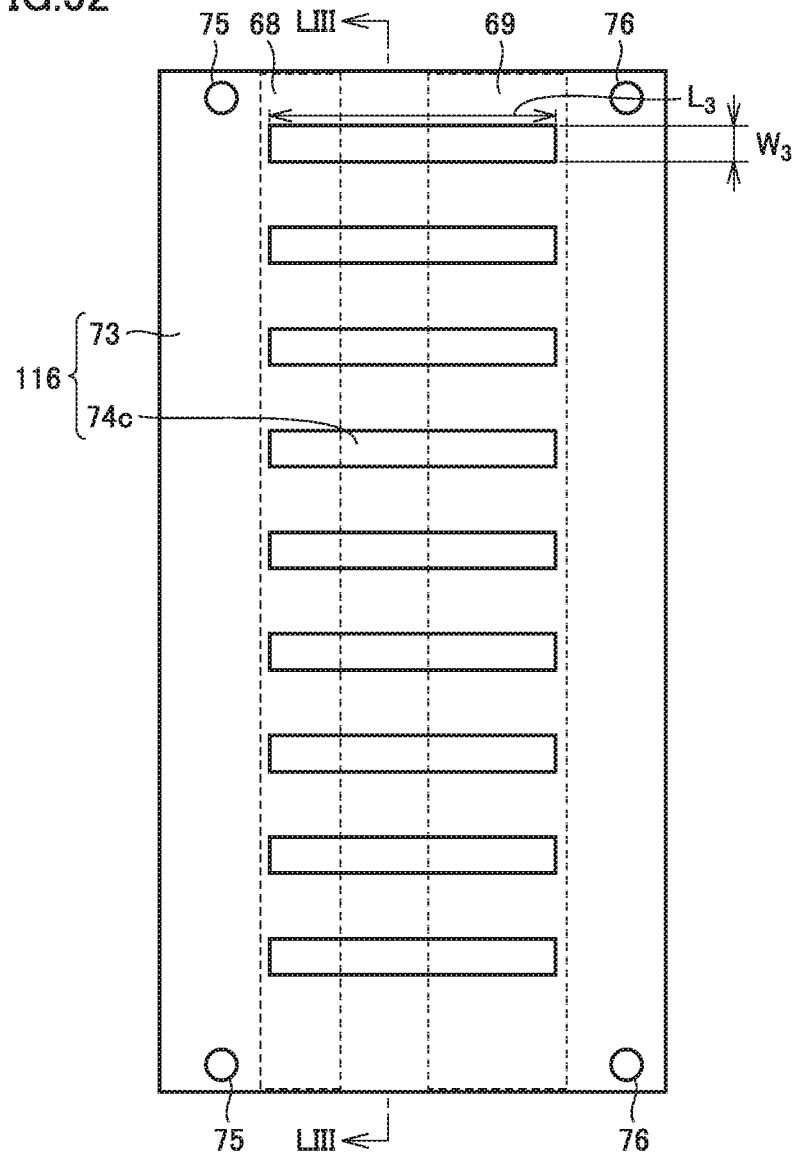
FIG. 52 is a schematic plan view of a third flexible printed circuit included in the array antenna apparatus according to Embodiment 7 of the present invention.
Figure 53:
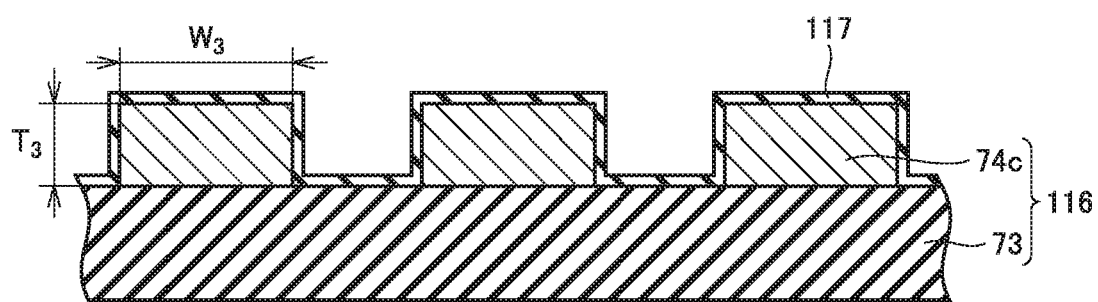
FIG. 53 is an enlarged schematic partial cross-sectional view of the third flexible printed circuit included in the array antenna apparatus according to Embodiment 7 of the present invention, taken along a section line LIII-LIII shown in FIG. 52.
Figure 54:
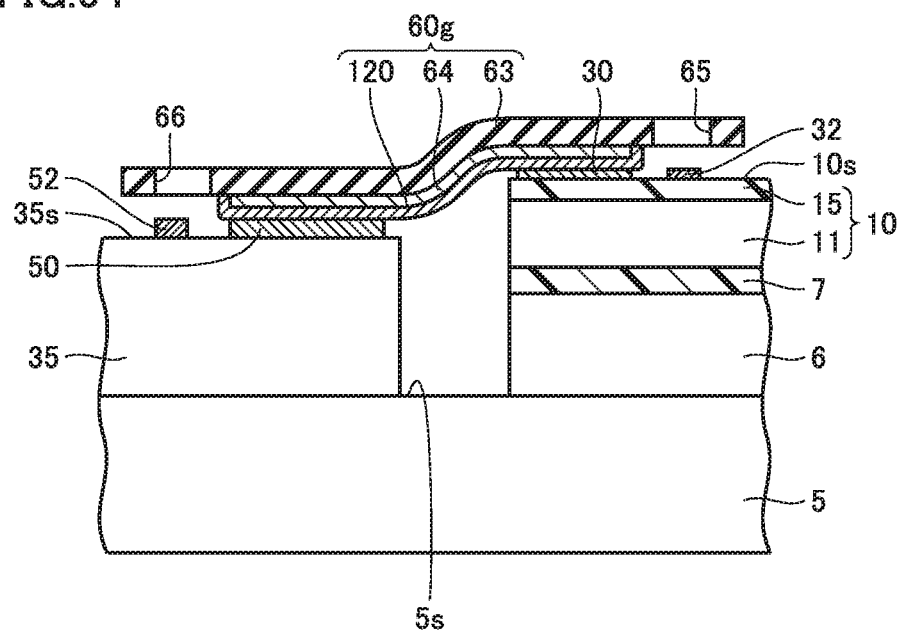
FIG. 54 is an enlarged schematic partial cross-sectional view of an array antenna apparatus according to Embodiment 8 of the present invention.
Figure 55:
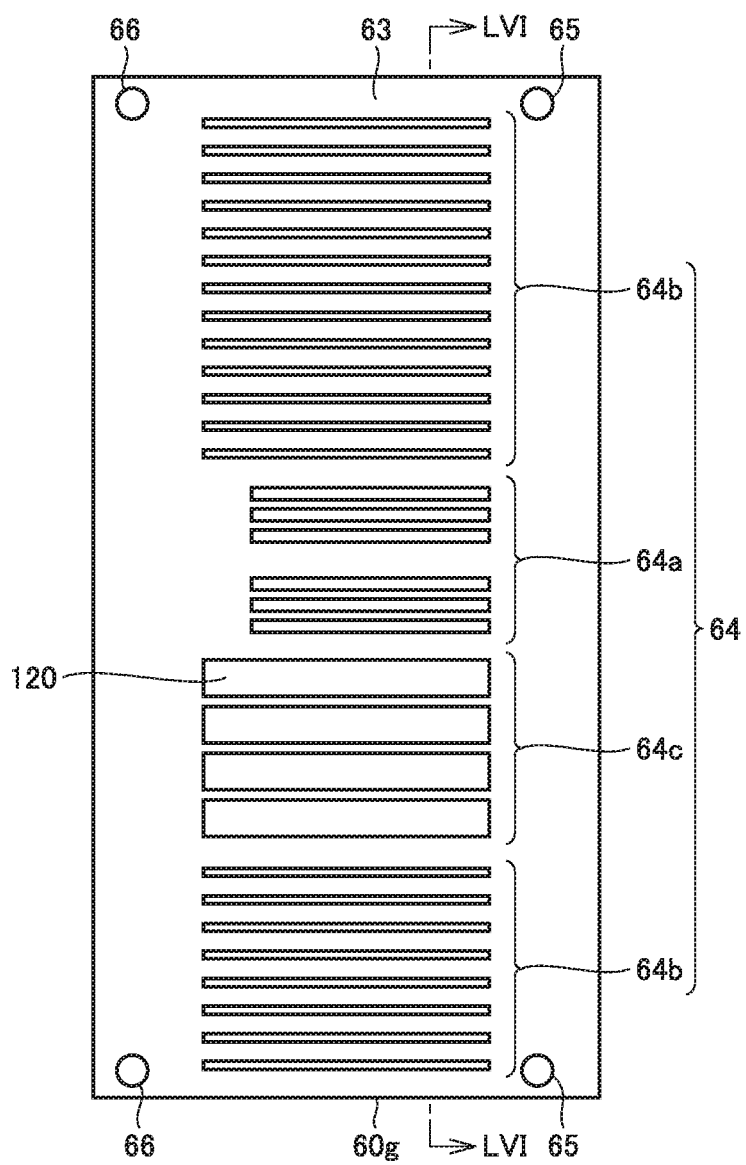
FIG. 55 is a schematic plan view of a flexible printed circuit included in the array antenna apparatus according to Embodiment 8 of the present invention.
Figure 56:
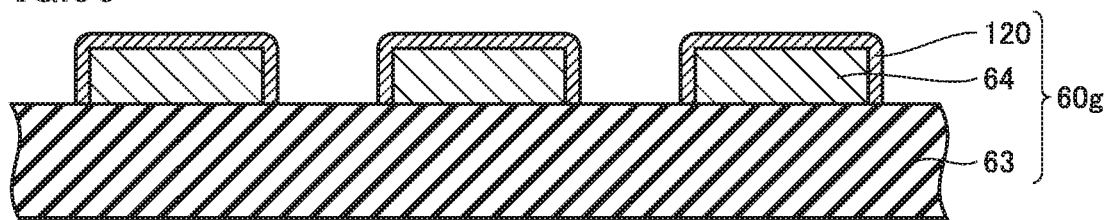
FIG. 56 is an enlarged schematic partial cross-sectional view of the flexible printed circuit included in the array antenna apparatus according to Embodiment 8 of the present invention, taken along a section line LVI-LVI shown in FIG. 55.
Figure 57:
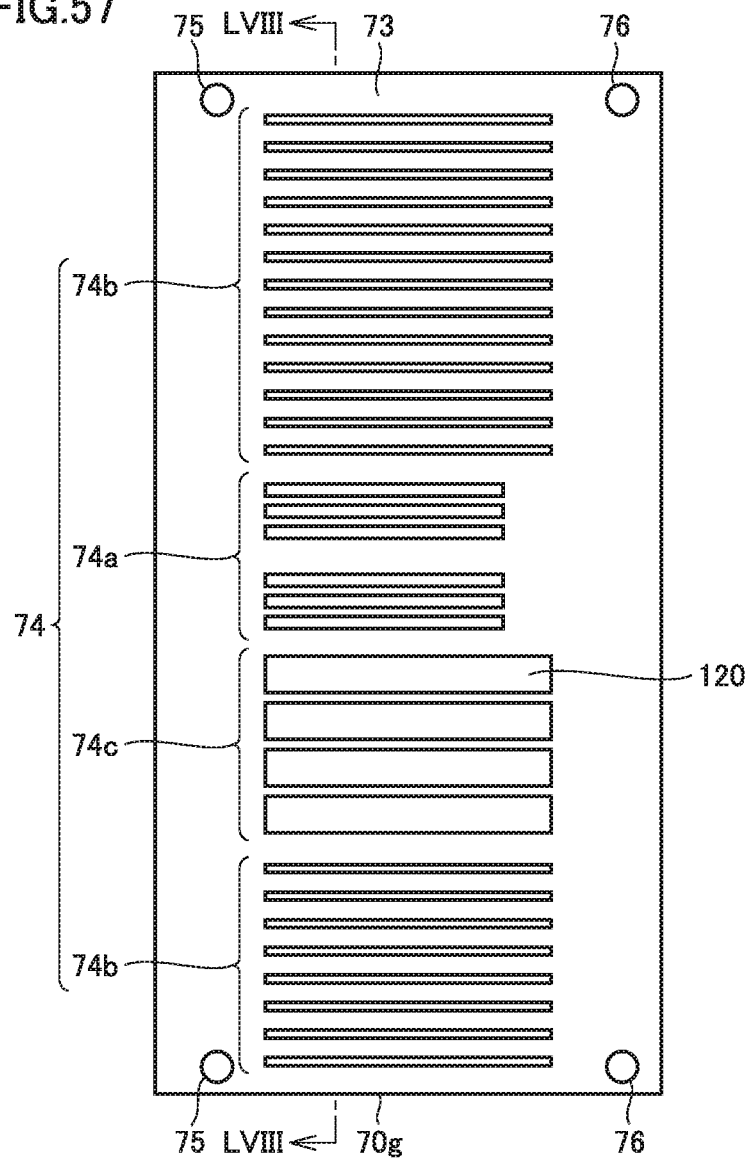
FIG. 57 is a schematic plan view of a flexible printed circuit included in the array antenna apparatus according to Embodiment 8 of the present invention.
Figure 58:
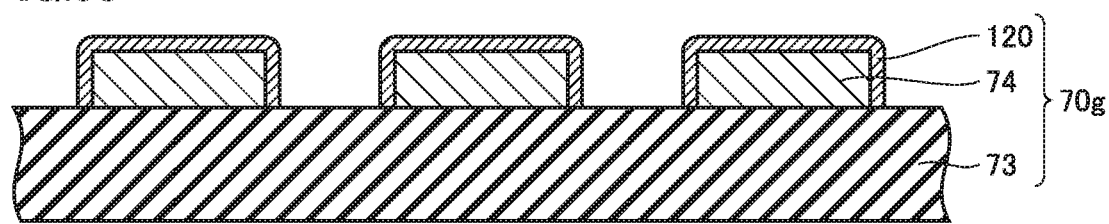
FIG. 58 is an enlarged schematic partial cross-sectional view of the flexible printed circuit included in the array antenna apparatus according to Embodiment 8 of the present invention, taken along a section line LVIII-LVIII shown in FIG. 57.

Referring to FIGS. 39 and 40, an array antenna apparatus 1 according to Embodiment 6 will be described. Array antenna apparatus 1 according to the present embodiment has the same configuration as array antenna apparatus 1 according to Embodiment 1, but is different mainly in the following points.

One or more flexible printed circuits 60e and 70e further include dummy pads 108 on both sides of one or more traces 64, 74 in the width direction. Dummy pads 108 are away from one or more traces 64, 74. Dummy pads 108 are electrically insulated from one or more traces 64, 74. Dummy pads 108 may be part of ground traces. Dummy pads 108 may be composed of the same material as one or more traces 64, 74.

Dummy pads 108 have a length $L_4$ and a width $W_4$. Length $L_4$ is defined as a length of dummy pad 108 in the longitudinal direction of dummy pad 108. Width $W_4$ is defined as a length of dummy pad 108 in a direction perpendicular to that longitudinal direction and along the surface of base film 63, 73.

Dummy pads 108 may have a length greater than or equal to high-frequency circuit traces 64a, 74a, power supply circuit traces 64c, 74c, and signal processing circuit traces 64b, 74b. In other words, length $L_4$ of dummy pads 108 may be greater than length $L_1$ of high-frequency circuit traces 64a, 74a, greater than or equal to length $L_2$ of signal processing circuit traces 64b, 74b, and greater than or equal to length $L_3$ of high-frequency circuit traces 64a, 74a. Dummy pads 108 may have a wider width than high-frequency circuit traces 64a, 74a, signal processing circuit traces 64b, 74b, and power supply circuit traces 64c, 74c. In other words, width $W_4$ of dummy pads 108 may be greater than width $W_3$ of power supply circuit traces 64c, 74c, width $W_1$ of high-frequency circuit traces 64a, 74a, and width $W_2$ of signal processing circuit traces 64b, 74b.

Array antenna apparatus 1 according to the present embodiment yields the following advantages effects, in addition to the advantages effects of array antenna apparatus 1 according to Embodiment 1. Dummy pads 108 protect one or more traces 64, 74 from mechanical impact applied from outside the array antenna apparatus 1. Dummy pads 108 can prevent one or more traces 64, 74 from breaking. Array antenna apparatus 1 according to the present embodiment has good antenna characteristics.

Embodiment 7

Referring to FIGS. 41 through 53, an array antenna apparatus 1 according to Embodiment 7 will be described. Array antenna apparatus 1 according to the present embodiment has the same configuration as array antenna apparatus 1 according to Embodiment 1, but is different mainly in the following points.

One or more flexible printed circuits (111 to 116) are multiple flexible printed circuits (111 to 116). Flexible printed circuits (111 to 116) include a first flexible printed circuit 111, 114, A second flexible printed circuit 112, 115, and a third flexible printed circuit 113, 116. Some (e.g., first flexible printed circuit 111, second flexible printed circuit 112, and third flexible printed circuit 113) of flexible printed circuits (111 to 116) are attached to one (e.g., first external circuit board 35) of first external circuit boards 35, 36. The rest (e.g., first flexible printed circuit 114, second flexible printed circuit 115, and third flexible printed circuit 116) of flexible printed circuits (111 to 116) are attached to another one (e.g., first external circuit board 36) of first external circuit boards 35, 36.

As shown in FIGS. 42, 43, 48, and 49, first flexible printed circuit 111, 114 includes multiple high-frequency circuit traces 64a, 74a only. High-frequency circuit traces 64a, 74a have a thickness $T_1$. In plan view of second primary surface 10s, high-frequency circuit traces 64a of first flexible printed circuit 111 and high-frequency circuit traces 74a of first flexible printed circuit 114 are disposed at the opposing positions across a centerline 10c of a wiring board 10. Particularly, in plan view of second primary surface 10s, high-frequency circuit traces 64a of first flexible printed circuit 111 and high-frequency circuit traces 74a of first flexible printed circuit 114 may be disposed line symmetric about centerline 10c of wiring board 10. High-frequency circuit traces 64a, 74a are not covered with an insulation protective film 117 (see FIGS. 45, 47, 51, and 53). Dielectric losses of first flexible printed circuit 111, 114 caused by insulation protective film 117 can be prevented.

As shown in FIGS. 44, 45, 50 and 51, second flexible printed circuit 112, 115 includes multiple signal processing circuit traces 64b, 74b only. Signal processing circuit traces 64b, 74b have a thickness $T_2$. Signal processing circuit traces 64b, 74b may have thickness $T_2$ of 5 μm or greater and 10 μm or less, for example. Signal processing circuit traces 64b, 74b have a thickness less than high-frequency circuit traces 64a, 74a and power supply circuit traces 64c, 74c. Thickness $T_2$ of signal processing circuit traces 64b, 74b is less than thickness $T_1$ of high-frequency circuit traces 64a, 74a and a thickness $T_3$ of power supply circuit traces 64c, 74c. Signal processing circuit traces 64b, 74b may be arranged at a pitch $P_2$ in the width direction of signal processing circuit traces 64b, 74b, respectively. Pitch $P_2$ for signal processing circuit traces 64b, 74b may be 40 μm or greater and 100 μm or less, for example. Pitch $P_2$ for signal processing circuit traces 64b, 74b may be smaller than the pitch for power supply circuit traces 64c, 74c. Pitch $P_2$ for signal processing circuit traces 64b, 74b may be smaller than the pitch for high-frequency circuit traces 64a, 74a.

In plan view of second primary surface 10s, signal processing circuit traces 64b of second flexible printed circuit 112 and signal processing circuit traces 74b of second flexible printed circuit 115 are disposed at the opposing positions across centerline 10c of wiring board 10. Particularly, in plan view of second primary surface 10s, signal processing circuit traces 64b of second flexible printed circuit 112 and signal processing circuit traces 74b of second flexible printed circuit 115 may be disposed line symmetric about centerline 10c of wiring board 10. Signal processing circuit traces 64b, 74b may be covered with insulation protective film 117.

As shown in FIGS. 46, 47, 52, and 53, third flexible printed circuit 113, 116 includes multiple power supply circuit traces 64c, 74c only. Power supply circuit traces 64c, 74c have a thickness $T_3$. Power supply circuit traces 64c, 74c may have thickness $T_3$ of 30 μm or greater and 60 μm or less, for example. Power supply circuit traces 64c, 74c have a thickness greater than high-frequency circuit traces 64a, 74a and signal processing circuit traces 64b, 74b. Thickness $T_3$ of power supply circuit traces 64c, 74c is greater than thickness $T_1$ of high-frequency circuit traces 64a, 74a and thickness $T_2$ of signal processing circuit traces 64b, 74b. Due to this, power supply circuit traces 64c, 74c have current capacity greater than high-frequency circuit traces 64a, 74a and signal processing circuit traces 64b, 74b. Through power supply circuit traces 64c, 74c, a sufficient amount of power can be supplied to active device circuits 13 and control circuits 14 included in wiring board 10.

In plan view of second primary surface 10s, power supply circuit traces 64c of third flexible printed circuit 113 and power supply circuit traces 64c of third flexible printed circuit 116 are disposed at the opposing positions across centerline 10c of wiring board 10. Particularly, in plan view of second primary surface 10s, power supply circuit traces 64c of third flexible printed circuit 113 and power supply circuit traces 64c of third flexible printed circuit 116 may be disposed line symmetric about centerline 10c of wiring board 10. Power supply circuit traces 64c, 74c may be covered with insulation protective film 117.

Array antenna apparatus 1 according to the present embodiment yields the following advantages effects, in addition to the advantages effects of array antenna apparatus 1 according to Embodiment 1.

In array antenna apparatus 1 according to the present embodiment, wiring board 10 includes active device circuits 13, and control circuits 14 connected to active device circuits 13. Active device circuits 13 are electrically coupled to multiple antenna elements (non-feeding patch antenna elements 29), respectively. One or more first external circuit boards 35, 36 each include a high-frequency circuit 40, a signal processing circuit 41, and a power supply circuit 42. One or more traces 64, 74 are multiple traces 64, 74. Traces 64, 74 include multiple power supply circuit traces 64c, 74c, multiple high-frequency circuit traces 64a, 74a, and multiple signal processing circuit traces 64b, 74b. One or more flexible printed circuits (111 to 116) include first flexible printed circuit 111, 114, second flexible printed circuit 112, 115, and third flexible printed circuit 113, 116. First flexible printed circuit 111, 114 includes multiple high-frequency circuit traces 64a, 74a only. Second flexible printed circuit 112, 115 includes multiple signal processing circuit traces 64b, 74b only. Third flexible printed circuit 113, 116 includes multiple power supply circuit traces 64c, 74c only. High-frequency circuit traces 64a, 74a connect high-frequency circuit 40 to active device circuits 13. Signal processing circuit traces 64b, 74b connect signal processing circuit 41 to control circuit 14. Power supply circuit traces 64c, 74c electrically connect power supply circuit 42 to active device circuits 13 and control circuits 14.

In array antenna apparatus 1 according to the present embodiment, high-frequency circuit traces 64a, 74a, signal processing circuit traces 64b, 74b, and power supply circuit traces 64c, 74c are respectively provided on first flexible printed circuit 111, 114, second flexible printed circuit 112, 115, and third flexible printed circuit 113, 116 which are different from one another. Due to this, high-frequency circuit traces 64a, 74a, signal processing circuit traces 64b, 74b, and power supply circuit traces 64c, 74c can be design so as to optimize the performance of array antenna apparatus 1. Array antenna apparatus 1 according to the present embodiment has good antenna characteristics.

Embodiment 8

Referring to FIGS. 54 through 58, an array antenna apparatus 1 according to Embodiment 8 will be described. Array antenna apparatus 1 according to the present embodiment has the same configuration as array antenna apparatus 1 according to Embodiment 1, but is different mainly in the following points.

One or more flexible printed circuits 60g, 70g each further include a solder layer 120 on one or more traces 64, 74. Specifically, solder layer 120 may cover high-frequency circuit traces 64a, 74a, signal processing circuit traces 64b, 74b, and power supply circuit traces 64c, 74c. One or more flexible printed circuits 60g, 70g are bonded to a second primary surface 10s of a wiring board 10 and fourth primary surfaces 35s, 36s of one or more first external circuit boards 35, 36 via solder layer 120. Specifically, traces 64, 74 of one or more flexible printed circuits 60g, 70g are connected to first conductive pads 30 via solder layer 120. Traces 64, 74 of one or more flexible printed circuits 60g, 70g are connected to second conductive pads 50 via solder layer 120.

Referring primarily to FIGS. 59 through 65, a method for fabricating array antenna apparatus 1 according to the present embodiment will be described.

Figure 59:
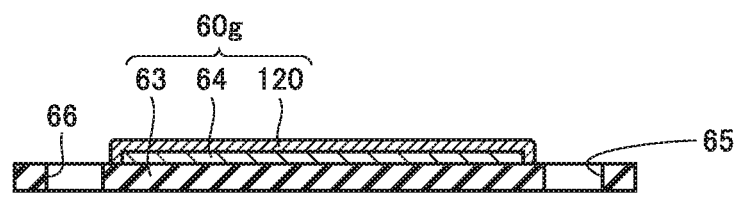
FIG. 59 is a schematic cross sectional view showing one step included in a method for fabricating the array antenna apparatus according to Embodiment 8 of the present invention.
Figure 60:
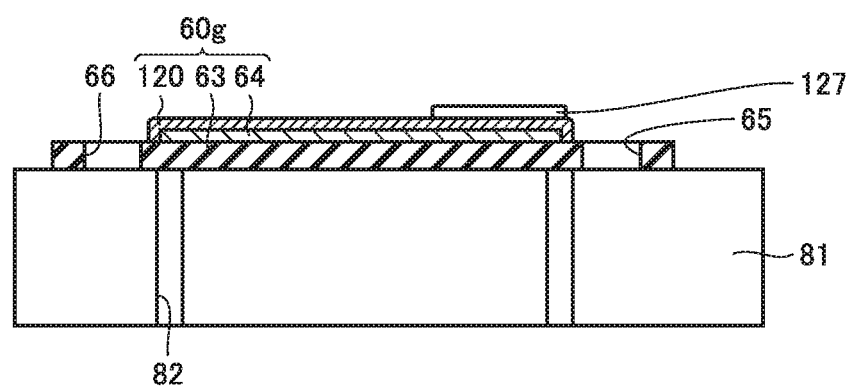
FIG. 60 is a schematic cross sectional view showing a step following the step shown in FIG. 59 in the method for fabricating the array antenna apparatus according to Embodiment 8 of the present invention.

Referring to FIG. 59, the method for fabricating array antenna apparatus 1 according to the present embodiment includes forming solder layer 120 on one or more traces 64, 74 of one or more flexible printed circuits 60g, 70g. Solder layer 120 may be formed on one or more traces 64, 74 by plating or screen printing, for example. Referring to FIG. 60, the method for fabricating array antenna apparatus 1 according to the present embodiment may include coating a first flux 127 on solder layer 120. First flux 127 may be provided on an edge portion of solder layer 120.

Figure 61:
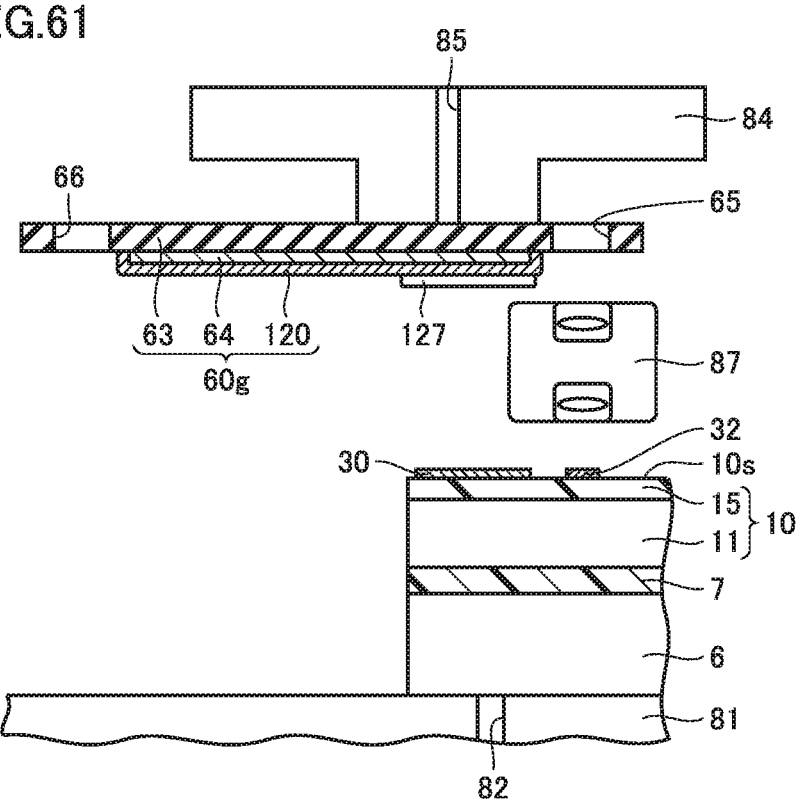
FIG. 61 is an enlarged schematic partial cross-sectional view showing a step following the step shown in FIG. 60 in the method for fabricating the array antenna apparatus according to Embodiment 8 of the present invention.

Referring to FIG. 61, the method for fabricating array antenna apparatus 1 according to the present embodiment includes aligning one or more flexible printed circuits 60g, 70g with wiring board 10. Aligning one or more flexible printed circuits 60g, 70g with wiring board 10 in the present embodiment is basically the same as aligning one or more flexible printed circuits 60, 70 with wiring board 10 in Embodiment 1. First through-holes 65, 75 of one or more flexible printed circuits 60g, 70g are aligned with first alignment marks 32 on second primary surface 10s of wiring board 10. First flux 127 faces first conductive pads 30.

Figure 62:
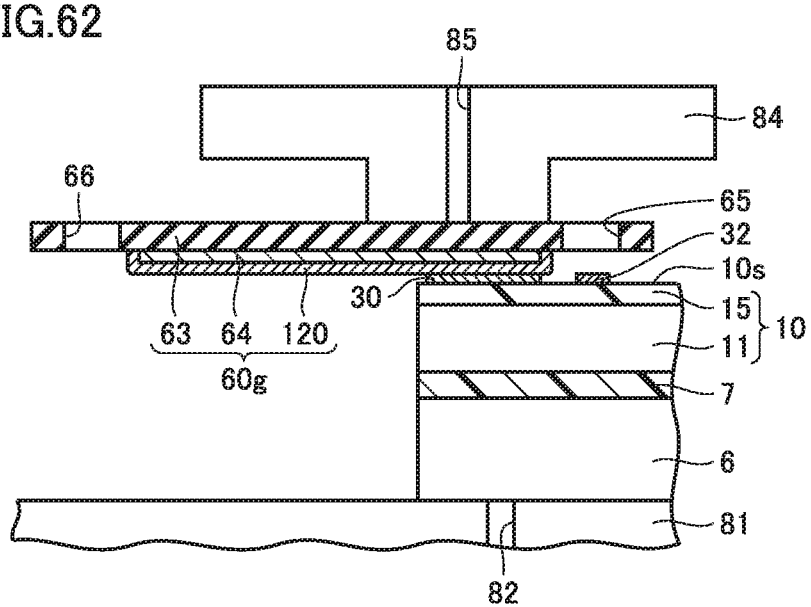
FIG. 62 is an enlarged schematic partial cross-sectional view showing a step following the step shown in FIG. 61 in the method for fabricating the array antenna apparatus according to Embodiment 8 of the present invention.

Referring to FIG. 62, the method for fabricating array antenna apparatus 1 according to the present embodiment may include bonding one or more flexible printed circuits 60g, 70g to second primary surface 10s of wiring board 10 via solder layer 120.

Solder bonding one or more flexible printed circuits 60g, 70g to wiring board 10 in the present embodiment is basically the same as adhering one or more flexible printed circuits 60, 70 to second primary surface 10s of wiring board 10 in Embodiment 1. In the present embodiment, solder layer 120 is used, instead of first anisotropic conductive member 68 according to Embodiment 1, to bond one or more flexible printed circuits 60g, 70g to wiring board 10. Specifically, one or more flexible printed circuits 60g, 70g, each including solder layer 120, are pressed against second primary surface 10s of wiring board 10, using a first bonder 84. Solder layer 120 is heated by at least one of first bonder 84 and a stage 81. In this manner, one or more flexible printed circuits 60g, 70g are bonded to second primary surface 10s of wiring board 10 via solder layer 120. First flux 127 may then be removed, using an organic solvent or a flux cleaning liquid.

Figure 63:
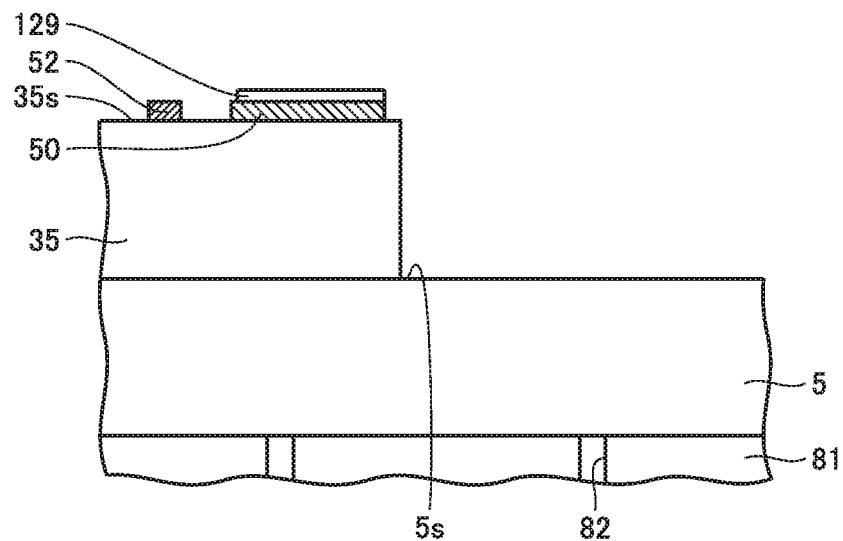
FIG. 63 is an enlarged schematic partial cross-sectional view showing a step following the step shown in FIG. 62 in the method for fabricating the array antenna apparatus according to Embodiment 8 of the present invention.

As shown in FIG. 63, the method for fabricating array antenna apparatus 1 according to the present embodiment includes coating a second flux 129 on one or more first external circuit boards 35, 36. Particularly, second flux 129 is applied on second conductive pads 50 on one or more first external circuit boards 35, 36. The method for fabricating array antenna apparatus 1 according to the present embodiment may include mounting one or more first external circuit boards 35, 36 on first primary surface 5s of base plate 5. Base plate 5 may be adsorbed on stage 81 which includes adsorbing portion 82.

Figure 64:
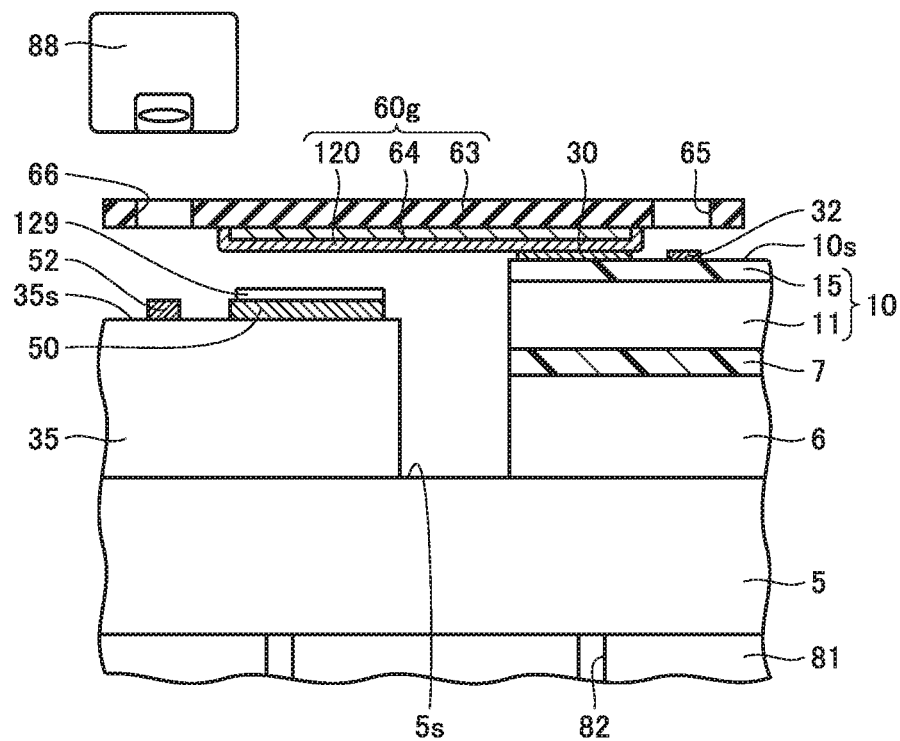
FIG. 64 is an enlarged schematic partial cross-sectional view showing a step following the step shown in FIG. 63 in the method for fabricating the array antenna apparatus according to Embodiment 8 of the present invention.

Referring to FIG. 64, the method for fabricating array antenna apparatus 1 according to the present embodiment includes aligning one or more flexible printed circuits 60g, 70g with one or more first external circuit boards 35, 36, respectively. Aligning one or more flexible printed circuits 60g, 70g with one or more first external circuit boards 35, 36 in the present embodiment is the same as aligning one or more flexible printed circuits 60, 70 with one or more first external circuit boards 35, 36 in Embodiment 1.

Figure 65:
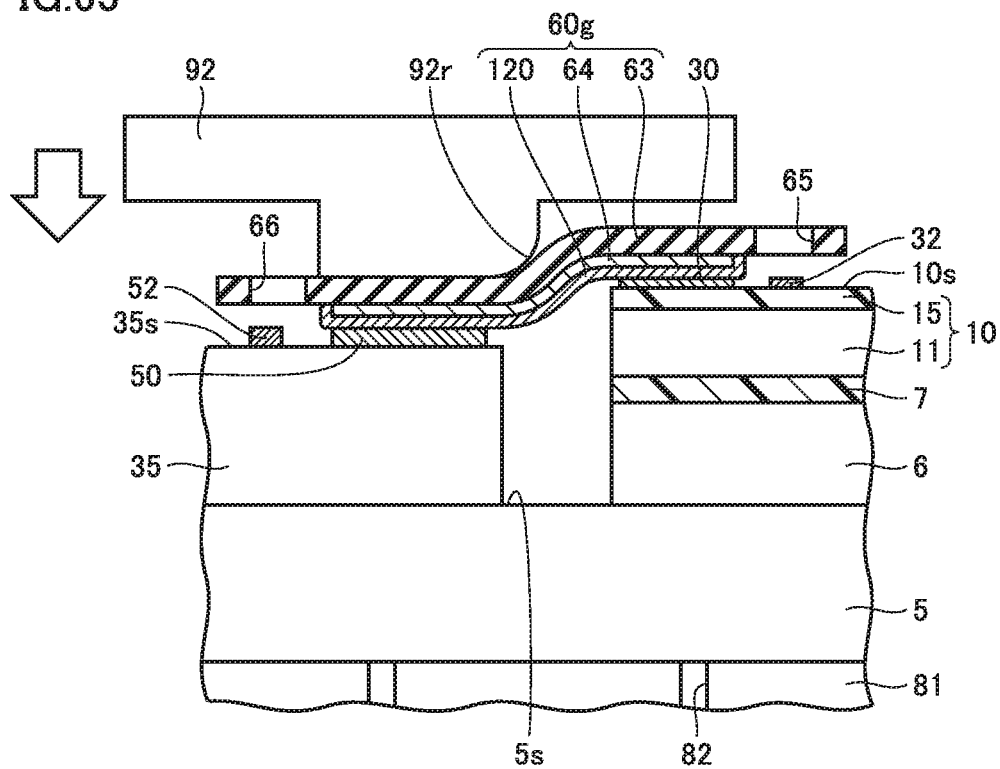
FIG. 65 is an enlarged schematic partial cross-sectional view showing a step following the step shown in FIG. 64 in the method for fabricating the array antenna apparatus according to Embodiment 8 of the present invention.

Referring to FIG. 65, the method for fabricating array antenna apparatus 1 according to the present embodiment may include bonding one or more flexible printed circuits 60g, 70g to fourth primary surfaces 35s, 36s of one or more first external circuit boards 35, 36 via solder layer 120. Solder bonding one or more flexible printed circuits 60g, 70g to one or more first external circuit boards 35, 36 in the present embodiment is basically the same as adhering one or more flexible printed circuits 60, 70 to one or more first external circuit boards 35, 36 in Embodiment 1. In the present embodiment, solder layer 120 is used, instead of second anisotropic conductive member 69 according to Embodiment 1, to bond one or more flexible printed circuits 60g, 70g to one or more first external circuit boards 35, 36. Specifically, one or more flexible printed circuits 60g, 70g, each including solder layer 120, are pressed against fourth primary surfaces 35s, 36s of one or more first external circuit boards 35, 36, respectively. Solder layer 120 is heated by at least one of a second bonder 92 and a stage 81. In this manner, one or more flexible printed circuits 60g, 70g are bonded to fourth primary surfaces 35s, 36s of one or more flexible printed circuits 60g, 70g via solder layer 120. Second flux 129 may then be removed, using an organic solvent or a flux cleaning liquid.

Figure 66:
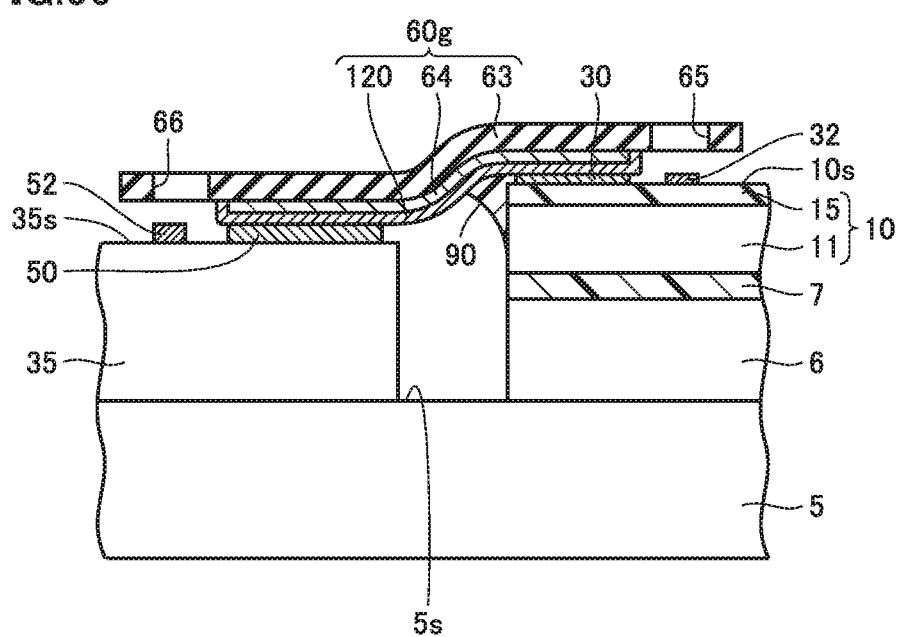
FIG. 66 is an enlarged schematic partial cross-sectional view showing a step following the step shown in FIG. 65 in the method for fabricating the array antenna apparatus according to Embodiment 8 of the present invention.

Referring to FIG. 66, an array antenna apparatus 1 according to a variation of the present embodiment will be described. Array antenna apparatus 1 according to the variation of the present embodiment may further include an elastic resin member 24. Elastic resin member 24 according to the variation of the present embodiment is basically the same as elastic resin member 24 according to the variation of Embodiment 1. Elastic resin member 24 is more elastic than solder layer 120. Elastic resin member 24 is in contact with one or more flexible printed circuits 60g, 70g, solder layer 120, and wiring board 10. Elastic resin member 24 adheres to solder layer 120, one or more flexible printed circuits 60g, 70g, and wiring board 10.

Elastic resin member 24 can reinforce the joint, by solder layer 120, between one or more flexible printed circuits 60g, 70g and wiring board 10. As array antenna apparatus 1 is exposed to temperature changes, thermal stress is applied to the joint, by solder layer 120, between one or more flexible printed circuits 60g, 70g and wiring board 10. The thermal stress is due to the difference, for example, between the coefficient of thermal expansion of wiring board 10 and the coefficient of thermal expansion of one or more first external circuit boards 35, 36. Elastic resin member 24 can alleviate the thermal stress, thereby preventing the joint, by solder layer 120, between one or more flexible printed circuits 60g, 70g and wiring board 10 from being destroyed. Elastic resin member 24 may be, for example, an ultraviolet curing resin, such as an acrylic-based resin or a silicone-based resin, or may be a thermosetting resin, such as a urethane-based resin.

Array antenna apparatus 1 according to the present embodiment and the variation thereof has the same advantages effects as those of array antenna apparatus 1 according to Embodiment 1 and the variation thereof, but is different mainly in the following points.

In array antenna apparatus 1 according to the present embodiment and the variation thereof, one or more flexible printed circuits 60g, 70g includes solder layer 120 on one or more traces 64, 74, respectively. One or more flexible printed circuits 60g, 70g are bonded to second primary surface 10s and fourth primary surfaces 35s, 36s, respectively, via solder layer 120.

Solder layer 120 has lower electric resistance than first anisotropic conductive member 68 and second anisotropic conductive member 69 according to Embodiment 1. The connection resistance between one or more flexible printed circuits 60g, 70g and wiring board 10 can be reduced by using solder layer 120 to join one or more flexible printed circuits 60g, 70g to wiring board 10. The connection resistance between one or more flexible printed circuits 60g, 70g and one or more first external circuit boards 35, 36 can be reduced by using solder layer 120 to bond one or more flexible printed circuits 60g, 70g to one or more first external circuit boards 35, 36. In array antenna apparatus 1 according to the present embodiment and the variation thereof, a greater current can be supplied to active device circuits 13. Array antenna apparatus 1 according to the present embodiment and the variation thereof has good antenna characteristics.

The melting point for solder layer 120 is higher than the softening temperature for first resin adhesive layer 68a included in first anisotropic conductive member 68 and the softening temperature for second resin adhesive layer 69a included in second anisotropic conductive member 69. Array antenna apparatus 1 according to the present embodiment and the variation thereof has a greater heat resistance than array antenna apparatus 1 according to Embodiment 1 and the variation thereof. Due to this, in array antenna apparatus 1 according to the present embodiment and the variation thereof, a greater current can be supplied to active device circuits 13. Array antenna apparatus 1 according to the present embodiment and the variation thereof has good antenna characteristics. Furthermore, array antenna apparatus 1 according to the present embodiment and the variation thereof can be used in environment having higher temperature.

Embodiment 9

Referring to FIGS. 67 through 70, an array antenna apparatus 1 according to Embodiment 9 will be described. Array antenna apparatus 1 according to the present embodiment has the same configuration as array antenna apparatus 1 according to Embodiment 8, but is different mainly in the following points.

Figure 67:
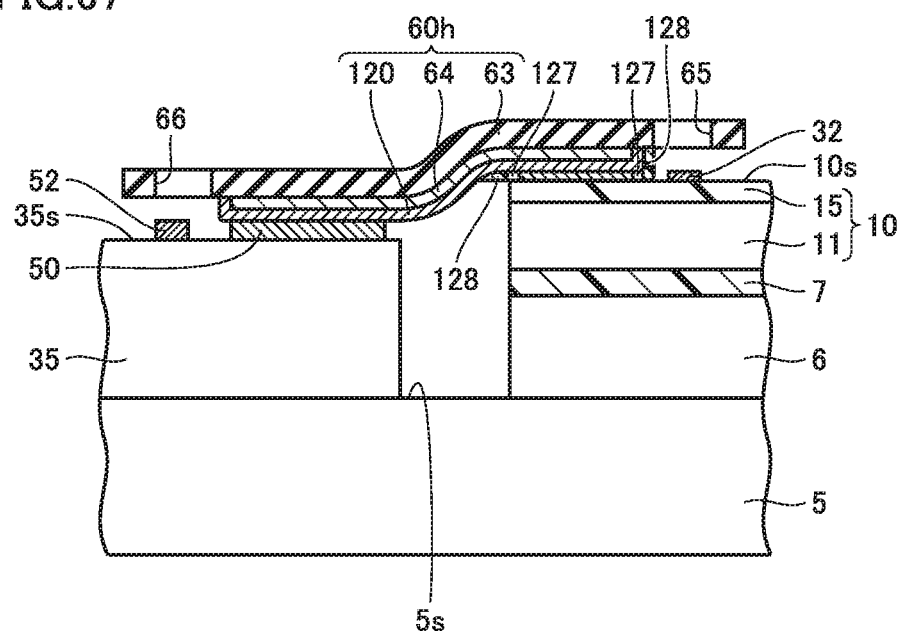
FIG. 67 is an enlarged schematic partial cross-sectional view of an array antenna apparatus according to Embodiment 9 of the present invention.
Figure 68:
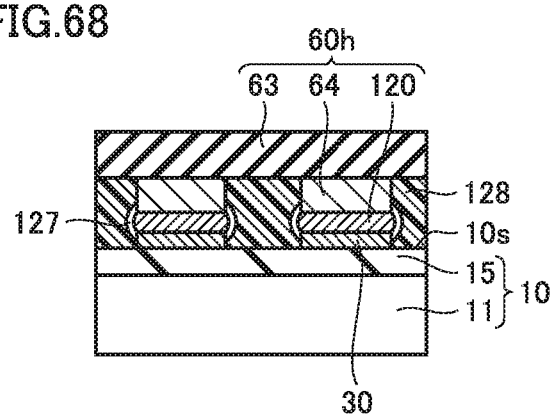
FIG. 68 is an enlarged schematic partial cross-sectional view of the array antenna apparatus according to Embodiment 9 of the present invention.

Referring to FIGS. 67 and 68, array antenna apparatus 1 according to the present embodiment further includes an insulating resin member 128 between one or more flexible printed circuits 60h, 70h and a second primary surface 10s of a wiring board 10.

Insulating resin member 128 may be filled in gaps (except for solder layer 120) between one or more flexible printed circuits 60h, 70h and second primary surface 10s of wiring board 10. Insulating resin member 128 electrically insulates traces 64, 74 from each other. Insulating resin member 128 adheres one or more flexible printed circuits 60h, 70h to wiring board 10. Insulating resin member 128 may be composed of, for example, an epoxy-based resin, such as a one-part epoxy resin, a polyurethane-based resin, or an acrylic-based resin. Insulating resin member 128 may also be provided between one or more flexible printed circuits 60h, 70h and fourth primary surfaces 35s, 36s of one or more first external circuit boards 35, 36.

Traces 64, 74, covered with solder layer 120, are electrically insulated from each other by insulating resin member 128. Insulating resin member 128 can prevent whiskers from growing between traces 64, 74 covered with solder layer 120 and inhibit traces 64, 74, covered with solder layer 120, from being electrically shorted from each other. Due to this, solder layer 120 may be composed of a solder which a high tin (Sn) contend, such as 99Sn-1Cu. In general, whiskers easily grow from a solder with a high tin (Sn) content. Insulating resin member 128 can prevent whiskers from growing. Solder layer 120 composed of a solder with a high tin (Sn) content can be stably formed on traces 64, 74 by plating.

When bonding one or more flexible printed circuits 60h, 70h to wiring board 10 by solder layer 120, first flux 127 may remain between one or more flexible printed circuits 60h, 70h and wiring board 10. As array antenna apparatus 1 is exposed to highly humid environment, first flux 127 may cause corrosion of one or more traces 64, 74. Insulating resin member 128 can prevent first flux 127 from being exposed to humidity, thereby inhibiting one or more traces 64, 74 from corroding.

Figure 69:
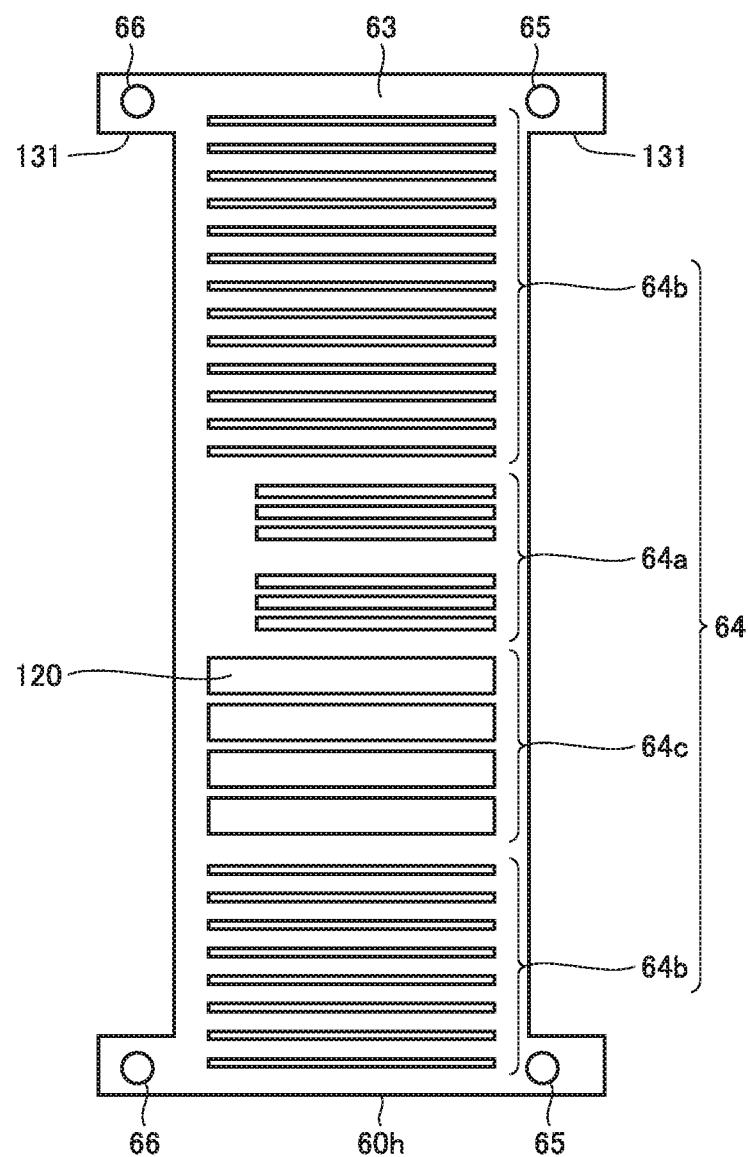
FIG. 69 is a schematic plan view of a flexible printed circuit included in the array antenna apparatus according to Embodiment 9 of the present invention.
Figure 70:
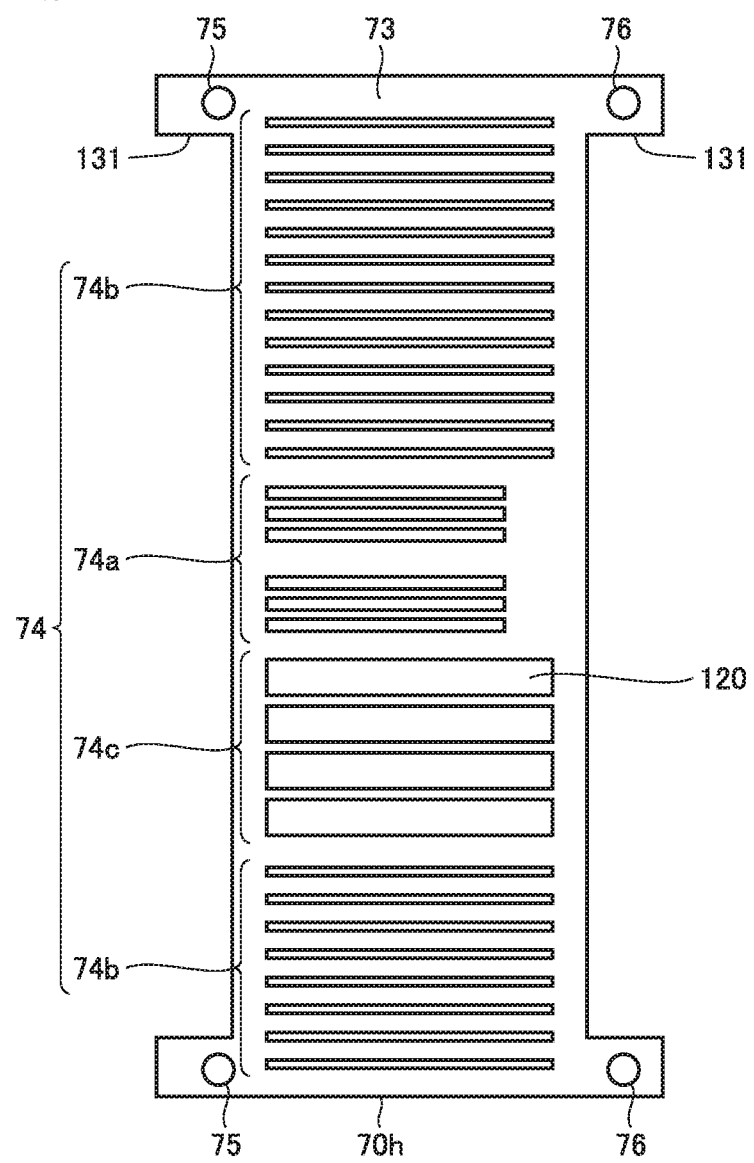
FIG. 70 is a schematic plan view of a flexible printed circuit included in the array antenna apparatus according to Embodiment 9 of the present invention.

Referring to FIGS. 69 and 70, one or more flexible printed circuits 60h, 70h each may have at least one edge portion having a notch 131, the at least one edge portion being in the longitudinal direction of one or more traces 64, 74. One or more flexible printed circuits 60h, 70h may have notch 131 at an edge portion on the first through-hole 65, 75 side. Notches 131 may be formed on both edge portions of one or more flexible printed circuits 60h, 70h in the longitudinal direction of one or more traces 64, 74. One or more flexible printed circuits 60h, 70h may have notch 131 at an edge portion on the first through-hole 65, 75 side and at an edge portion on the second through-hole 66, 76 side. Notch 131 faces second primary surface 10s of wiring board 10. Notches 131 may face second primary surface 10s of wiring board 10, and fourth primary surfaces 35s, 36s of one or more first external circuit boards 35, 36. Notches 131 may be opposite at least some of high-frequency circuit traces 64a, 74a, at least some of signal processing circuit traces 64b, 74b, and at least some of power supply circuit traces 64c, 74c.

A method for fabricating array antenna apparatus 1 according to the present embodiment will be described. The method for fabricating array antenna apparatus 1 according to the present embodiment includes the same steps as those included in the method for fabricating array antenna apparatus 1 according to Embodiment 8, but is different mainly in the following points.

After bonding one or more flexible printed circuits 60h, 70h to second primary surface 10s of wiring board 10 via solder layer 120, the method for fabricating array antenna apparatus 1 according to the present embodiment further includes forming insulating resin member 128 between one or more flexible printed circuits 60h, 70h and second primary surface 10s of wiring board 10. For example, a liquid, electrically insulating resin material is injected into gaps between one or more flexible printed circuits 60h, 70h and second primary surface 10s of wiring board 10 through notches 131 of one or more flexible printed circuits 60h, 70h. Insulating resin member 128 may be formed by curing the electrically insulating resin material.

Array antenna apparatus 1 according to the present embodiment yields the following advantages effects, in addition to the advantages effects of array antenna apparatus 1 according to Embodiment 8.

Array antenna apparatus 1 according to the present embodiment further includes insulating resin member 128 between one or more flexible printed circuits 60h, 70h and second primary surface 10s of wiring board 10. Insulating resin member 128 can prevent one or more traces 64, 74 from corroding, and whiskers from growing from one or more traces 64, 74. Array antenna apparatus 1 according to the present embodiment has good antenna characteristics.

In array antenna apparatus 1 according to the present embodiment, one or more flexible printed circuits 60*h*, 70*h* each may have at least one edge portion having notch 131, the at least one edge portion being in the longitudinal direction of one or more traces 64, 74. Notch 131 faces second primary surface 10*s* of wiring board 10. Notch 131 allows insulating resin member 128 to be readily formed between one or more flexible printed circuits 60*h*, 70*h* and second primary surface 10*s* of wiring board 10.

Embodiment 10

Figure 71:
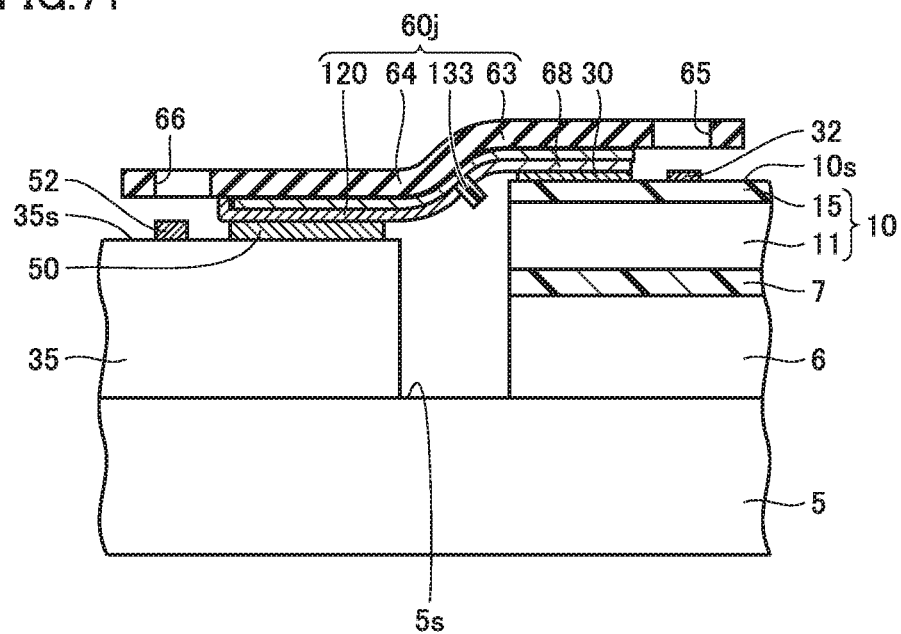
FIG. 71 is an enlarged schematic partial cross-sectional view of an array antenna apparatus according to Embodiment 10 of the present invention.
Figure 72:
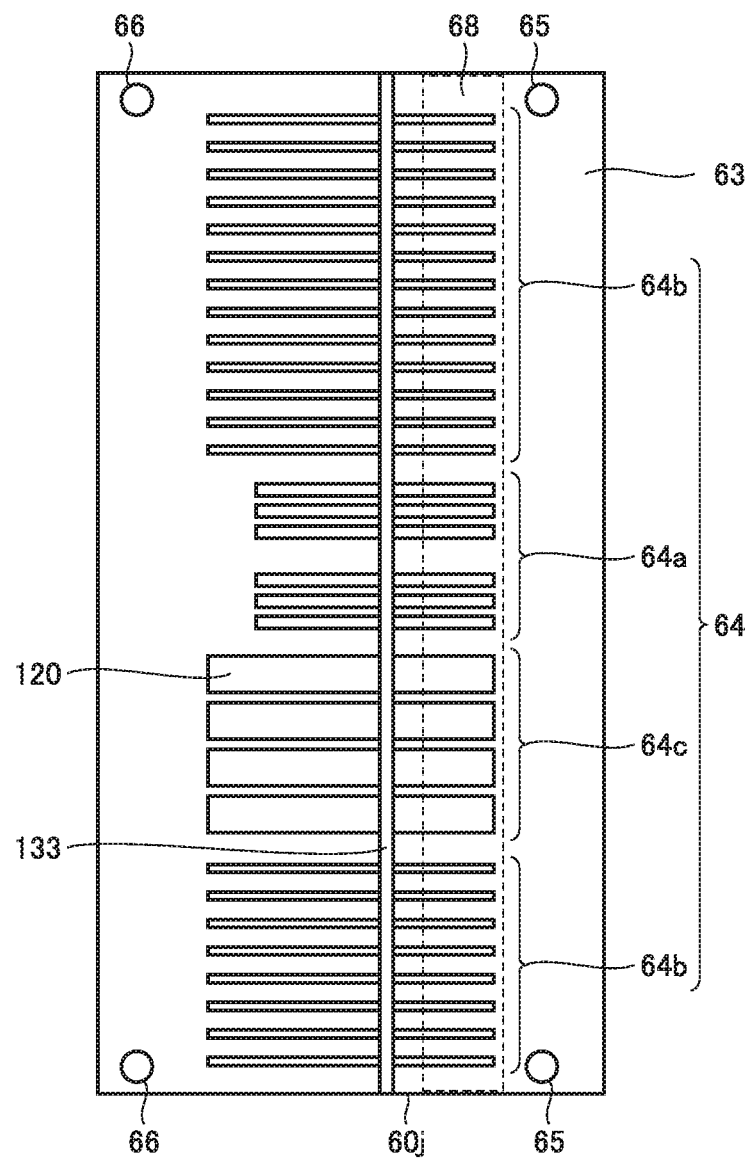
FIG. 72 is a schematic plan view of a flexible printed circuit included in the array antenna apparatus according to Embodiment 10 of the present invention.

Referring to FIGS. 71 through 73, an array antenna apparatus 1 according to Embodiment 10 will be described. Array antenna apparatus 1 according to the present embodiment has the same configuration as array antenna apparatus 1 according to Embodiment 1, but is different mainly in the following points.

In one or more flexible printed circuits 60*j* and 70*j*, a solder layer 120 is provided on edge portions of one or more traces 64, 74 on the second through-hole 66, 76 side in the longitudinal direction of one or more traces 64, 74. Solder layer 120 according to the present embodiment is basically the same as solder layer 120 according to Embodiment 8. First anisotropic conductive member 68 is provided on the edge portions of one or more traces 64, 74 on the first through-hole 65, 75 side in the longitudinal direction of one or more traces 64, 74.

One or more flexible printed circuits 60*j* and 70*j* may further include a dam 133 on one or more traces 64, 74. Dam 133 is disposed between first anisotropic conductive member 68 and solder layer 120. Dam 133 separates solder layer 120 from first anisotropic conductive member 68. Dam 133 may have a height of 20 μm or greater and 50 μm or less, for example. Dam 133 may be composed of a solder resist, for example.

In array antenna apparatus 1 according to the present embodiment, one or more flexible printed circuits 60*j* and 70*j* are adhered to second primary surface 10*s* via first anisotropic conductive member 68. One or more flexible printed circuits 60*j* and 70*j* are adhered to fourth primary surfaces 35*s*, 36*s* via solder layer 120 on one or more traces 64, 74, respectively. While solder layer 120 is provided on portions of one or more traces 64, 74 on the side opposite the fourth primary surfaces 35*s*, 36*s* of one or more first external circuit boards 35, 36, it is not provided on portions of one or more traces 64, 74 on the side opposite the second primary surface 10*s* of wiring board 10. Solder layer 120 is provided on portions of one or more traces 64, 74 on the side opposite the second conductive pads 50, whereas it is not provided on portions of one or more traces 64, 74 on the side opposite the first conductive pads 30.

While first anisotropic conductive member 68 is provided on portions of one or more traces 64, 74 on the side opposite the second primary surface 10*s* of wiring board 10, it is not provided on portions of one or more traces 64, 74 on the side opposite the fourth primary surfaces 35*s*, 36*s* of one or more first external circuit boards 35, 36. While first anisotropic conductive member 68 is provided on portions of one or more traces 64, 74 on the side opposite the first conductive pads 30, it is not provided on portions of one or more traces 64, 74 on the side opposite the second conductive pads 50.

Array antenna apparatus 1 according to the present embodiment yields primarily the following advantages effects, in addition to the advantages effects of array antenna apparatus 1 according to Embodiment 1.

In array antenna apparatus 1 according to the present embodiment, one or more flexible printed circuits 60*j* and 70*j* are adhered to second primary surface 10*s* via first anisotropic conductive member 68. One or more flexible printed circuits 60*j* and 70*j* are adhered to fourth primary surfaces 35*s*, 36*s* via solder layer 120 on one or more traces 64, 74.

In array antenna apparatus 1 according to the present embodiment, solder layer 120 is used, instead of second anisotropic conductive member 69 according to Embodiment 1, to secure one or more flexible printed circuits 60*j* and 70*j* to one or more first external circuit boards 35, 36. Solder layer 120 according to the present embodiment allows reduction in time to secure one or more flexible printed circuits 60*j* and 70*j* to one or more first external circuit boards 35, 36, as compared to second anisotropic conductive member 69 according to Embodiment 1. In contrast, second anisotropic conductive member 69 according to Embodiment 1 is thicker than first anisotropic conductive member 68. Due to this, it requires a lot of time to secure one or more flexible printed circuits 60*j* and 70*j* to one or more first external circuit boards 35, 36 using second anisotropic conductive member 69 according to Embodiment 1.

Embodiments 1 to 10 presently disclosed should be considered in all aspects illustrative and not restrictive. Unless otherwise indicated herein or clearly contradicted by context, at least two of the presently disclosed Embodiments 1 to 10 may be combined. The scope of the present invention is indicated by the appended claims, rather than by the above description, and all changes which come within the meaning and range of equivalency of the appended claims are intended to be embraced within their scope.

REFERENCE SIGNS LIST

1 array antenna apparatus; 5 base plate; 5*s* first primary surface; 6 carrier; 7, 22 adhesive layer; 10 wiring board; 10*c* centerline; 10*s* second primary surface; 11 semiconductor substrate; 13 active device circuit; 14 control circuit; 15 wiring layer; 16 insulating layer; 17 conductor; 18 conductive via; 19 feeding patch antenna element; 20 ground conductor layer; 24 elastic resin member; dielectric substrate; 26*s* third primary surface; 29 non-feeding patch antenna element; 29*e* extended surface; 29*t* top face; 30 first conductive pad; 32 first alignment mark; 35, 36 first external circuit board; 35*s*, 36*s* fourth primary surface; 37 second external circuit board; 37*s* fifth primary surface; 40 high-frequency circuit; 41 signal processing circuit; 42 power supply circuit; 44 first electronic component; 44*t* first top; 45 electronic components; 45*t* top; 47 conductive pad; bonding member; 50 second conductive pad; 51 external circuit trace; 52 second alignment mark; 55 electrical connection member; 56 printed circuit board; conductive pin; 60, 60*e*, 60*g*, 60*h*, 60*j*, 70, 70*e*, 70*g*, 70*h*, 70*j* flexible printed circuit; 63, 73 base film; 64, 74 trace; 64*a*, 74*a* high-frequency circuit trace; 64*b*, 74*b* signal processing circuit trace; 64*c*, 74*c* power supply circuit trace; 65, 75 first through-hole; 66, 76 second through-hole; 68, 68*d*, 69, 69*d* anisotropic conductive member; 68*a* first resin adhesive layer; 68*b* first electrically conductive particles; 68*r* release film; 69*a* second resin adhesive layer; 69*b* second electrically conductive particles; 81 stage; 82, 85 adsorbing portion; 83 recess; 84 first bonder; 87 first observer; 88 second observer; 92 second bonder; 92*r* chamfer; 94 second electronic component; 94*t* second top; 97 flexure; 100 slide jig; 101 jig body; 103 bar member; 104, 105 mold; 108 dummy pad; 111, 114 first flexible printed circuit; 112, 115 second flexible printed circuit; 113, 116 third flexible printed circuit; 117 insulation protective film; 120 solder layer; 127 first flux; 128 insulating resin member; 129 second flux; 131 notch; 133 dam.

The invention claimed is:

1. An array antenna apparatus, comprising:
    a base plate having a first primary surface;
    a wiring board mounted on the first primary surface, the wiring board having a second primary surface opposite the base plate;
    a dielectric substrate attached to the second primary surface, the dielectric substrate having a third primary surface opposite the wiring board;
    a plurality of antenna elements disposed in an array on the third primary surface;
    one or more first external circuit boards mounted on the first primary surface, the one or more first external circuit boards each having a fourth primary surface opposite the base plate;
    a first electronic component mounted on the fourth primary surface, the first electronic component being a tallest among one or more electronic components mounted on the fourth primary surface; and
    a first height of top surfaces of the plurality of antenna elements relative to the first primary surface being greater than or equal to a second height of a first top of the first electronic component relative to the first primary surface,
    a third height of the second primary surface relative to the first primary surface being greater than a fourth height of the fourth primary surface relative to the first primary surface.

2. The array antenna apparatus according to claim 1, wherein a difference between the third height and the fourth height is 0.3 mm or greater and 2.0 mm or less.

3. The array antenna apparatus according to claim 1, further comprising:
    a second external circuit board mounted on the first primary surface, the second external circuit board having a fifth primary surface opposite the base plate; and
    a second electronic component mounted on the fifth primary surface, the second electronic component being a tallest among one or more electronic components mounted on the fifth primary surface, wherein
    the second electronic component is taller than the first electronic component,
    the first height of top faces of the plurality of antenna elements relative to the first primary surface is greater than or equal to a fifth height of a second top of the second electronic component relative to the first primary surface, and
    a sixth height of the fifth primary surface relative to the first primary surface is less than the fourth height of the fourth primary surface relative to the first primary surface.

4. An array antenna apparatus, comprising:
    a base plate having a first primary surface;
    a wiring board mounted on the first primary surface, the wiring board having a second primary surface opposite the base plate;
    a dielectric substrate attached to the second primary surface, the dielectric substrate having a third primary surface opposite the wiring board;
    a plurality of antenna elements disposed in an array on the third primary surface;
    one or more first external circuit boards mounted on the first primary surface, the one or more first external circuit boards each having a fourth primary surface opposite the base plate;
    a first electronic component mounted on the fourth primary surface, the first electronic component being a tallest among one or more electronic components mounted on the fourth primary surface; and
    one or more flexible printed circuits attached to the second primary surface and the fourth primary surface, the one or more flexible printed circuits each including one or more traces,
    a first height of top surfaces of the plurality of antenna elements relative to the first primary surface being greater than or equal to a second height of a first top of the first electronic component relative to the first primary surface.

5. The array antenna apparatus according to claim 4, wherein the one or more flexible printed circuits each include a flexure.

6. The array antenna apparatus according to claim 5, wherein the flexure has a flexure length of 0.2 mm or greater and 1.0 mm or less.

7. The array antenna apparatus according to claim 4, wherein
    the wiring board includes a plurality of first conductive pads on the second primary surface,
    the one or more first external circuit boards each include a plurality of second conductive pads on the fourth primary surface,
    the one or more flexible printed circuits are a plurality of flexible printed circuits,
    the one or more traces are a plurality of traces, and
    the plurality of traces are each connected to one of the plurality of first conductive pads and one of the plurality of second conductive pads.

8. The array antenna apparatus according to claim 4, wherein
    the one or more flexible printed circuits are a plurality of flexible printed circuits,
    the one or more first external circuit boards are a plurality of first external circuit boards,
    in plan view of the second primary surface, one first external circuit board among the plurality of first external circuit boards and another one first external circuit board among the plurality of first external circuit boards are disposed on opposing sides of the wiring board,
    one flexible printed circuit among the plurality of flexible printed circuits is attached to the one first external circuit board,
    another one flexible printed circuit among the plurality of flexible printed circuits is attached to the another one first external circuit board, and
    in the plan view of the second primary surface, the one or more traces of the one flexible printed circuit and the one or more traces of the another one flexible printed circuit are disposed at opposing positions across a centerline of the wiring board between the one first external circuit board and the another one first external circuit.

9. The array antenna apparatus according to claim 4, wherein
    the wiring board includes a plurality of active device circuits and a plurality of control circuits connected to the plurality of active device circuits, the plurality of active device circuits being electrically coupled to the plurality of antenna elements, respectively, the one or more first external circuit boards each include a high-frequency circuit, a signal processing circuit, and a power supply circuit, the one or more traces are a plurality of traces, the plurality of traces including a plurality of power supply circuit traces, a plurality of high-frequency circuit traces, and a plurality of signal processing circuit traces, the high-frequency circuit is connected to the plurality of active device circuits via the plurality of high-frequency circuit traces, the signal processing circuit is connected to the plurality of control circuits via the plurality of signal processing circuit traces, the power supply circuit is electrically connected to the plurality of control circuits and the plurality of active device circuits via the plurality of power supply circuit traces, the plurality of high-frequency circuit traces are shorter than the plurality of power supply circuit traces and the plurality of signal processing circuit traces, the plurality of power supply circuit traces have wider widths than the plurality of high-frequency circuit traces and the plurality of signal processing circuit traces, and the plurality of power supply circuit traces are disposed adjacent to the plurality of high-frequency circuit traces.

10. The array antenna apparatus according to claim 4, wherein the wiring board includes a plurality of active device circuits and a plurality of control circuits connected to the plurality of active device circuits, the plurality of active device circuits being electrically coupled to the plurality of antenna elements, respectively, the one or more first external circuit boards each include a high-frequency circuit, a signal processing circuit, and a power supply circuit, the one or more traces are a plurality of traces, the plurality of traces including a plurality of power supply circuit traces, a plurality of high-frequency circuit traces, and a plurality of signal processing circuit traces, the one or more flexible printed circuits include a first flexible printed circuit, a second flexible printed circuit, and a third flexible printed circuit, the first flexible printed circuit including the plurality of high-frequency circuit traces only, the second flexible printed circuit including the plurality of signal processing circuit traces only, the third flexible printed circuit including the plurality of power supply circuit traces only, the plurality of high-frequency circuit traces connect the high-frequency circuit to the plurality of active device circuits, the plurality of signal processing circuit traces connect the signal processing circuit to the plurality of control circuits, and the plurality of power supply circuit traces electrically connect the power supply circuit to the plurality of active device circuits and the plurality of control circuits.

11. The array antenna apparatus according to claim 4, wherein the one or more flexible printed circuits further include dummy pads on both sides of the one or more traces in a width direction of the one or more traces, the dummy pads being away from the one or more traces.

12. The array antenna apparatus according to claim 4, wherein the wiring board includes a first alignment mark on the second primary surface, the one or more first external circuit boards each include a second alignment mark on the fourth primary surface, the one or more flexible printed circuits each have a first through-hole and a second through-hole, and in plan view of the first primary surface, the first through-hole and the second through-hole overlap with at least a portion of the first alignment mark and at least a portion of the second alignment mark, respectively.

13. The array antenna apparatus according to claim 4, wherein the one or more first external circuit boards are printed circuit boards, the one or more flexible printed circuits are adhered to the second primary surface via a first anisotropic conductive member containing first electrically conductive particles, the one or more flexible printed circuits are adhered to the fourth primary surface via a second anisotropic conductive member containing second electrically conductive particles, and the second electrically conductive particles are greater in diameter than the first electrically conductive particles.

14. The array antenna apparatus according to claim 4, wherein the one or more flexible printed circuits each include a solder layer on the one or more traces, and the one or more flexible printed circuits are bonded to the second primary surface and the fourth primary surface via the solder layer.

15. The array antenna apparatus according to claim 14, further comprising an insulating resin member between the one or more flexible printed circuits and the second primary surface, wherein the one or more flexible printed circuits each have at least one edge portion having a notch, the at least one edge portion being in a longitudinal direction of the one or more traces, and the notch faces the second primary surface.

16. The array antenna apparatus according to claim 4, wherein the one or more flexible printed circuits are adhered to the second primary surface via a first anisotropic conductive member, and the one or more flexible printed circuits are adhered to the fourth primary surface via a solder layer on the one or more traces.

17. A method for fabricating the array antenna apparatus according claim 13, comprising:

temporarily adhering the first anisotropic conductive member to each of the one or more flexible printed circuits, aligning, with the wiring board, the one or more flexible printed circuits to which the first anisotropic conductive members are temporarily adhered, adhering the one or more flexible printed circuits to the second primary surface of the wiring board via the first anisotropic conductive members, providing the second anisotropic conductive member on the one or more first external circuit boards, aligning the one or more flexible printed circuits with the one or more first external circuit boards, and adhering the one or more flexible printed circuits, via the second anisotropic conductive member, to the fourth primary surface of the one or more first external circuit boards, respectively.

18. A method for fabricating the array antenna apparatus according claim 14, comprising:

forming the solder layer on the one or more traces, aligning, with the wiring board, the one or more flexible printed circuits on which the solder layer is formed, bonding the one or more flexible printed circuits to the second primary surface of the wiring board via the solder layer, aligning the one or more flexible printed circuits with the one or more first external circuit boards, and bonding the one or more flexible printed circuits, via the solder layer, to the fourth primary surface of the one or more first external circuit boards, respectively.

19. A method for fabricating the array antenna apparatus according claim 15, comprising:

forming the solder layer on the one or more traces, aligning, with the wiring board, the one or more flexible printed circuits on which the solder layer is formed, bonding the one or more flexible printed circuits to the second primary surface of the wiring board via the solder layer, aligning the one or more flexible printed circuits with the one or more first external circuit boards, and bonding the one or more flexible printed circuits, via the solder layer, to the fourth primary surface of the one or more first external circuit boards, respectively.

\* \* \* \* \*